United States Patent [19]

Sullivan, II et al.

[11] Patent Number: 4,695,968
[45] Date of Patent: Sep. 22, 1987

[54] DIGITAL SYSTEM SIMULATION METHOD AND APPARATUS HAVING IMPROVED SAMPLING

[75] Inventors: Roderick B. Sullivan, II, Natick; Mahesh Doshi, Framingham; Lorne Cooper, Watertown, all of Mass.

[73] Assignee: Prime Computer, Inc., Natick, Mass.

[21] Appl. No.: 576,364

[22] Filed: Feb. 2, 1984

[30] Foreign Application Priority Data

Nov. 3, 1983 [WO] PCT Int'l. Appl. .................. PCT/US83/01741

[51] Int. Cl.$^4$ ........................ G06G 7/48; G06F 15/60
[52] U.S. Cl. .................................... 364/578; 364/490
[58] Field of Search ............... 364/200, 900, 300, 578, 364/550, 580, 802, 490

[56] References Cited

U.S. PATENT DOCUMENTS

| | | | |
|---|---|---|---|
| 4,259,077 | 3/1981 | Keweza | 364/578 X |
| 4,306,286 | 12/1981 | Cocke et al. | 364/200 |
| 4,308,616 | 12/1981 | Timoc | 371/23 |
| 4,342,093 | 7/1982 | Miyoshi | 364/578 |
| 4,527,249 | 7/1985 | Van Brunt | 364/578 |

FOREIGN PATENT DOCUMENTS

| | | | |
|---|---|---|---|
| 0047388 | 3/1982 | European Pat. Off. | 364/550 |
| 0096176 | 12/1983 | European Pat. Off. | 364/578 |
| 0204788 | 12/1983 | German Democratic Rep. | 364/578 |

OTHER PUBLICATIONS

Central Engineering, Oct. 1966, "Digital Programs for Simulation", (Abraham, R. G., et al), pp. 93–99.
Electronic Engineering, Sep. 1980 (Vol. 52, No. 642), "Computer Architecture for Digital Logic Simulation", (Barto, R. et al), pp. 35, 36, 41, 47, 50, 54, 56, 60, 63, 66.
Conf.: Proc. Military Electronics, Defense Expo '78, Oct. 3–5, 1978, "Array Processor AP-120B/190L", (Kemmler, K., et al), pp. 43–52.
Conf.: Southeastern '80, Apr. 13–16, 1980, "Reconfigurable Multiprocessor for Real-Time Simulation", (Klein, D., et al), pp. 331–334.
1978 IEEE International Symposium on Circuits and Systems Proceedings, 17th–19th May 1979, New York, pp. 5–10, IEEE, New York, G. R. Case, "The Salogs Digital Logic Simulator".
IBM Technical Disclosure Bulletin, vol. 25, No. 1, Jun. 1982, pp. 138–145, New York, G. S. Miranker, "Logical, Device Level Simulation of MOS Networks".
Krontstadt et al, "Software Support for the Yorktown Simulation Engine", 19th Design Automation Conference, 1982 IEEE, paper 7.3, pp. 60–64.
Denneau, "The Yorktown Simulation Engine", 19th Design Automation Conference, 1982 IEEE, paper. 7.2, pp. 55–59.
Pfister, "Yorktown Simulation Engine: Introduction", 19th Design Automation Conference, 1982 IEEE, paper 7.1, pp. 51–54.

Primary Examiner—Felix D. Gruber
Assistant Examiner—Kevin J. Teska
Attorney, Agent, or Firm—Lahive & Cockfield

[57] ABSTRACT

A digital system simulation apparatus and method to enable a user to interactively control, during simulation, sampling of signals in the digital system whose behavior is being simulated. The behavior of the system can be approximated by recognizing and displaying the circuit element inputs and outputs. Breakpoints can also be set, interactively, during simulation, for controlling initiation and termination of the sampling process. The method and apparatus can also sample upon the Nth occurrence of a specified condition.

13 Claims, 18 Drawing Figures

DIGITAL SYSTEM SIMULATION METHOD AND APPARATUS HAVING IMPROVED SAMPLING

The invention relates generally to digital system testing equipment and methods, and in particular, to a digital system simulation apparatus and method for investigating, through simulation, the behavior of a digital system design prior to hardware construction.

BACKGROUND OF THE INVENTION

As digital circuitry and systems become more complex, and as the use of large scale circuit integration increases, it becomes increasingly important to ensure that a digital circuit design is accurate and performs to specification. On the other hand, however, it is also increasingly difficult, as the circuit complexity increases, to construct and test the actual integrated circuit chip. The difficulties include the time delays and expense involved in both construction and the eventual debugging of the chip. As a result therefore, there has been developed a family of digital system simulation apparatus and methods to check circuit design and provide error analysis without actually constructing the circuit either in discrete hardware components or in integrated circuit form.

Among the many systems which are available to perform simulation, perhaps the largest capacity system is that apparatus designed by IBM and known as the Yorktown Simulation Engine. This is a highly parallel, special purpose, programmable machine for the gate-level simulation of digital logic. It can operate at speeds of over 2 billion gate simulations per second.

The Yorktown Simulation Engine is an outgrowth of logic simulators which were developed as early as the mid-fifties. During the mid-fifties and early sixties, gate level simulation which however did not include delays, was available. In the later sixties and early seventies, gate level simulation employing some limited timing became available but was of limited use because of the amount of detail required to provide the logic simulation. Then, in the mid- to late seventies, a well-known and well-supported system known as TEGAS was developed for the high level simulation of VLSI logic. This logic could employ for example thousands of logic gates. Also, in the late seventies, better simulation tools began to be developed, primarily for in-house use.

These simulation devices thus enabled the debugging of printed circuit boards which was previously both time consuming and not error free. However, component tolerances continue to provide significant problems. Furthermore, as noted above, VLSI and LSI, with its very large number of components, are still very difficult to check in a practically priced, flexible system. And today, as LSI and VLSI chips are used in printed circuit boards, yet more problems are to be expected.

Therefore primary objects of the invention are improved simulation apparatus and methods, available at reasonable cost, for enabling more system flexibility, more user control over the simulation system, and for providing additional simulation capability with respect to signal input and output, monitoring, system debugging, and operator/machine interaction.

SUMMARY OF THE INVENTION

The invention relates to an apparatus and method for simulating the behavior of a digital system. The digital system has a plurality of connected circuit elements. The apparatus features circuitry for defining inputs to the circuit elements and circuitry for defining outputs of the circuit elements based upon the input signals. The apparatus features circuit elements for interactively specifying, during the simulation of circuit or system behavior, at least one of the inputs or outputs to be repeatedly sampled, and further has elements for recording the sampled signal values. According to the invention, the initiation and/or termination of sampling can be interactively controlled during the simulation and the sampled values can be viewed, interactively, during the simulation. In particular, sampling every "Nth" occurrence of a specified condition, which can be a combination of Boolean operators, can be interactively controlled during simulation.

As noted above, the invention relates both to the apparatus as described above and the method related thereto. The simulation method features interactively specifying, during the simulation of the circuit behavior, at least one of the inputs or outputs to be repeatedly sampled. The sampled values are recorded and can be displayed during the simulation. During the display, the samples can be interactively viewed even though the simulation continues to take place. Furthermore, the method features the steps of interactively specifying breakpoint conditions during the simulation operation for initiating or terminating repeated sampling of at least one of the inputs and outputs upon the occurrence of at least one of the breakpoint conditions.

BRIEF DESCRIPTION OF THE DRAWINGS

Other objects, features, and advantages of the invention will appear from the following description of a preferred embodiment taken together with the drawings in which.

DESCRIPTION OF A PREFERRED EMBODIMENT

Figure 1:
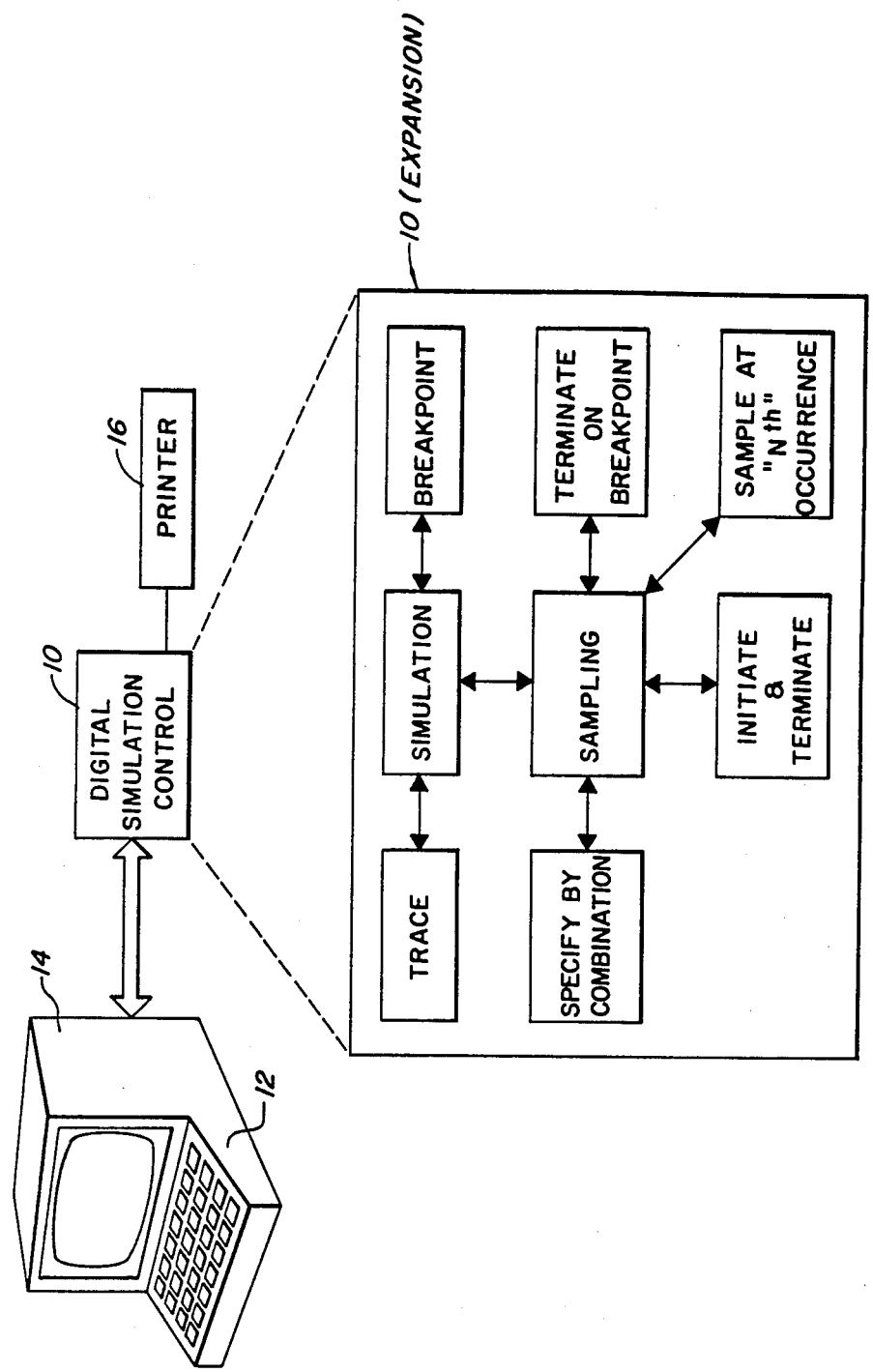
FIG. 1 is a schematic representation of the simulation apparatus according to the invention.

Referring to FIG. 1, a digital simulation system has a digital control circuitry 10 which connects to a keyboard 12, a monitor 14, and a printer 16. The digital simulation system will be described hereinafter in terms of a software controlled system although it could also be hardwired. The control circuitry 10 receives data information from the keyboard over, for example, a direct wire connection, a telephone line, or a small area or large area data communications network. In a similar manner, control circuitry 10 can supply display data to monitor 14. The printer 16 can be located either at the digital simulation control 10, or at another location, for example local to the keyboard and monitor, and can be connected to the control 10 through the same communication link as the keyboard and monitor.

As noted above, the illustrated embodiment of the invention is described and implemented primarily in software, illustrated in appendix A attached hereto, and the control apparatus 10 is a general purpose digital computer including a computer processing unit, RAM, and auxiliary memory. However, any or all functions and components of the system can be constructed solely in hardware. By implementing the apparatus solely in hardware, a considerable loss of flexibility results, for example it is difficult to change a hardwired system; however on the other hand, the hardwired system will generally provide faster response time to the data inputs and a greater operating speed. The construction of a hardwired system, in view of the disclosure hereinafter provided, is well within the skill of one practiced in the art.

Figure 2:
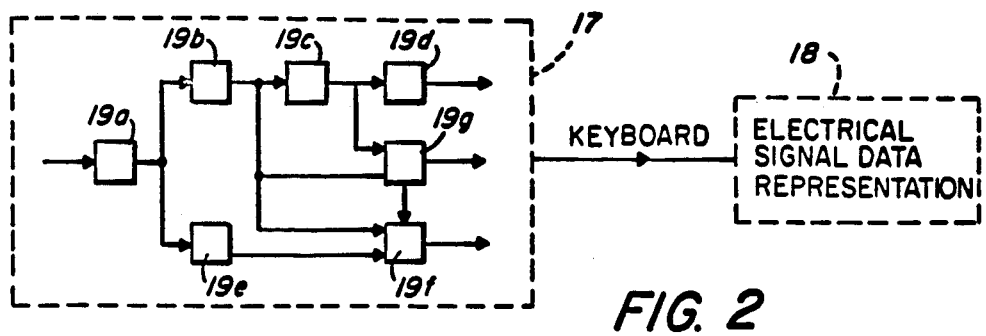
FIG. 2 is a diagrammatic representation of the transformation from circuit description to electrical signal representation of a digital system to be analyzed.

The general operation of the digital simulation control device 10 is as follows. Referring to FIG. 2, the operator defines, through the keyboard, a circuit 17, the behavior of which to be simulated; and the control circuitry automatically provides an electrical signal data structure 18 describing the digital system. This occurs at what is generally called the command level of operation.

The commands from the operator, through keyboard 12, to the digital simulation control 10 provide the digital simulation control with a unique definition of the interconnections of the digital circuit elements 19a, 19b, . . . , 19g making up the illustrated circuit 17. Those commands or instructions from the keyboard thus provide a complete description of how the circuit elements are connected. The circuit elements themselves are electrical elements with a set of "external pins" that define how the electrical elements can be connected to other elements of the circuit. The elements can be user defined or can be standard electrical building blocks, for example AND gates, OR gates, digital adders, etc. Each element of the circuit can have none, one, or several models associated therewith that define the alternatives for the element's functional performance when it is used during a logic simulation. An element can represent a real physical component, a portion of a real component, or a conceptual and hence generally non-physical component. An element is defined by its "component name" and can be referenced thereby.

Figure 3:
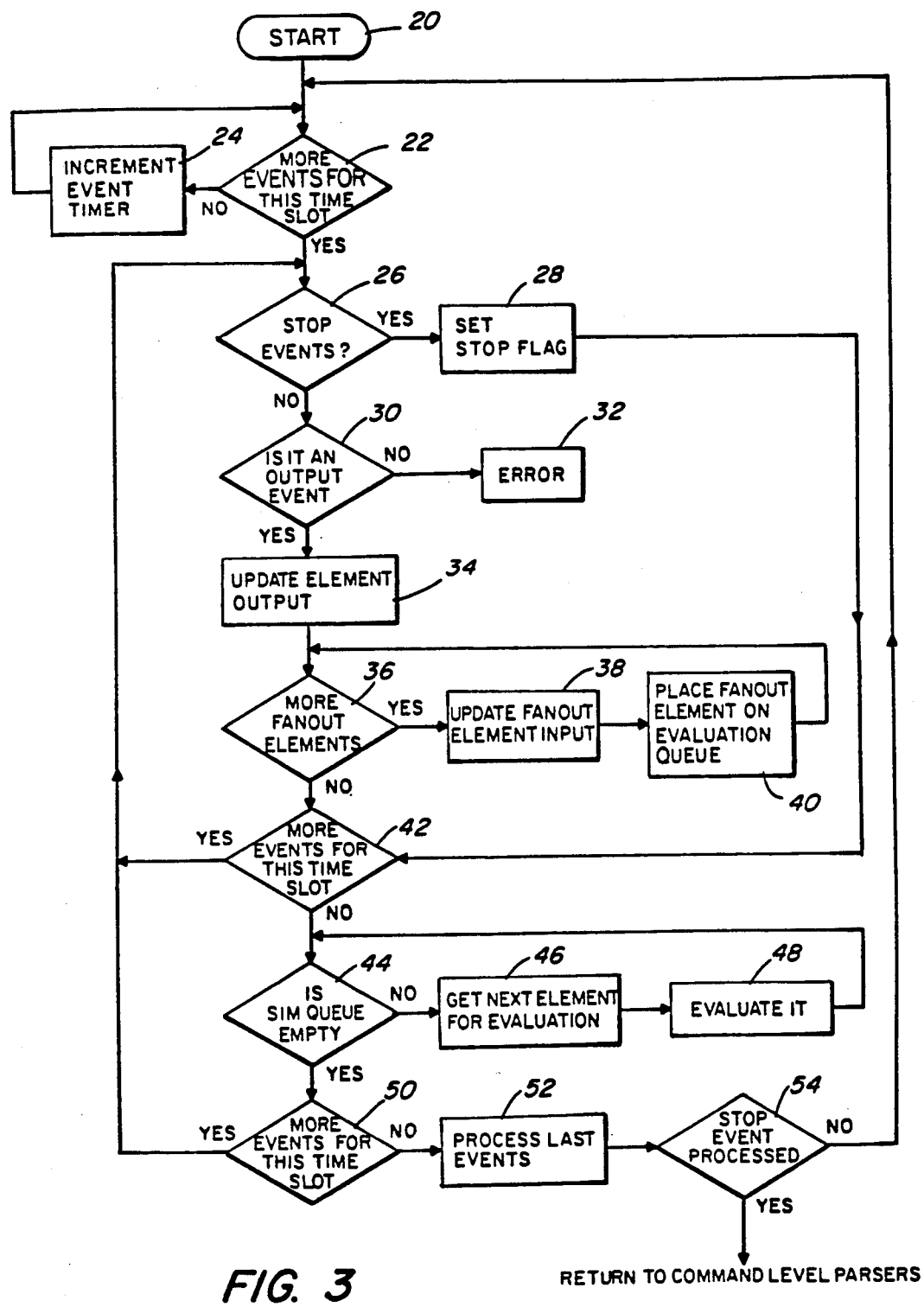
FIG. 3 is a flow chart illustrating generally a simulation control process.

Input waveforms to the circuit are then specified by the operator, and commands from the keyboard 12 initiate simulation by the simulation control 10. This is indicated in FIG. 3 at 20. The apparatus employs an event timer, which is a unitless timer having a "time slot" for each unit of time as defined by the operator. During a time slot (or unit of time), a complete update of the digital circuitry input/output relationships will take place. The time slot can be on the order of nanoseconds or microseconds depending upon the nature of the digital system. The apparatus then maintains a list or schedule of the "events" or happenings during each time slot, and all of the events scheduled during a time slot are accounted for before the events scheduled for a next time slot can be considered. The events can be, for example, the changing of an output value, the monitoring of a value, the setting of a stop flag to indicate the processing of a "stop event", the propagation of a signal through a series of connected gates, etc.

As noted above, once the elements have been connected and defined in the digital simulation control data structure, (by entering the necessary data through the keyboard, using visual feedback and prompting from the monitor 14) the command is entered, through the keyboard, to start the simulation. During the entry of the various elements, the digital simulation control circuits had been preparing a command list describing all of the elements, modeling them, and recording their interconnections. When the start command is given, as indicated at 20 of FIG. 3, the apparatus begins a first clock cycle (or time slot) to determine whether there are any "events" scheduled to take place during this first time slot or cycle. This is indicated at 22. If no event is scheduled to take place during a time slot, the digital simulation control clock counter (referred to hereinafter as the event timer) increments, as indicated at 24, and the apparatus examines whether any "events" are to take place during the next time slot.

If an event is to take place during the time slot, the apparatus determines whether it is a "stop event" (at 26) in which case a stop flag is set at 28, or whether it is an "output event" (at 30). An output event requires the generation and update of output signal levels for the circuit element based upon input signal levels to the element. If an event is scheduled, but is neither an output event (indicated at 30) nor the stop event, an error condition is indicated at 32.

Each output event causes particular circuit element output or outputs to be updated (at 34). A determination is then made (at 36) whether there are circuit elements downstream, that is, output receiving elements which are affected by the updated output. If there are affected elements downstream, their inputs are updated at 38 and thereafter those "fanout" elements are scheduled on the evaluation or simulation queue at 40. This means that at some later time (which can be within the same time slot), as specified in the definition for the particular circuit element, its output will be updated. Each time the loop defined by elements 36, 38, and 40 is traversed, another element 19, downstream of the "event" element is updated.

When all of the "downstream" elements for an event have been updated, the scheduling data is examined to determine if there are more events scheduled to occur during this "time slot" (indicated at 42). If more events are called for, the apparatus control returns to block 26 to begin determining the type of the next event. If there are no additional events, then the apparatus control determines whether the evaluation queue is empty for this time slot. This is indicated at 44. If it is not empty, the next element to be evaluated is obtained, at 46, and the element is evaluated at 48. The loop comprising element 44, 46, and 48 is repeatedly traversed until it is empty. Thereafter, the apparatus determines, at 50, whether there are more "events" occurring during this time slot. These events would have been generated and scheduled during the evaluation of the elements in the evaluation queue at 48. If additional events are scheduled for this time slot, control returns to the stop event determination at 26.

If no additional events are to take place during this time slot, the apparatus, at 52, processes "last events". The "last events" are a special class of control events for which processing, for each time slot, occurs only after all other events in the time slot have been processed. "Last events" can include for example, evaluations relating to monitoring, tracing, sampling, breakpoints, etc. After the "last events" have been processed, the apparatus control determines, at 54, whether the stop flag has been set, indicating that the stop event has been processed, and if the stop flag has not been set, the apparatus returns to the beginning of the processing method. In the event that the stop flag has been set, indicating the processing of a stop event, the apparatus returns to the "command level" parsers for further operation and the simulation stops, at least temporarily.

As noted above, during the command level of operation, the apparatus user has the capability of defining the input circuit elements through the keyboard 12. (He can also use the system defined standard building blocks, such as adders, subtractors, AND or OR gates, etc.) In the illustrated embodiment, he has the capability of defining those circuit elements so that for a single particular combination of inputs, multiple outputs can be defined and further, so that an output can be defined as a "0", or a "1" even though an input to the circuit element is an undefined or high impedance signal level.

Referring in particular to that aspect of the apparatus having the capability of defining multiple outputs for a common set of input pins of a circuit element, when the apparatus control 10 receives input data defining a circuit element from the user, through the keyboard 12, the apparatus generates and stores in memory, a "look-up table" which models the functional relationship between the inputs and outputs of the circuit element. For example, the user can define each output signal level separately based upon a logical or Boolean function of the value of the inputs (and outputs), or a specific functional relationship can be defined. The apparatus control 10 automatically combines in its data structure separately defined outputs which have a common set of inputs or allows the user to define for a common set of inputs, a plurality of outputs. The resulting "look-up table" takes the form of a stored data structure having a one-dimensional array of pointers to the new output values, the array being indexed by the current set of input (and output) signal values, hereinafter referred to as the "current state input vector" for the circuit element. Each data entry in the one-dimensional array list points to (and hence represents) the new output value(s) for the particular inputs forming the current state vector. The apparatus then "schedules" updating of the new output values.

Figure 4:
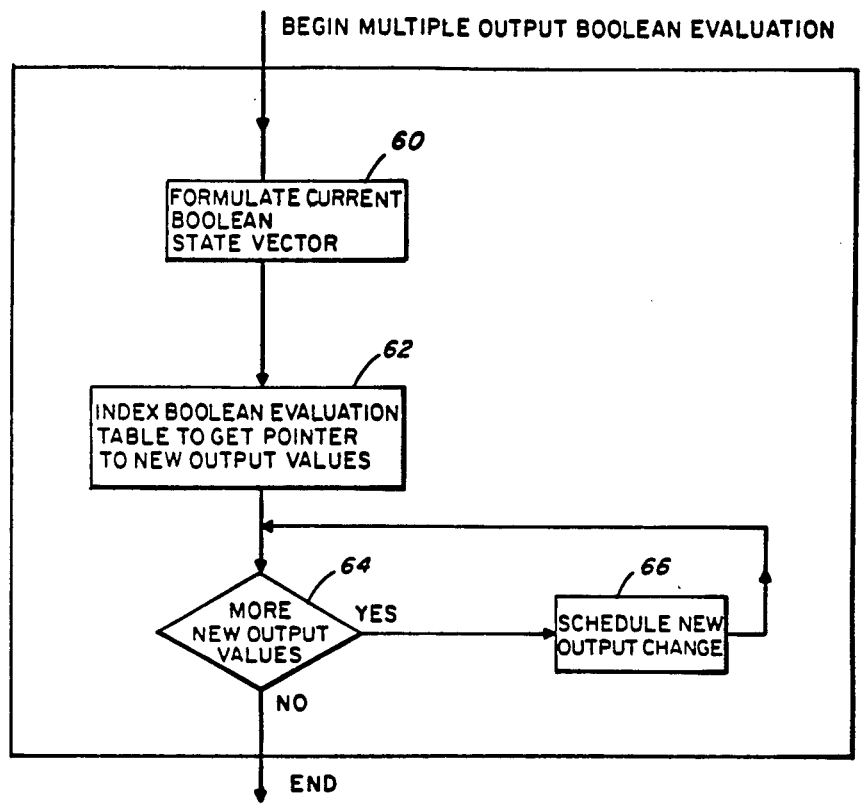
FIGS. 4 and 5 represent the method steps for one aspect of a simulation apparatus and method.
Figure 5:
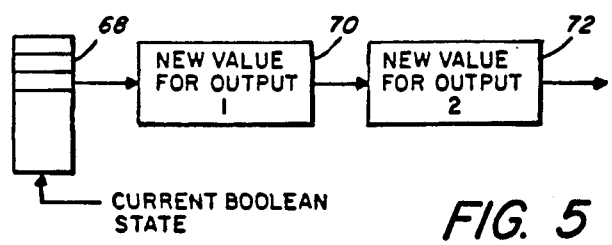

During a typical simulation, therefore, when an output event is detected at 30, the element output value update indicated at 34 can be implemented as illustrated in FIGS. 4 and 5. The current state vector, that is, the definition of element inputs and outputs which define the current input state to the circuit element, is formulated at 60 and is employed with the one-dimensional array defined during the circuit formulation stage of simulation to obtain a pointer to the new output values of various outputs of the circuit element. This is indicated at 62. Thereafter, the output signal values are updated, by first determining, at 64, if there is an output value to be updated and then scheduling each new output value change, at 66, until all of the output changes for this circuit element have been scheduled. It should be noted that the output values change at times scheduled in accordance with the definition of the circuit element which, through user supplied data, will generally take into account the delays inherent in signal transmission through physical media, internal device time delays, etc. After all of the output value changes have been scheduled, the system continues to update other circuit elements, as noted at 36, for example those connected to those outputs of this circuit element, which change within this time period.

Referring in particular to FIG. 5, the one-dimensional array of pointers is illustrated at 68. The array, as noted above, is indexed by the input values to the circuit element; and the data stored therein points to the location in a memory of new values for the outputs as indicated at 70, 72, etc. In the illustrated embodiment, each time a new output value is obtained, the retrieved data also indicates the location of a next output, if any, whose output level is determined by this common set of input values. Thus the content of the data stored at 70 points to the new output value data stored at 72. Thereby, the present apparatus is capable of storing and using, in an efficient and reliable manner, multiple outputs related to a common set of inputs. Thus, a separate array and circuit element definition need not be set up for each output of a circuit element, where the signal level of the outputs are each functionally dependent upon a common set of inputs.

The apparatus further provides, for a circuit element having undefined or high impedance inputs, the capability of defining the output signal level as a "0" or "1" level. It is well-known that, for example for an adder, the input values can be a "0", a "1", an "X" which is undefined input variable, or a "Z" which is a high impedance input. Typically, for an add circuit, an apparatus can employ truth tables similar to those of FIG. 6. In the illustrated embodiment, however, unlike earlier apparatus, the result of, for example, a two operand ADD with a carry-in bit, has a defined "0" or "1" output level, such as at 76, even though one of the inputs to the adder is an "X" or a "Z". This method and apparatus thus allows the output of the adder to be "definite" even though the input is not and thereby provides a better correspondence to the actual operation of the digital system being simulated.

Figure 6:
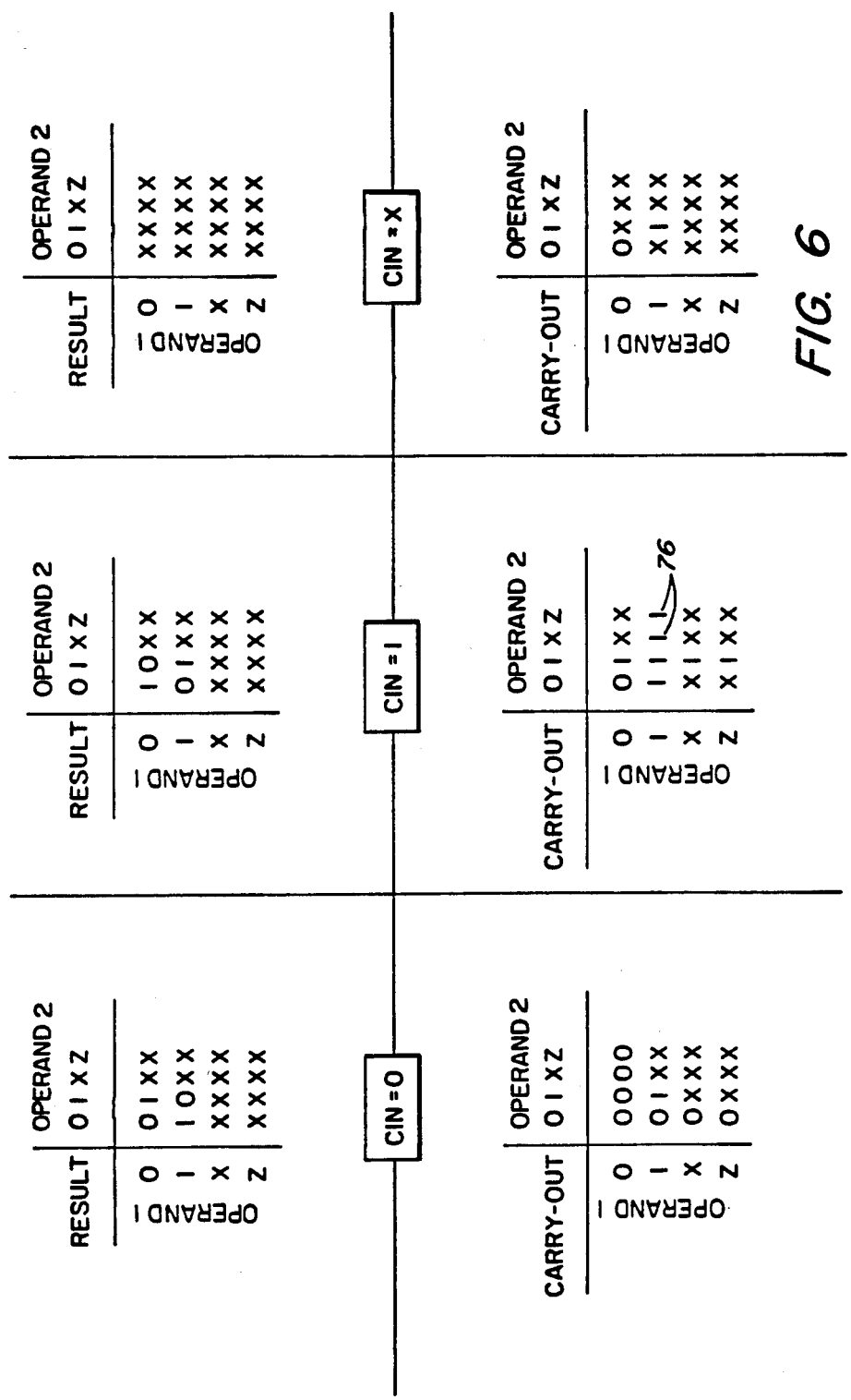
FIGS. 6 and 7 represent the method steps for a second aspect of a simulation apparatus and method.
Figure 7:
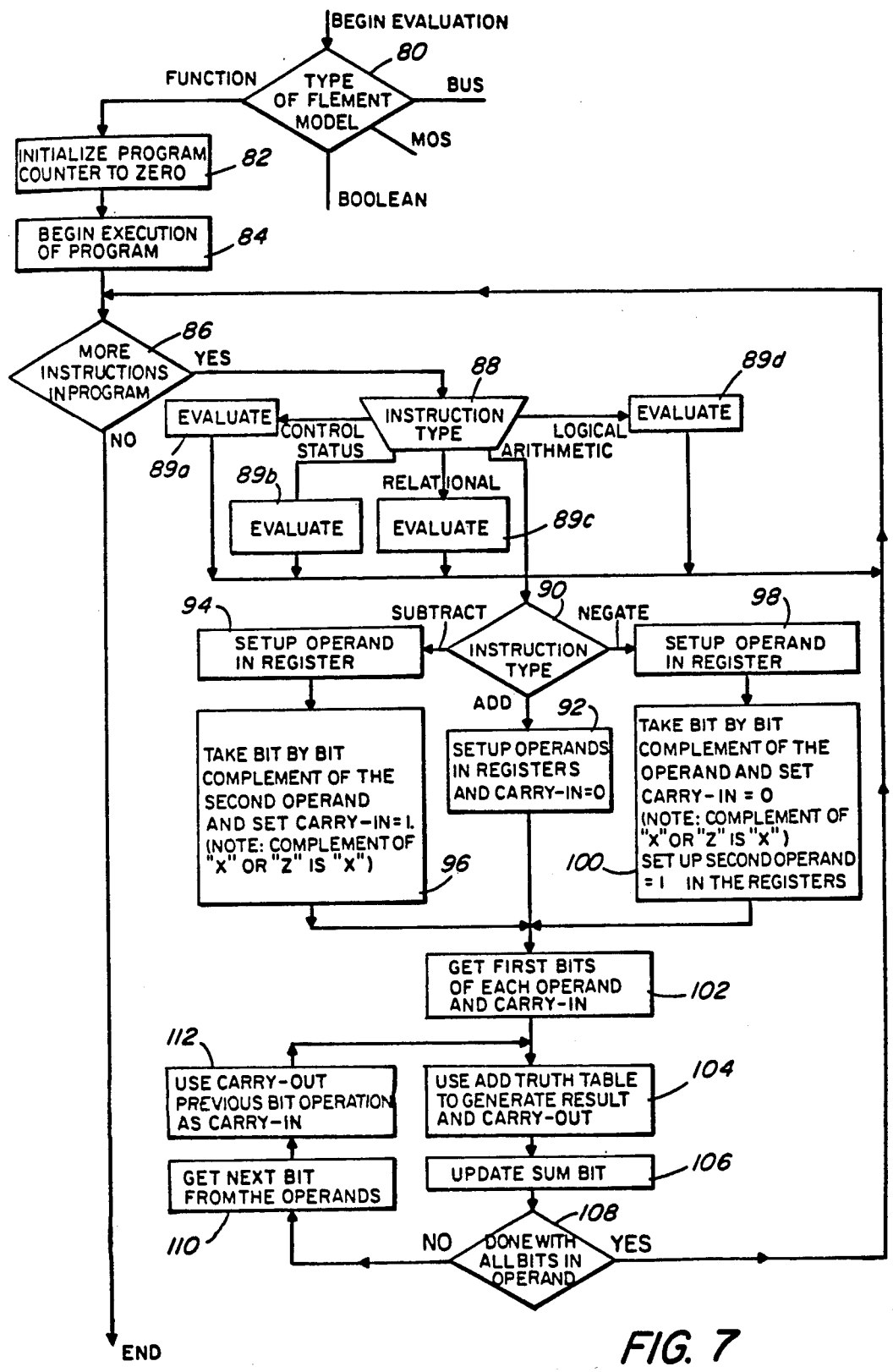

Referring now to FIG. 7, the evaluation of a function, such as an arithmetic function defined by the truth tables of FIG. 6, is described. This procedure corresponds to, for example, the evaluation indicated at 34 of FIG. 3. Initially, as the evaluation begins, the type of circuit element being modeled is determined. This is indicated at 80. Assuming in the present illustrated example that an arithmetic function is being modeled, the procedure for modeling the function is initiated at 82 and execution of the procedure begins at 84. In this illustrated embodiment, the procedure is implemented in a separately stored program which requires the computer program counter to be zeroed when the program is recalled and loaded into program memory. Each "instruction" of the procedure or program as used herein represents one arithmetic step in evaluating the function. For example the step can be "add input A to input B". Upon noting the presence of a next instruction, at 86, the type of instruction is determined at 88. The various instructions can be a control instruction, a status instruction, a relational instruction, an arithmetic instruction, and a logical instruction. The evaluation of the various nonarithmetic instruction types (at 89a, 89b, 89c, 89d) will be apparent in view of the discussion which follows relating specifically to arithmetic instructions.

If the instruction is an arithmetic instruction, the particular type of arithmetic instruction is then determined at 90. If the instruction is an ADD instruction, the operands are fetched and stored in operand registers and a "carry-in" bit is set to "0". This is indicated at 92. If a SUBTRACT instruction is called for, the operands are fetched and stored in the operand registers at 94 and the complement of the second operand replaces the originally fetched operand. This is indicated at 96 (the complement of "X" or "Z" is "X"). The carry-in bit is set to "1". If a NEGATE instruction is called for, the operand is fetched and stored in one operand register at 98. The complement of the operand is then taken bit-by-bit and the carry-in bit is set to "0". This is indicated at 100. The second operand register is set to "1".

Having thus set up the operand registers and the carry-in bit, the first bit of each operand, and the carry-in bit, are fetched at 102 and the truth tables of FIG. 6 are employed (these are stored in the apparatus memory) to generate the resultant sum and a carry-out bit. This is indicated at 104. A sum bit register is then updated at 106 and the apparatus determines whether all of the bits in the operands have been used (at 108). If all of the bits have not been used, the next bit is fetched from the operand registers at 110 and the carry-out bit from the previous bit operation is employed as the new "carry-in" bit. This is indicated at 112. Thereafter the truth tables are employed again at 104 and the sum bits and carry-out bit are updated at 106. When all of the bits of the operands have been processed, the apparatus "loops back" to determine if more instructions are present in the program for this function, at 86, and if not, control returns to update the outputs of the function circuit element at 34 (FIG. 3).

As noted above, after the initial "element update" at 34, the apparatus determines whether there are additional (downstream) fanout element inputs at 38. In accordance with the illustrated embodiment of the apparatus, each element output signal is specified by a signal level which is calculated internally by the apparatus as being one of nine states. Three of those states have been previously described and designated as "0", "1", and "Z". The remaining states according to this illustrated embodiment of the invention, are a "weak 0", a "weak 1", a "weak X", a "dynamic 0", a "dynamic 1", and a "dynamic X" signal level. As used herein, "weak" refers to a signal that is pulled to a given level or value through a resistor and "dynamic" refers to a signal whose level is provided by capacitively charging a line to a given value but which, with very little additional charge of an opposite type, can be changed to a signal level of the opposite value. The four signal-level simulation is adequate and reliable for gate level simulation. However, for switch level simulation, the nine signal-level simulation is desirable. Advantageously, the apparatus herein is capable of operating both in a four signal-level mode and in a nine signal-level mode depending upon the requirements of the circuit element to which the signals are being provided. Consequently, for convenience, each signal level output is initially described using the nine signal-level mode. However, when a gate or function is receiving the output value, the nine values are reduced to four by masking the "strength" from the "change code" defining the output levels, and updating the new input values with the now four level signals.

Figure 8:
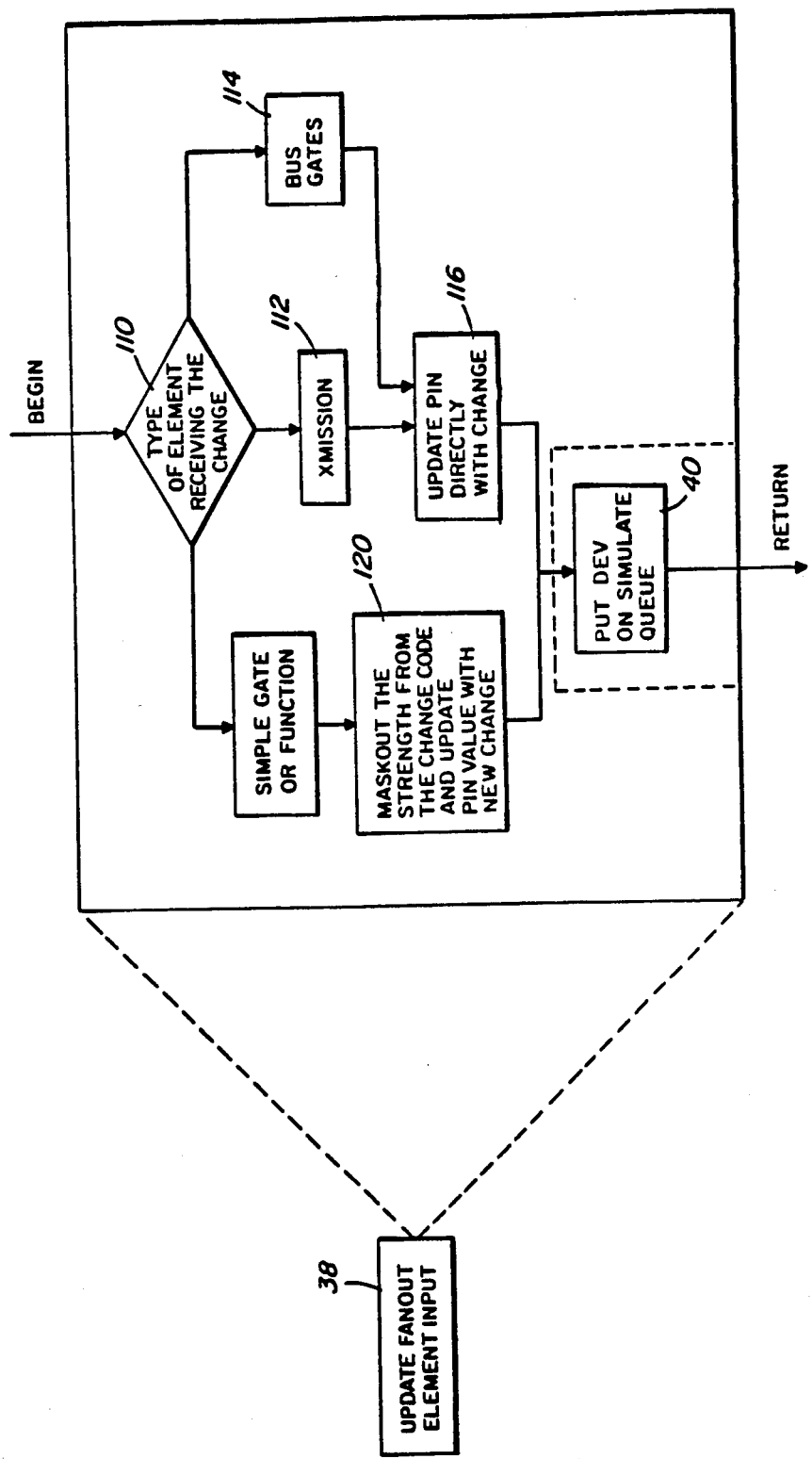
FIG. 8 represents the method steps for a third aspect of the simulation apparatus and method.

Referring now to FIG. 8, the update fanout element input 38 initially determines, at 110, the type of circuit element which is receiving the change at its input. If the circuit element is a transmission element, for example a MOS transistor operating like a switch, indicated at 112, or a bus gate (which is user transparent and is inserted automatically by the system) as indicated at 114, the input pins of the circuit elements are directly updated with the nine level output change, as indicated at 116. Thereafter, the circuit element is placed on the simulation queue for scheduling, as noted at 40 in FIGS. 3 and 8.

If however, the receiving device is a simple gate or function, as indicated at 118, the signal level data or change code is processed by masking the strength data from the output. The new signal level change, then consisting of only a four state signal, updates the pin value, at 120, and the device is then placed as noted above on the simulation queue at 40. In this manner, the illustrated apparatus automatically, without user intervention, employs, as required, both the four level and nine level signals. Thereby, full capability of the system is maintained while reducing where possible the computational and memory requirements so that faster throughput is available. Thus, the strength information available to a gate or function, and which is irrelevant thereto, is masked before the change value is made available to the element input.

In order to properly evaluate the simulation and to observe the various signal paths and combinations during the simulation, the apparatus provides the user with the capability of tracing signals and viewing the result of the trace procedure. Importantly, in the illustrated embodiment, tracing of the signal can be triggered on the change of value of a functional (for example Boolean) combination of pins, data paths, registers, memories, or memory windows.

When tracing is to be implemented, the operator provides the control 10 with the necessary information regarding the tracing procedure, including the functional expression, the satisfaction of which will trigger the trace message. The processing of the tracing command is initialized at the command level of the apparatus by parsing for example the Boolean expression of the events initiating a trace, into a stack, in Reverse Polish Notation (RPN). This is indicated at 130. The "RPN stack" is then processed to transform the parsed Boolean expressions into a network of event detectors, storage update watch blocks, and Boolean evaluators. This is indicated at 132. These elements become part of the defined circuit, the behavior of which is to be simulated, and are inserted into that circuit as would be any other circuit element. This is indicated at 134. The inclusion of these additional monitoring circuit elements is, however, transparent to the user, so that he is not aware of their inclusion into the circuit.

Figure 10:
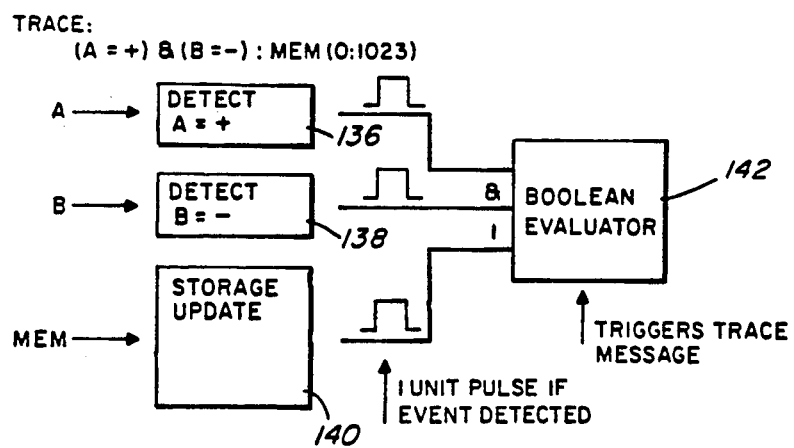

Referring to FIG. 10, the Boolean expression upon which a trace message is initiated is assumed to be [(A is positive) AND (B is negative)] OR (a change in memory location 1023). In this example, the apparatus traces upon either the detection of a circuit value A being positive when a circuit value B is negative, or a change in the value of the specific memory location. The detection of a positive A value and a negative B value is illustrated by a first and a second event detector 136, 138 respectively. A storage updated watch block 140 monitors the specified memory location. The event detector evaluation at 136, 138, and 140 is analogous to a simple gate evaluation. If the event is detected at 136 or 138, a one time-unit pulse is generated on the "ouput wire" which feeds a Boolean evaluator 142. The storage updated watch block receives the value of the memory location or locations to be monitored and intercepts storage updates of the selected registers. If an event is detected, the watch block 140 generates the one time-unit pulse and that pulse is received and detected by the Boolean evaluator 142. The Boolean evaluator detects the user specified Boolean combination of events and upon receiving the unit-time clock pulse triggers the generation of a trace message as described in more detail below if the Boolean combination is satisfied.

Figure 11:
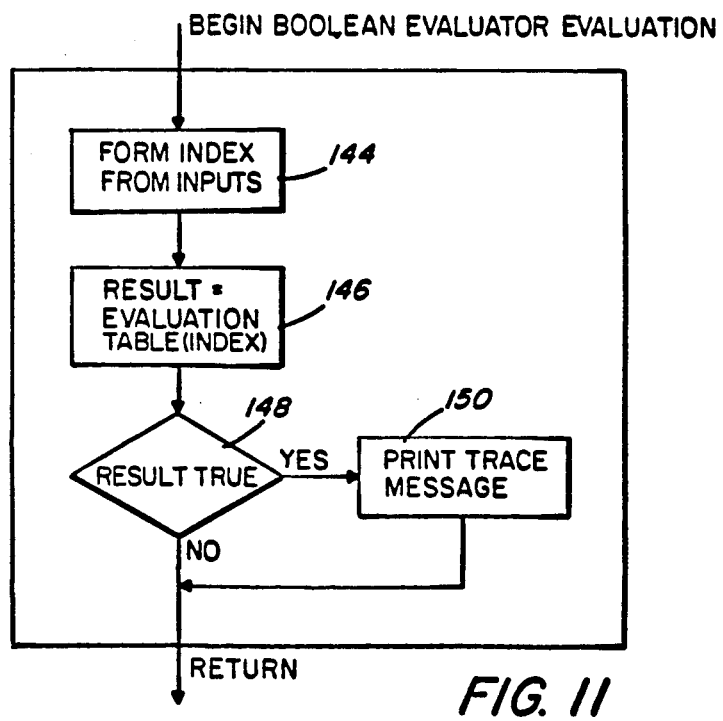
FIGS. 9-13 represent the method steps for a fourth aspect of the simulation apparatus and method.

Referring to FIG. 11, the Boolean evaluator forms an index from the inputs available to it. This is indicated at 144. The resulting index is evaluated in accordance with a previously generated and stored evaluation table, at 146, and if the table result is true, at 148, a trace print message is generated at 150.

Figure 12:
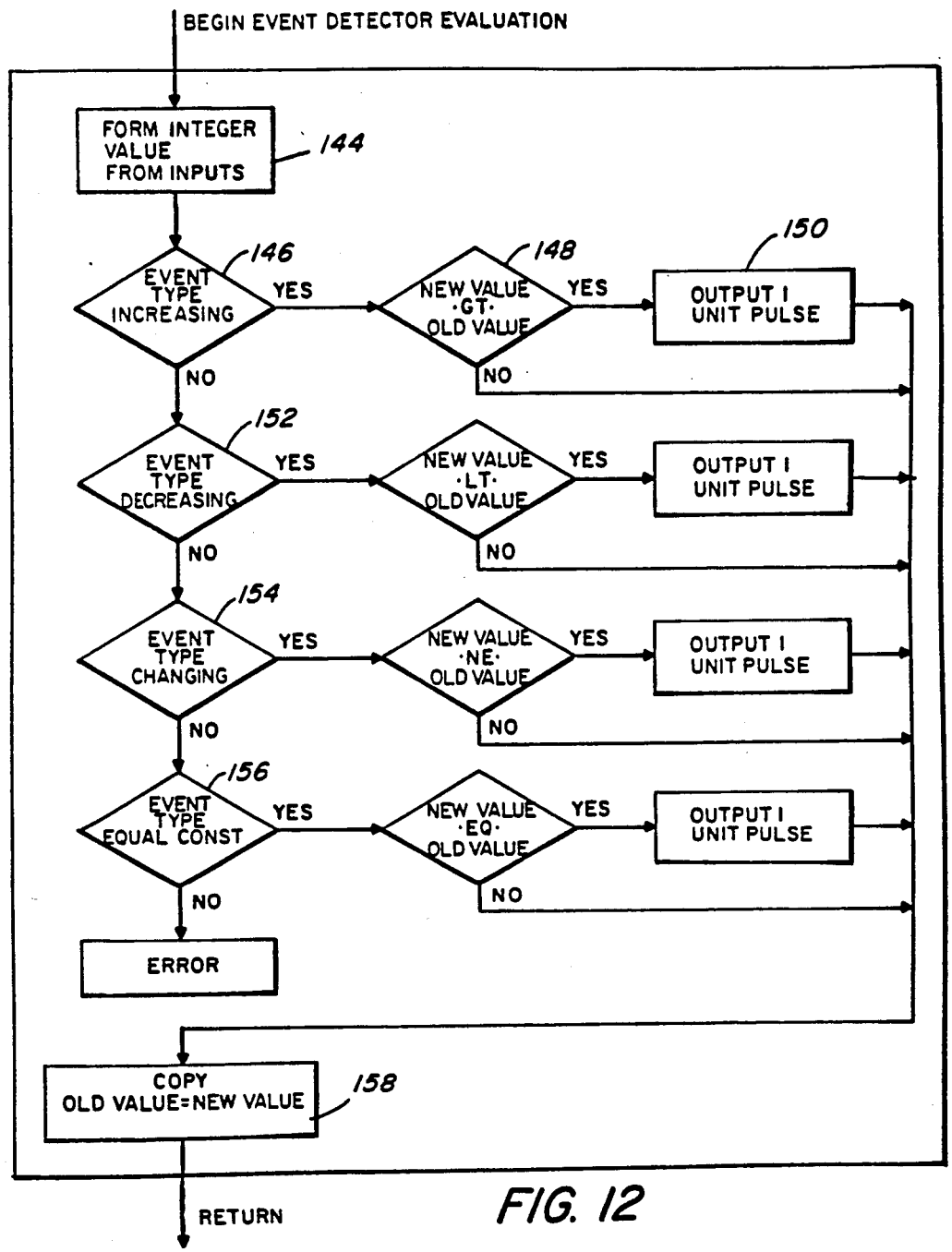

Referring to FIG. 12, the event detectors 136 and 138 operate by forming an integer value based upon the inputs thereto, the integer value indicating the type of event. This is indicated at 144. If the event is of a type which is increasing, as indicated at 146, a check is made whether the new value is greater than the old value (at 148) and if it is, an output of a unit-time pulse is generated at 150. In a similar manner, checks are made for an event type wherein the event is decreasing (at 152), where the event is changing (at 154), and where the event is not changing but is constant (156). In each case, where the event is properly detected, the one unit time pulse is output. The old value is then replaced by the new value of the monitored variable at 158.

Figure 13:
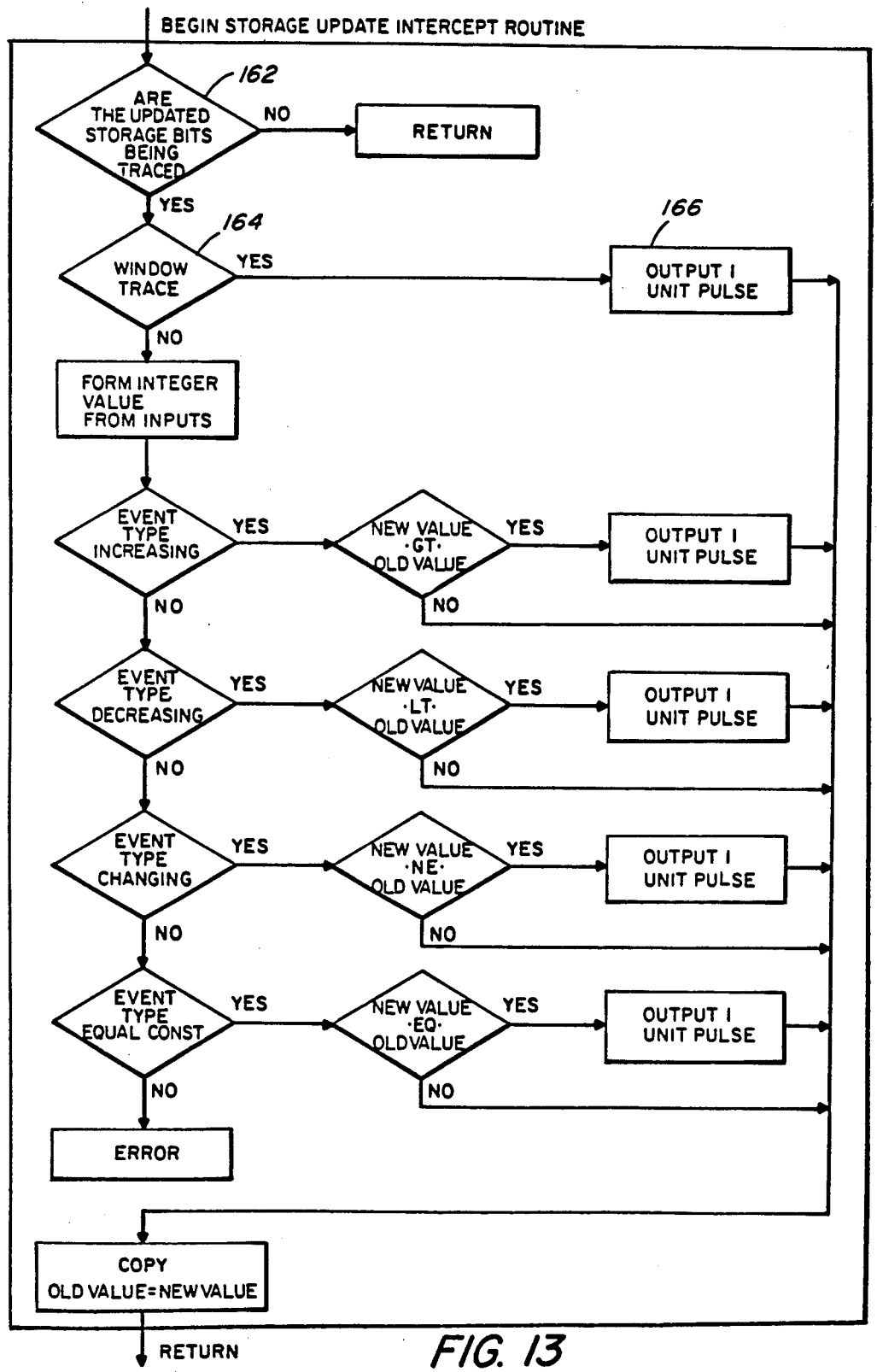

In a similar manner, referring to FIG. 13, the storage update watch block begins by checking whether the updated storage bits are the ones upon which a trace can be triggered. This is indicated at 162. If they are not, the control returns to other monitoring or evaluation processes. If the updated storage bits are being monitored, the apparatus determines whether it is a window trace at 164, in which case the output pulse is immediately generated at 166. Otherwise, the values being monitored are used to generate an integer value indicating the type of the event. Processing then follows using the same procedure as that described in connection with FIG. 12. Using the described process, tracing can be triggered by a functional combination of variables to monitor behavioral operation of the digital circuit 17.

In accordance with the illustrated and preferred embodiment of the invention, the apparatus provides the user with the further capability of interactively controlling sampling of waveforms not only at the time the circuitry is compiled (i.e. prior to actual simulation), but thereafter, during simulation itself. Thus, in accordance with the illustrated embodiment, the user can interactively specify, during the actual simulation, which elements are to be automatically or continuously sampled and have their values recorded; when to turn the sampling on and off; and whether to sample at every occurrence of a specified condition or whether to periodically sample on the Nth occurrence of the specified condition, for example in response to breakpoints. (The breakpoints, which can control sampling, can also be set interactively during the simulation period). The user can also direct the apparatus to automatically and continuously print, or display for viewing, the values of specified circuit elements inputs and outputs. Thus, according to the illustrated embodiment, if a user desires to view any of the automatically sampled values which have been stored or printed, the user can temporarily stop the simulation, examine the desired stored values or printed files, and then return to the simulation, continuing where the simulation had left off. This advantageous procedure differs markedly from earlier simulation systems wherein the simulation, once interrupted, cannot thereafter be resumed as if the interruption had not occurred.

Figure 9:
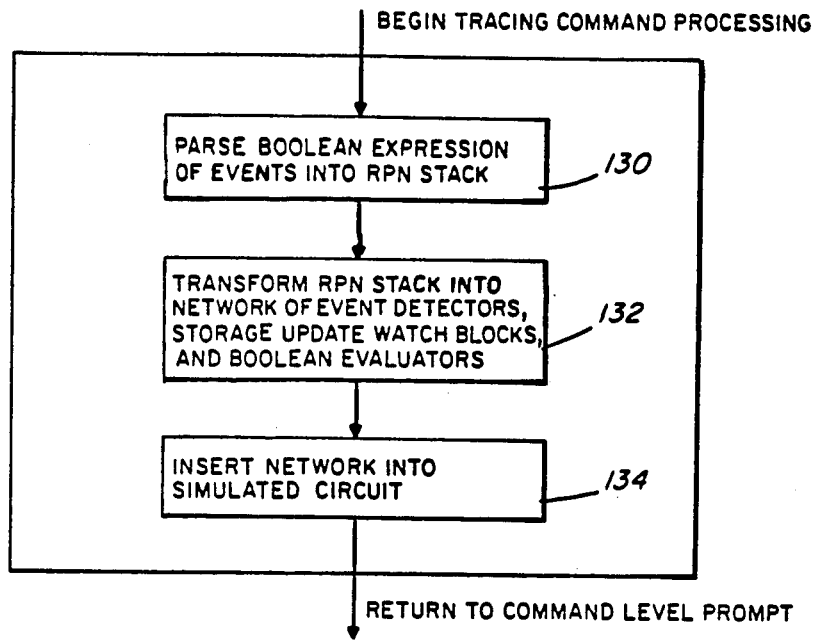
Figure 14:
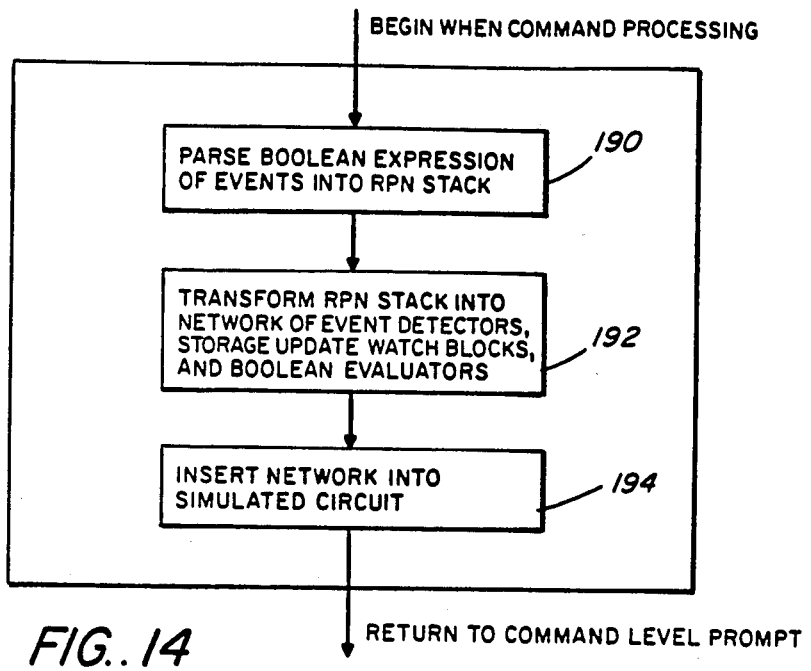
FIGS. 14-18 represent the method steps for a preferred embodiment according to the invention.

Referring in particular to FIG. 14, the apparatus treats a command to begin or terminate sampling upon the occurrence of one or more specified conditions in the same manner in which it treats the command to trigger printing or recording of a trace message upon the occurrence of a specified function, for example based upon a combination of ANDed or ORed variables. Thus, FIG. 14, which corresponds to FIG. 9, provides for parsing the expression, for example a Boolean expression, which specifies when to initiate (or terminate) sampling, into a Reverse Polish Notation (RPN) stack, (at 190); transforming the RPN stack into a network of event detectors, storage update watch blocks, and Boolean evaluators (at 192); and inserting the resulting circuit elements into the network whose behavior is to be investigated (at 194). Thus, when the Boolean evaluator, corresponding to that of FIG. 10, detects an event upon which a sample command is to be generated, a sampling method, corresponding to the tracing procedure of FIGS. 11–13, is initiated.

It should be also be noted that the event detector and storage update watch block employed in connection with the detector circuitry and Boolean evaluator of FIG. 9 correspond precisely to those employed in connection with the sampling function herein described and that the operation of both corresponds to that described in connection with FIGS. 10, 12 and 13 respectively.

Figure 15:
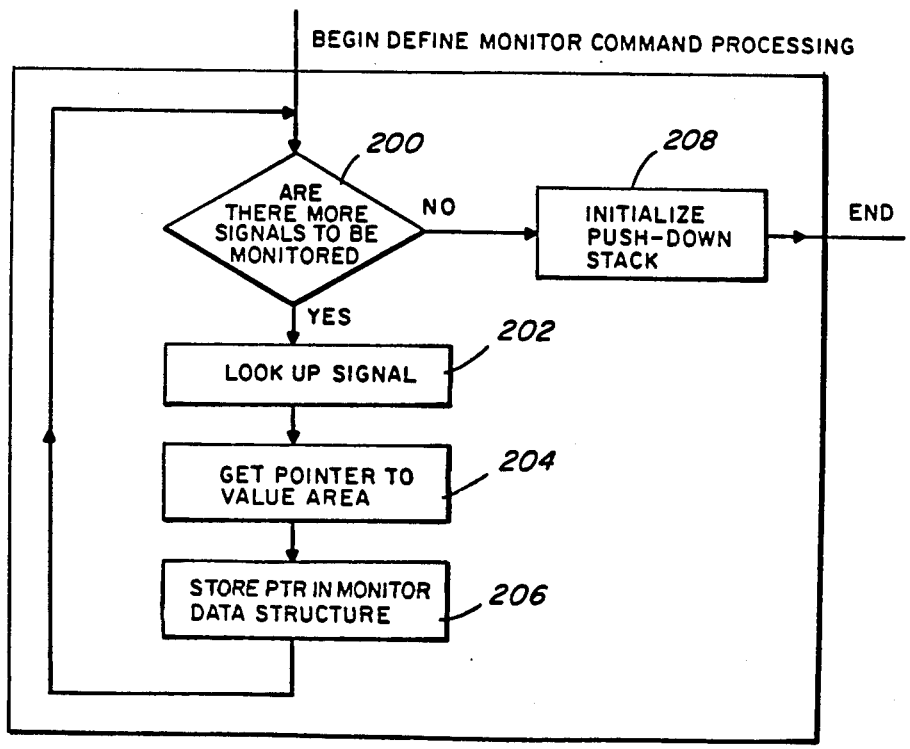

When a command from the keyboard to create an apparatus structure for initiating and controlling sampling has been processed as illustrated in FIG. 14, the apparatus, after the network elements have been fully described, sets up a monitor data structure identifying the signal inputs and outputs to be monitored. Referring to FIG. 15, the apparatus creates a data structure in memory which consists of pointers to the values of all signals which are to be monitored. Thus, if there are signals to be monitored, as determined at 200, the nature of the signal is determined at 202, and a pointer is obtained which directs the apparatus to the memory storage location containing the value of that signal. This is indicated at 204. Thereafter, that pointer is stored in a monitor data structure of memory, at 206, for later use. When all of the signals to be monitored have been processed in this manner, the apparatus initializes (for example clears) a push-down stack, at 208, and returns control to the command level processing.

Figure 16:
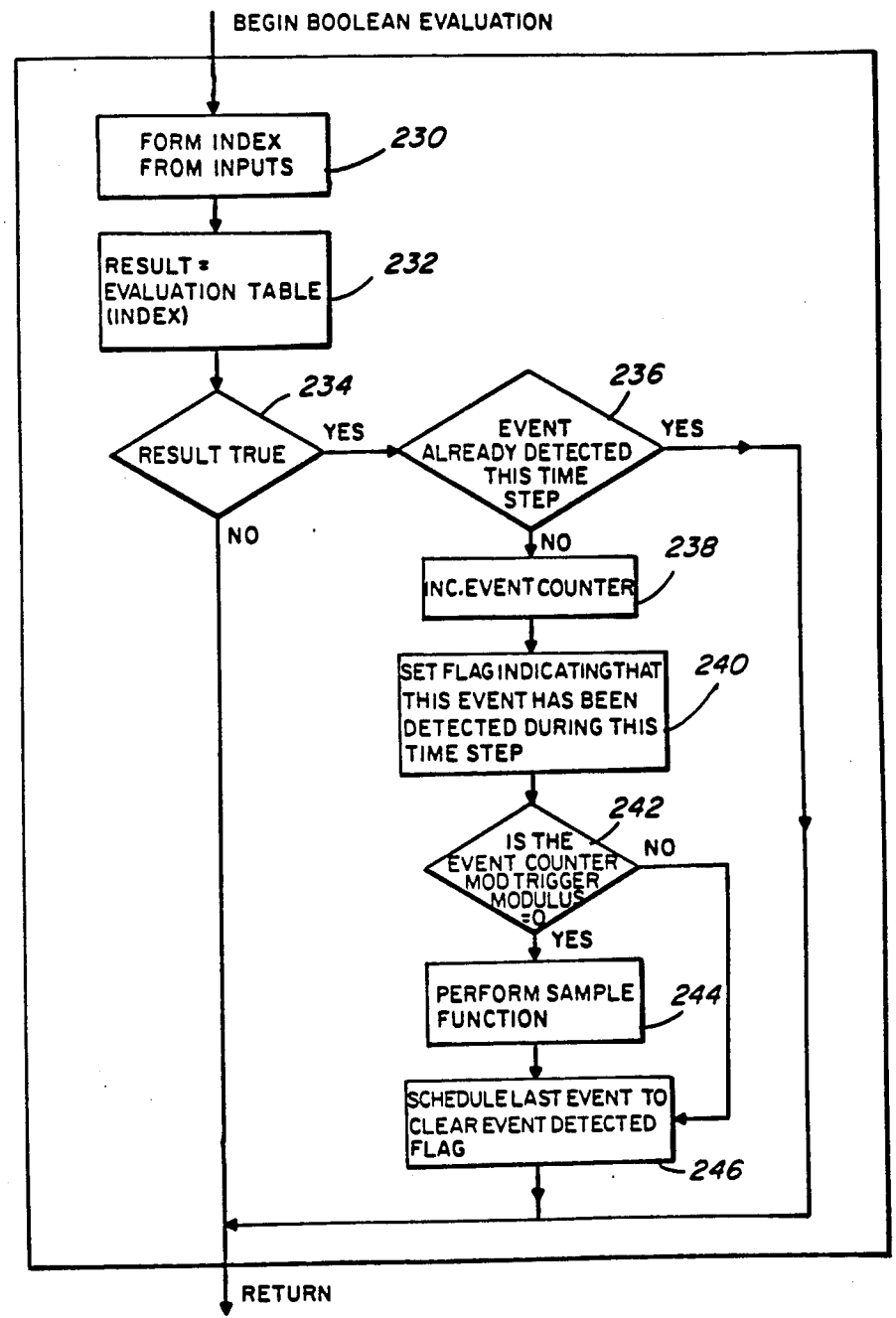

The Boolean evaluator used for initiating sampling, referring to FIG. 16, forms an index based upon the inputs provided thereto. This is indicated at 230 and corresponds, as noted above, to the elements illustrated in FIG. 10. The result of the index is applied to an evaluation table (at 232), and if the evaluation table provides a "true" response to the index, at 234, the event (to perform a sample function) is detected. Once an event is detected, the determination is made whether that event has been detected previously in this time slot. This is indicated at 236. If the event has been detected, the Boolean evaluator circuitry returns control back to the main program. If the event has not been previously detected in this time slot, however, an event counter is incremented, at 238; and a flag is set, indicating that this event was detected during this specific time slot. This is indicated at 240. Thereby, the event and the time of the event are retained for later display and analysis.

It is next determined whether the event counter, modulo the trigger modulus, equals "0". This allows the apparatus to sample every Nth time that the event combination occurs (N=1, 2, 3, ... ). If the variable is to be sampled each time the event is detected, the trigger modulus is "1". If, on the other hand the event is to be detected every four times, the trigger modulus is set to 4. It is important to point out that a separate count is set for each of the events upon which sampling can occur. Thus, one signal line can be sampled every Nth occurrence while a second signal line can be sampled every Mth occurrence. The apparatus is flexible enough to accommodate these different requirements. If in this time slot a signal sample is to be taken, as indicated by the determination modulo equal to "0", indicated at 242, the sampling function is performed (at 244). Then, a "last event" is scheduled for this time slot, to clear the event detected flag set previously at 240. This is indicated at 246.

Figure 17:
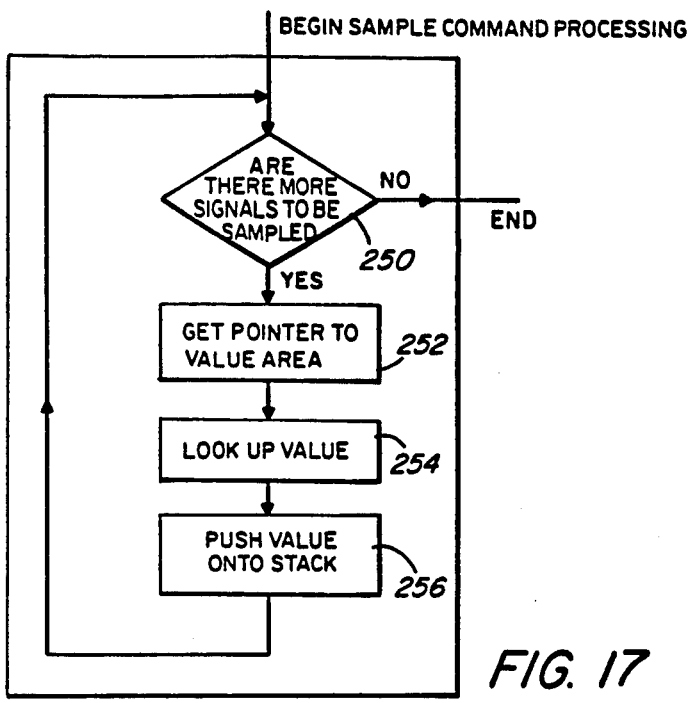

The sampling process which occurs during the simulation (as indicated at 244), is illustrated in FIG. 17. The apparatus first determines, at 250, if there is a signal to be monitored, for example by examining the monitor data structure. If there is a signal to be monitored and sampled, the pointer to the signal value is obtained at 252 and the value itself is then obtained at 254. That value is place (at 256) in the push-down stack previously initialized at 208. When all of the signals to be sampled have been thus processed, the command processing continues at 246 (FIG. 16).

The results of the sampling process can viewed at the end of the simulation, however, it is desirable to provide the user with the capability of temporarily interrupting the simulation to view the sampled waveforms. Therefore, the apparatus and method provide a breakpoint capability for interrupting the simulation, viewing the sampled results, and thereafter resuming the simulation process where it had been interrupted. The breakpoints can be functionally related to a combination of signal values. The implementation and evaluation of the breakpoint corresponds to the implementation of the sampling and tracing procedures described in connection with FIGS. 9-18.

Figure 18:
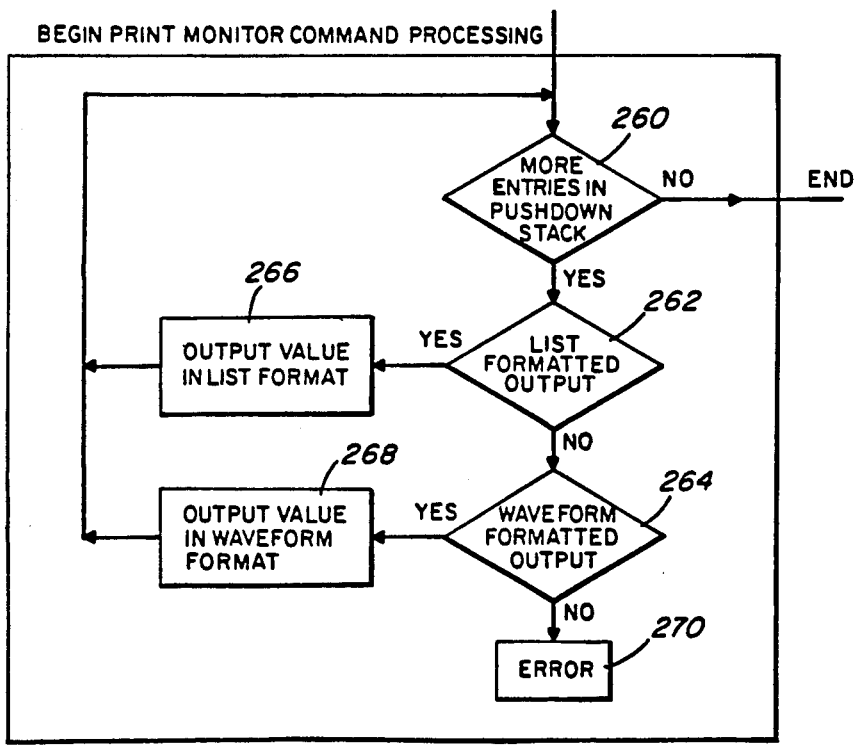

Referring now to FIG. 18, the sampled values of the monitored signals can be printed by examining first the push-down stack, at 260, to determine whether there are any entries. If there are entries, a determination is made whether they are list formatted in output (at 262) or waveform formatted in output (at 264). Depending upon the format used, the sampled values are displayed at 266 and 268, respectively. In the illustrated embodiment the only formats provided for displaying the output waveforms are the list and waveform formats. Any other output specification format in this illustrated embodiment would result in an error condition as indicated at 270.

The resulting digital system simulation apparatus and method thus enable the user to advantageously and interactively control, during simulation, the sampling of signals in the digital system to be analyzed. Thus, the behavior of the system can be analyzed better and a precise interrelationship of circuit element inputs and outputs can be obtained.

Additions, subtractions, deletions, and other modifications of the illustrated and preferred embodiment of the invention will be apparent to those skilled in the art and are within the scope of the following claims.

```
/* SIM$SIM.SPL, THEMISSRC>SOURCE>SIM$, CAD/CAM, 09/13/82                  */
/* TOP LEVEL SIM ROUTINE. IT ADVANCES TIME AND PROCESSES EVENTS.          */
/* Copyright (C) 1982, Prime Computer, Inc., Natick, Ma 01760             */

SIM$SIM: PROC;

/*----------------------------------------------------------------------*/
/*                                                                      */
/* History:                                                             */
/* Date          Programmer   Description                               */
/* 07/19/83      RICKS        Simplified NO_ACTIVITY stopping w/new evt type */
/* 05/26/83      RICKS        Don't advance WHLSTEP,TIMSTEP after SIM$LE */
/* 04/29/83      RICKS        Check for SLCNT    before stopping on NO_ACTIVITY */
/* 03/22/83      RICKS        Added calls to FLT routines               */
/* 02/24/83      RICKS        Fixed order of STOP msg printing.         */
/* 02/23/83      RICKS        Modified stop event handling              */
/* 02/08/83      MAHESH       Resetting STOP_TIM & STOP_PTR when stop event */
/*                                is processed.                         */
/* 02/03/83      RICKS        Modified to update $$NO_ACTIVITY signal   */
/* 01/14/83      RICKS        Added VEVTS count.                        */
/* 11/17/82      RICKS        Made oscillation count OSCCNT external    */
/* 11/02/82      RICKS        Modified ZERO DLY OSCILLATION msg.        */
/* MON, 13 SEP 1982  RICKS       Added external Last Event FLaG         */
/* SUN, 10 AUG 1982  RBS        Removed SIM$SWF entry declaration.      */
/*                                                                      */
/*----------------------------------------------------------------------*/
/* HISTORY:                                                             */
/*          12 MAR 1981  -DMS-  CREATED                                 */
/*          15 APR 1981  -DMS-  REMOVED CALL TO SIM$ISU                 */
/*          24 APR 1981  -DMS-  CHANGED HANDLING OF STOP EVENT          */
/*          05 FEB 1982  -DMS-  ADDED ZERO DELAY OSCILLATION MESSAGE    */
/*          19 FEB 1982  -DMS-  CHANGED STOPFLG HANDLING (SEE SIM$MN)   */
/*                                                                      */
/*----------------------------------------------------------------------*/

%INCLUDE 'THEMISSRC>INSERT>WHEEL.PL1G';
%INCLUDE 'THEMISSRC>INSERT>EVLVT.PL1G';
%INCLUDE 'THEMISSRC>INSERT>FREESTO.PL1G';
```

```
%INCLUDE  'THEMISSRC>INSERT>MSG.PL1G';
%INCLUDE  'THEMISSRC>INSERT>EVTCODE.PL1G';
%INCLUDE  'THEMISSRC>INSERT>SIMLIST.PL1G';
%INCLUDE  'THEMISSRC>INSERT>GLOBAL.PL1G';
%INCLUDE  'THEMISSRC>INSERT>FAULT_SIMLIST.INS.SPL';
%INCLUDE  'THEMISSRC>INSERT>CONVG_CHECK_LIST.INS.SPL';

/* Controls printing of stop message AFTER simlist is processed. */
DCL MSGFLG     FIXED BIN(15);
%REPLACE @NO_MSG               BY 0;
%REPLACE @USER_STOP_MSG        BY 1;
%REPLACE @NOACTIVITY_STOP_MSG  BY 2;

DCL (SIM$LE,SIM$MVL,SIM$BSL,SIM$SL) ENTRY;
DCL (SIM$NE,SIM$WE,SIM$FCE) ENTRY(PTR OPTIONS(SHORT));
DCL (FLT$SL,FLT$BSL,FLT$CCHK) ENTRY;
DCL SIM$SCE    ENTRY(FIXED BIN(31),PTR OPTIONS(SHORT));
DCL NULL       BUILTIN;

DCL (START_PTR, END_PTR)   PTR OPTIONS(SHORT);

/* INITIALIZE VARIABLES                                                      */

LEFLG = 0; /* Last event flag. */
OSCCNT = 0; /* Oscillation count. */
MSGFLG=@NO_MSG;

/*---------------------------------------------------------------------------*/
/* Scan TIME WHEEL for next step with an event.                              */
/*---------------------------------------------------------------------------*/

WHL_SCAN:;

/* Update the $$NO_ACTIVITY signal if necessary, and schedule a           */
   /* NO_ACTIVITY stop event if the user entered the SIM command.            */
   CALL NO_ACTIVITY_PROCESSING;
   /* Advance to next slot with events.                                      */
   DO WHILE (WHEEL(WHLSTEP)=NULL);
      WHLSTEP=WHLSTEP+1;
      TIMSTEP=TIMSTEP+1;
      END;

/*---------------------------------------------------------------------------*/
/* Unlink event list from wheel and process all events                       */
/*---------------------------------------------------------------------------*/

PROCESS_STEP:;
   EVTBASE=WHEEL(WHLSTEP);
   START_PTR = EVTBASE;  /* SAVE FOR FREEING EVENTS                          */
   WHEEL(WHLSTEP)=NULL;
   DO WHILE (EVTBASE^=NULL);
      END_PTR = EVTBASE; /* SAVE FOR FREEING EVENTS                          */

GOTO EVT_TYPE(EVENT.CODE); /* DO CASE OF EVENT CODE                    */

EVT_TYPE(@NORMAL):       /* PROCESS NORMAL EVENT                       */
         CALL SIM$NE(EVTBASE);
         WHLEVTS=WHLEVTS-1;
         NEVTS=NEVTS-1;
         GOTO NEXT_EVENT;

EVT_TYPE(@WAVEFORM):     /* PROCESS WAVEFORM EVENT                     */
         CALL SIM$WE(EVTBASE);
         NEVTS=NEVTS-1;
         WHLEVTS=WHLEVTS-1;
         GOTO NEXT_EVENT;

EVT_TYPE(@FUNCLK):       /* PROCESS FUNCTION CLOCK EVENT               */
         CALL SIM$FCE(EVTBASE);
         WHLEVTS=WHLEVTS-1;
         GOTO NEXT_EVENT;
```

```
    EVT_TYPE(@LAST):         /* PROCESS LAST EVENT                           */
        LEFLG=1;
        WHLEVTS=WHLEVTS-1;
        GOTO NEXT_EVENT;

EVT_TYPE(@STOP):         /* PROCESS STOP SIMULATION EVENT                */
        STOPFLG=STOPFLG+1;
        WHLEVTS=WHLEVTS-1;
        /* Processing a USER supplied stop event, or a system stop event.   */
        IF( EVTBASE = STOP_PTR ) THEN DO;
            /* We are processing users stop event. */
            STOP_TIM = @NO_USER_STOP;
            STOP_PTR = NULL();
            MSGFLG=@USER_STOP_MSG;
            END;
        GOTO NEXT_EVENT;

EVT_TYPE(@NOACTIVITY_STOP):;
        STOPFLG=STOPFLG+1;
        WHLEVTS=WHLEVTS-1;
        STOP_TIM = @NO_USER_STOP;
        MSGFLG=@NOACTIVITY_STOP_MSG;
        GOTO NEXT_EVENT;

EVT_TYPE(@CANCELLED):    /* SKIP CANCELLED NORMAL EVENTS                 */
        WHLEVTS=WHLEVTS-1;
        GOTO NEXT_EVENT;

EVT_TYPE(@END_WHL):      /* PROCESS END_OF_WHEEL EVENTS                  */

/*---------------------------------------------------------------*/
        /* The END_OF_WHEEL event is permanent attached to the last wheel */
        /* slot. It is the only event attached to that slot.              */
        /* Relink END_OF_WHEEL event to WHEEL                             */
        /*---------------------------------------------------------------*/

WHEEL(WHLSTEP)=EVTBASE;

CALL SIMSMVL; /* MOVE LONG EVENTS TO WHEEL AND RESET WHLSTEP */
        GOTO WHL_SCAN; /* FIND NEXT STEP WITH EVENTS AND REPEAT */

NEXT_EVENT: EVTBASE=EVENT.NEXT_PTR;
    END; /* DO WHILE */

/*---------------------------------------------------------------------*/
/* RETURN EVENT LIST TO FREE-STORAGE                                   */
/*---------------------------------------------------------------------*/

END_PTR->EVENT.NEXT_PTR = FS16PTR;
FS15PTR = START_PTR;

/*---------------------------------------------------------------------*/
/* Process good and faulty busgate simulation lists.                   */
/*---------------------------------------------------------------------*/

IF BSLCNT>0 THEN CALL SIMSBSL;
IF FBSLCNT>0 THEN CALL FLTSBSL;

IF WHEEL(WHLSTEP)^=NULL THEN
    GOTO PROCESS_STEP;

/*---------------------------------------------------------------------*/
/* Process good and faulty element simulation lists.                   */
/*---------------------------------------------------------------------*/

IF SLCNT>0 THEN CALL SIMSSL;
IF FSLCNT>0 THEN CALL FLTSSL;

/*---------------------------------------------------------------------*/
/* Process convergence check list. Whenever a good (faulty) element input */
/* is updated, and the corresponding faulty (good) element input is not  */
/* updated, then the faulty element is placed on the convergence check list. */
/*---------------------------------------------------------------------*/
```

```
IF CHECKCNT>0 THEN CALL FLTSCCHK;

/*------------------------------------------------------------*/
/* Check for zero delay oscillations.                         */
/*------------------------------------------------------------*/

IF WHEEL(WHLSTEP)^=NULL THEN DO;
    OSCCNT = OSCCNT + 1;
    IF OSCCNT > 500 THEN DO;
        CALL OUTPUT_ZERO_DELAY_MSG;
        STOPFLG = 0;
        RETURN;
        END;
    GOTO PROCESS_STEP;
    END;

/*------------------------------------------------------------*/
/* RESET OSCILLATION COUNTER                                  */
/*------------------------------------------------------------*/

OSCCNT=0;

/*------------------------------------------------------------*/
/* Process last events.                                       */
/*------------------------------------------------------------*/

IF LEFLG^=0 THEN DO;
    LEFLG = 0;
    CALL SIMSLE;
    END;

/*------------------------------------------------------------*/
/* Print stop message if simulation is being stopped.         */
/*------------------------------------------------------------*/

IF STOPFLG^=0 THEN DO;
    IF MSGFLG=@USER_STOP_MSG THEN
        CALL OUTSMSG(@NOTE,'Simulation stopped because of stop event at ' ||
                     'step ' || CHAR(TIMSTEP)||'.' );
    ELSE IF MSGFLG=@NOACTIVITY_STOP_MSG THEN
        CALL OUTSMSG(@NOTE,'Simulation stopped at step ' || CHAR(TIMSTEP)
                     || ' because there is no activity in the '
                     || 'system. ' );
    RETURN;
    END;

/*------------------------------------------------------------*/
/* Bump time wheel and timestep and simulate next time interval. */
/*------------------------------------------------------------*/

/* WHLSTEP = WHLSTEP + 1; */
/* TIMSTEP = TIMSTEP + 1; */
GOTO WHL_SCAN;

/*=================INTERNAL PROCEDURES========================*/

OUTPUT_ZERO_DELAY_MSG: PROC;

%INCLUDE 'CADSRC>INSERT>MAX_NAMSIZ.INS.SPL';
%REPLACE @TRUE BY '1'B;
%REPLACE @FALSE BY '0'B;

DCL NAMES(@RMXLV1)     CHAR(&MXSYMN) VAR;
DCL #NAMLS             FIXED BIN(15);
DCL NAME               CHAR(100) VAR;
DCL FSP                PTR;
DCL P                  PTR OPTIONS(SHORT);
DCL QUIT               BIT(1) ALIGNED;
DCL I                  FIXED BIN(15);
DCL RC                 FIXED BIN(15);
```

```
DCL OUTSRPT            ENTRY(PTR,CHAR(&MXFLNM) VAR,FIXED BIN(15),
                            CHAR(&MXSTRLN) VAR,PTR OPTIONS(SHORT),
                            FIXED BIN(15))
                            RETURNS(BIT(1) ALIGNED);
DCL GTSSCEN            ENTRY(PTR OPTIONS(SHORT),(@RMXLV1) CHAR(&MXSYMN) VAR,
                            FIXED BIN(15));

/*---------------------------------------------------------------------*/
/* During initialization, clock generation circuits with feedback will often */
/* cause zero delay oscillations.                                       */
/*---------------------------------------------------------------------*/

IF INITDONE=0 THEN DO;
   MESSAGE='** Zero delay oscillation detected during initialization. **';
   CALL OUTSMSG(@WARN,MESSAGE);
   END;

/*---------------------------------------------------------------------*/
/* During simulation, however, zero delay oscillations are probably a   */
/* result of error. A more extensive error message is printed.          */
/*---------------------------------------------------------------------*/

ELSE DO;
   P=WHEEL(WHLSTEP);
   IF P->EVENT.CODE=@WAVEFORM THEN DO;
      MESSAGE='** Zero delay waveform has been detected. **';
      CALL OUTSMSG(@WARN,MESSAGE);
      END;
   ELSE DO;
      MESSAGE='** Zero delay oscillation detected. Cannot proceed with this '||
              'time step. The following elements are in the loop: ';
      CALL OUTSMSG(@ERROR,MESSAGE);
      FSP=NULL;
      QUIT=&FALSE;
      DO WHILE(P^=NULL & ^QUIT);
         IF P->EVENT.CODE=@NORMAL THEN DO;
            CALL GTSSCEN(P->EVENT.ELMT_PTR,NAMES,#NAMES);
            NAME='';
            DO I=1 TO #NAMES-1;
               NAME=NAME||NAMES(I)||'..';
               END;
            NAME=NAME||NAMES(#NAMES);
            QUIT=^OUTSRPT(FSP,'TTY',&LIST,'           '||NAME,NULL,RC);
            END;
         P=P->EVENT.NEXT_PTR;
         END;
      END;
   END;
END OUTPUT_ZERO_DELAY_MSG;

/*=====================================================================*/

NO_ACTIVITY_PROCESSING: PROC;

/*---------------------------------------------------------------------*/
/* This procedure updates the $$NO_ACTIVITY signal iff it has made a    */
/* transition from zero to a positive value, or from a positive value   */
/* to zero. If a transition has occurred, an event is scheduled on the  */
/* output of the special $$NO_ACTIVITY block.                           */
/*---------------------------------------------------------------------*/

DCL SIMSSCH            ENTRY(FIXED BIN(31),PTR OPTIONS(SHORT),
                            PTR OPTIONS(SHORT));

DCL ELMTBASE           PTR OPTIONS(SHORT); /* FOR GEN_PRIM INCLUDE */
%INCLUDE 'THEMISSRC>INSERT>GEN_PRIM.PL1G';
%INCLUDE 'THEMISSRC>INSERT>CHGCODE.PL1G';

/* Schedule a stop if there are no NORMAL events on the wheel, no       */
/* evaluations scheduled to be performed, and user want to stop if      */
/* no activity situation arises.                                        */
/* NOTE: This should be processed before the $$NO_ACTIVITY event is     */
```

```
/* scheduled, since the $$NO_ACTIVITY event should not be counted as a     */
/* circuit event. E.G. a STOP event is scheduled at the same time that     */
/* all circuit activity dies down (LSTEVTS>0, NEVTS=0). The $$NO_ACTIVITY  */
/* event will not be scheduled until the user types SIM, at which point    */
/* it will be scheduled and simulation will proceed for one time unit, even */
/* if there is no real circuit activity.                                   */
IF( NEVTS = 0 & STOP_TIM = @STOP_ON_NOACT & SLCNT=0 ) THEN DO;
    CALL SIM$SCE( 0,EVTBASE );
    EVENT.CODE = @NOACTIVITY_STOP;
    END;

/* Schedule a $$NO_ACTIVITY_EVENT if there was no activity before, and there */
/* is now.                                                                   */
IF LSTNEVTS=0 & NEVTS>0 THEN DO;

/* SIM$SIM.SPL, THEMISSRC>SOURCE>SIMS, CAD/CAM, 09/15/82                  */

/* $$NO_ACTIVITY signal goes low. */
    LSTNEVTS=NEVTS;
    CALL SIM$SCH(0,ACTBLKP->GEN_PRIM.EVT_PTR,EVTBASE);
    EVENT.CODE=@NORMAL;
    EVENT.CHG_CODE=@1_0;
    EVENT.ELMT_PTR=ACTBLKP;
    EVENT.NORM_PTR=ACTBLKP;
    EVENT.OUT_POS=1;
    END;

/* Schedule a NO_ACTIVITY event if there was activity before, and there   */
/* is none now.                                                           */
ELSE IF LSTNEVTS>0 & NEVTS=0 THEN DO;
    /* $$NO_ACTIVITY signal goes high. */
    LSTNEVTS=NEVTS;
    CALL SIM$SCH(0,ACTBLKP->GEN_PRIM.EVT_PTR,EVTBASE);
    EVENT.CODE=@NORMAL;
    EVENT.CHG_CODE=@0_1;
    EVENT.ELMT_PTR=ACTBLKP;
    EVENT.NORM_PTR=ACTBLKP;
    EVENT.OUT_POS=1;
    END;
ELSE LSTNEVTS=NEVTS;

END NO_ACTIVITY_PROCESSING;

END SIM$SIM;

/* SIM$SB.SPL, THEMISSRC>SOURCE>SIMS, CAD/CAM, 12/29/82                   */
/* SIMULATE BOOLEAN PRIMITIVE                                             */
/* COPYRIGHT (C) 1982, Prime Computer, Inc., Natick, Ma 01760             */

SIM$SP: PROC(STABASE,EVALBASE,DLYBASE,SIMBASE,ELMTBASE);

/*------------------------------------------------------------------------*/
/*                                                                        */
/*  EVALUATES BOOLEAN PRIMITIVES AND SCHEDULES/UNSCHEDULES EVENTS AS      */
/*  NEEDED. EVALUATION IS DONE WITH A TABLE LOOK UP TECHNIQUE.            */
/*                                                                        */
/*  STABASE:  (INPUT) PTR TO STATE INFORMATION                            */
/*  EVALBASE: (INPUT) PTR TO BOOLEAN EVALUATION TABLE                     */
/*  DLYBASE:  (INPUT) PTR TO BOOLEAN DELAY TABLE                          */
/*  SIMBASE:  (INPUT) PTR TO BOO_ ELMT BEING EVALUATED (FE or GOOD ELMT)  */
/*  ELMTBASE: (INPUT) PTR TO GOOD BOOLEAN ELEMENT                         */
/*                                                                        */
/* Description:                                                           */
/*                                                                        */
/*                                                                        */
/* History:                                                               */
```

```
/*  Date    Programmer  Description of modification                      */
/* 04/04/83  RICKS      Fixed bug in call SIM$SBX                        */
/* 01/28/83  RICKS      Changed arguments for fault simulation.          */
/* 12/29/82  RICKS      Fixed &Z-X delay computation bug.                */
/*                                                                       */
/* HISTORY:                                                              */
/*          2 APR 1981 -DMS- CREATED                                     */
/*         28 APR 1981 -DMS- ADDED BOO_STAT AND REMOVED BOO_VALOVER      */
/*          6 JUL 1981 -DMS- CHANGED CALL TO SIM$SCH AND SIM$SBS TO CONFORM */
/*                          TO NEW ARGUMENTS                             */
/*                                                                       */
/*---------------------------------------------------------------------*/

%INCLUDE 'CADSRC>INSERT>MAX_NAMSIZ.INS.SPL';
%INCLUDE 'THEMISSRC>INSERT>BOOLEAN.PL1G';
%INCLUDE 'THEMISSRC>INSERT>TYPETAB.PL1G';
%INCLUDE 'THEMISSRC>INSERT>BOO_EVALTAB.PL1G';
%INCLUDE 'THEMISSRC>INSERT>BOO_STAT.PL1G';
%INCLUDE 'THEMISSRC>INSERT>EVENT.PL1G';
%INCLUDE 'THEMISSRC>INSERT>EVTCODE.PL1G';
%INCLUDE 'THEMISSRC>INSERT>DELAYTAB.PL1G';
%INCLUDE 'THEMISSRC>INSERT>DELAY_CODES.PL1G';
%INCLUDE 'THEMISSRC>INSERT>CHGCODE.PL1G';

DCL ELMTBASE      PTR OPTIONS(SHORT);    /* TO GOOD BOOLEAN ELEMENT           */
DCL SIMBASE       PTR OPTIONS(SHORT);    /* TO FE OR GOOD ELMT BEING SIMULATED */
DCL EVALBASE      PTR OPTIONS(SHORT);    /* TO BOOLEAN EVALUATION TABLE       */

DCL CHANGE_CODE   FIXED BIN(15);
DCL DELAY         FIXED BIN(31);

DCL NULL          BUILTIN;
DCL SIM$SBX       ENTRY(PTR OPTIONS(SHORT), PTR OPTIONS(SHORT), BIT(16) ALIGNED,
                        FIXED BIN(15), FIXED BIN(15));
DCL SIM$SBS       ENTRY(PTR OPTIONS(SHORT), PTR OPTIONS(SHORT),
                        PTR OPTIONS(SHORT), FIXED BIN(15),
                        FIXED BIN(31), FIXED BIN(15));
DCL SIM$SCH       ENTRY(FIXED BIN(31), PTR OPTIONS(SHORT), PTR OPTIONS(SHORT));

/* CHECK FOR X IO'S AND SIMULATE ACCORDINGLY  */

IF BOO_STAT_BIN.ZX_VALUE = 0 THEN
    CHANGE_CODE = EVALBASE->BOO_EVAL_TABLE(BOO_STAT_BIN.B_VALUE);
ELSE
    CALL SIM$SBX(STABASE,EVALBASE,BOOLEAN.TYPE_PTR->TYPETAB.Z_EQU_MASK,
                 BOOLEAN.OUT_POS,CHANGE_CODE);

/* GET DELAY BASED ON CHANGE CODE */
GOTO CHG(CHANGE_CODE);
CHG(@0_0):
    IF BOO_STAT.EVT_PTR ^= NULL THEN
        CALL SIM$SBS(BOO_STAT.EVT_PTR,SIMBASE,ELMTBASE,
                     CHANGE_CODE,0,BOOLEAN.OUT_POS);
    RETURN;
CHG(@0_1):
    DELAY = DELAY_TABLE(@TPLH);
    GOTO END_DELAY;
CHG(@0_X):
    DELAY = DELAY_TABLE(@TPLH);
    GOTO END_DELAY;
CHG(@0_Z):
    DELAY = DELAY_TABLE(@TPLZ);
    GOTO END_DELAY;
CHG(@1_0):
    DELAY = DELAY_TABLE(@TPHL);
    GOTO END_DELAY;
CHG(@1_1):
    IF BOO_STAT.EVT_PTR ^= NULL THEN
        CALL SIM$SBS(BOO_STAT.EVT_PTR,SIMBASE,ELMTBASE,
                     CHANGE_CODE,0,BOOLEAN.OUT_POS);
    RETURN;
```

```
CHG(@1_X):
    DELAY = DELAY_TABLE(@TPHL);
    GOTO END_DELAY;
CHG(@1_Z):
    DELAY = DELAY_TABLE(@TPHZ);
    GOTO END_DELAY;
CHG(@X_0):
    DELAY = DELAY_TABLE(@TPHL);
    GOTO END_DELAY;
CHG(@X_1):
    DELAY = DELAY_TABLE(@TPLH);
    GOTO END_DELAY;
CHG(@X_X):
    IF BOO_STAT.EVT_PTR ^= NULL THEN
        CALL SIM$SBS(BOO_STAT.EVT_PTR,SIMBASE,ELMTBASE,
                    CHANGE_CODE,0,BOOLEAN.OUT_POS);
    RETURN;
CHG(@X_Z):
    /* SCHEDULE WITH LONGER OF 0-Z OR 1-Z DELAY */
    IF DELAY_TABLE(@TPLZ) > DELAY_TABLE(@TPHZ) THEN
        DELAY = DELAY_TABLE(@TPLZ);
    ELSE
        DELAY = DELAY_TABLE(@TPHZ);
    GOTO END_DELAY;
CHG(@Z_0):
    DELAY = DELAY_TABLE(@TPZL);
    GOTO END_DELAY;
CHG(@Z_1):
    DELAY = DELAY_TABLE(@TPZH);
    GOTO END_DELAY;
CHG(@Z_X):
    /* SCHEDULE WITH SHORTER OF Z-0 OR Z-1 DELAY */
    IF DELAY_TABLE(@TPZL) < DELAY_TABLE(@TPZH) THEN
        DELAY = DELAY_TABLE(@TPZL);
    ELSE
        DELAY = DELAY_TABLE(@TPZH);
    GOTO END_DELAY;
CHG(@Z_Z):
    IF BOO_STAT.EVT_PTR ^= NULL THEN
        CALL SIM$SBS(BOO_STAT.EVT_PTR,SIMBASE,ELMTBASE,
                    CHANGE_CODE,0,BOOLEAN.OUT_POS);
    RETURN;
END_DELAY:

/* CHECK IF BOOLEAN PRESENTLY SCHEDULED */

IF BOO_STAT.EVT_PTR = NULL THEN
    DO;
        CALL SIM$SCH(DELAY,BOO_STAT.EVT_PTR,EVTBASE);
        EVENT.CODE     = @NORMAL;
        EVENT.CHG_CODE = CHANGE_CODE;
        EVENT.ELMT_PTR = SIMBASE;
        EVENT.NORM_PTR = ELMTBASE;
        EVENT.OUT_POS  = BOOLEAN.OUT_POS;
    END;
ELSE
    /* PRESENTLY SCHEDULED */
    CALL SIM$SBS(BOO_STAT.EVT_PTR,SIMBASE,ELMTBASE,
                CHANGE_CODE,DELAY,BOOLEAN.OUT_POS);
END SIM$SBS;

/* FMS$MN.SPL, THEMISSRC>SOURCE>FMS$, CAD/CAM, 11/02/82            */

/* FMS$MN.SPL, THEMISSRC>SOURCE>FMS$, CAD/CAM, 11/02/82            */
/* Main program for TAD function model evaluation.                 */
/* COPYRIGHT (C) 1982, Prime Computer, Inc., Natick, Ma 01760      */

FMS$MN: PROC(ELMTBASE);

/*---------------------------------------------------------------*/
```

```
/* Description:                                                              */
/*    This procedure performs TAD function model evaluation.                 */
/*                                                                           */
/* History:                                                                  */
/* Date      Programmer  Description of modification                         */
/* 10/12/83  RICKS       Faster @ADD command                                 */
/* 09/23/83  RICKS       Fixed bug in RPNLOC bumping after ASSIGN_PINS instr.*/
/* 08/22/83  RICKS       New relational operator handling, & major performance*/
/*                       improvements.                                       */
/* 04/28/83  LORNE       Changed conditional equality code/philosophy        */
/*                       Now test on 1) Identically equal = TRUE             */
/*                                   2) Else, any X's equals = ELSEX         */
/*                                   3) Otherwise, equals = FALSE            */
/* 01/12/82  MAS         Added @CEDGE_DET and @PEDGE_DET for any transition  */
/* 12/28/82  RICKS       Removed @LOAD_BIPIN code                            */
/* 12/23/82  RICKS       Added code for assignment to open emit,collect,of pins */
/* 12/17/82  MAS         Added MID_FLIP instruction                          */
/* 12/15/82  RICKS       Replace FMS$ASPN with FMS$ASDP                      */
/* 12/08/82  MAS         Added MTMPSTOR initialization                       */
/* 12/08/82  MAS         Moved initialization code into DATSP2               */
/* 12/03/82  MAHESH      Made next level execution work properly             */
/* 11/22/82  MAHESH      Added call to fms$asmm for memory assignment        */
/* 11/19/82  RICKS       Fixed a few JUMP instructions                       */
/* 11/18/82  MAHESH      Added call to FMS$WSTR to transfer data to perm storage */
/* 11/15/82  LORNE       Fixed Message instruction to agree with SDL & compiler */
/* 11/02/82  RICKS       Initial coding.                                     */
/*---------------------------------------------------------------------------*/

DCL ELMTBASE        PTR OPTIONS(SHORT); /* IN - To FUNCTION occurrence.      */

/* Insert files */
%INCLUDE '>CADSRC>INSERT>MAX_NAMSIZ.INS.SPL';
%INCLUDE '>THEMISSRC>INSERT>FUNC_SIZE_LIMITS.INS.SPL';
%INCLUDE '>CADSRC>INSERT>FUNCTION.INS.SPL';
%INCLUDE '>THEMISSRC>INSERT>FUNC_NEXT_BLOCK.INS.SPL';
%INCLUDE '>THEMISSRC>INSERT>FUNC_TEMP_EVTPTR.INS.SPL';
%INCLUDE '>THEMISSRC>INSERT>FUNC_TEMP_STORAGE.INS.SPL';
%INCLUDE '>THEMISSRC>INSERT>FUNC_WORKING_STACK.INS.SPL';
%INCLUDE '>CADSRC>INSERT>FUN_EVALTAB.INS.SPL';
%INCLUDE '>THEMISSRC>INSERT>TYPETAB.PL1G';
%INCLUDE '>CADSRC>INSERT>TAD_INST_CODES.INS.SPL';
%INCLUDE '>THEMISSRC>INSERT>ITEM.PL1G';
%INCLUDE '>CADSRC>INSERT>STORAGE.INS.SPL';
%INCLUDE '>THEMISSRC>INSERT>CH6CODE.PL1G';
%INCLUDE '>THEMISSRC>INSERT>WHEEL.PL1G';  /* to get TIMSTEP */
%INCLUDE '>THEMISSRC>INSERT>BOO_MASKTAB.PL1G';
%INCLUDE '>THEMISSRC>INSERT>STATISTICS.INS.SPL';
%INCLUDE '>THEMISSRC>INSERT>DELAYTAB.PL1G';

/* Debug flag. ON -> debug mode. */
%REPLACE @DEBUG_FLAG BY '0'B;
%REPLACE @TRUE BY '1'B;
%REPLACE @FALSE BY '0'B;

/* External entry points */

%INCLUDE '>CADSRC>ENTRIES>OUT$MSG.INS.SPL';
DCL FMS$ASDP        ENTRY(PTR OPTIONS(SHORT),PTR OPTIONS(SHORT));
DCL FMS$ASRG        ENTRY(PTR OPTIONS(SHORT),PTR OPTIONS(SHORT));
DCL FMS$ASMM        ENTRY(PTR OPTIONS(SHORT),PTR OPTIONS(SHORT));
DCL FMS$WSTR        ENTRY(PTR OPTIONS(SHORT));
DCL FMS$LDM         ENTRY(PTR OPTIONS(SHORT),PTR OPTIONS(SHORT));
DCL FMS$LDR         ENTRY(PTR OPTIONS(SHORT),PTR OPTIONS(SHORT));
DCL FMS$SCPN        ENTRY(PTR OPTIONS(SHORT));
DCL FMS$SHFT        ENTRY(BIT(32) ALIGNED,FIXED BIN(15))
                    RETURNS(BIT(32) ALIGNED);
DCL FMS$ADD         ENTRY(FIXED BIN(15));
DCL FMS$FL          ENTRY(BIT(32) ALIGNED, BIT(32) ALIGNED, FIXED BIN(15));
DCL OUT$WRT         ENTRY(FIXED BIN(15), CHARACTER(@MXSTRLN) VARYING);

/* Local declarations */
```

```
DCL I              FIXED BIN(15);
DCL P              PTR OPTIONS(SHORT);
DCL CURRENT_NEXT_BLOCK_PTR PTR OPTIONS(SHORT);

DCL NULL           BUILTIN;

DCL RPNLOC         FIXED BIN(31);      /* Loc of next inst to be executed.  */
DCL RPNPTR         PTR OPTIONS(SHORT); /* PRIMOS adrs of next inst(for ovlay)*/
DCL EVALBASE       PTR OPTIONS(SHORT); /* To evalution table.               */

/*---------------------------------------------------------------------*/
/* Initialization                                                      */
/*---------------------------------------------------------------------*/

FNXTBTOP=NULL;         /* Null out NEXT BLOCK list. */
CURRENT_NEXT_BLOCK_PTR = NULL;
FSTKPTR=0;             /* Index into working stack. */
C_IN=0;                /* Status bits. */
C_OUT=0;
OVERFLOW=0;
MTMPSTOR=0;            /* Max temp storage index */

EVALBASE=FUNCTION.TYPE_PTR->TYPETAB.EVAL_PTR;
RPNLOC=1; /* Loc 0 contains size of evaluation table. */

/*---------------------------------------------------------------------*/
/* Enter INSTRUCTION execution loop.                                   */
/*---------------------------------------------------------------------*/

NEXT_INST:

/* Keep track of instruction counts.                                   */
TADFREQ(FUN_EVAL_TABLE(RPNLOC))=TADFREQ(FUN_EVAL_TABLE(RPNLOC))+1;

IF @DEBUG_FLAG THEN DO;
   IF INSTRUCTION_ERROR_DETECTED(RPNLOC) THEN GOTO DONE;
   END;

GOTO INSTRUCTION(FUN_EVAL_TABLE(RPNLOC));

INSTRUCTION(@TAD_MSG):;

DCL MSG_INST   CHAR(@MXSTRLN) VAR BASED;

CALL OUTSWRT(0, ADDR(FUN_EVAL_TABLE(RPNLOC+1)) -> MSG_INST);

/* Step around length field and characters. */
      I = FUN_EVAL_TABLE(RPNLOC + 1);
      RPNLOC = RPNLOC + (DIVIDE( I, 2, 31) + MOD(I,2) + 2);

GOTO NEXT_INST;

INSTRUCTION(@L_OR):;   /*** LOGICAL OR ***/

DCL ARG1_B     BIT(32) ALIGNED;
      DCL ARG2_B     BIT(32) ALIGNED;
      DCL ARG1_ZX    BIT(32) ALIGNED;
      DCL ARG2_ZX    BIT(32) ALIGNED;
      DCL BIN1_ZX    FIXED BIN(31);
      DCL BIN2_ZX    FIXED BIN(31);

ARG1_B = FUNSTACK_OVLAY(FSTKPTR).B_VALUE;
      ARG2_B = FUNSTACK_OVLAY(FSTKPTR - 1).B_VALUE;
      ARG1_ZX = FUNSTACK_OVLAY(FSTKPTR).ZX_VALUE;
      ARG2_ZX = FUNSTACK_OVLAY(FSTKPTR - 1).ZX_VALUE;
      UNSPEC(BIN1_ZX)=ARG1_ZX;
      UNSPEC(BIN2_ZX)=ARG2_ZX;

/* Do simple OR operation if no z,x values. */
      IF BIN1_ZX=0 & BIN2_ZX=0 THEN DO;
         SUBSTR(RES_B,1,16)=SUBSTR(ARG1_B,1,16) | SUBSTR(ARG2_B,1,16);
         SUBSTR(RES_B,17,16)=SUBSTR(ARG1_B,17,16) | SUBSTR(ARG2_B,17,16);
```

```
      RES_ZX='0'B;
      END;

/* Otherwise handle general case if there are X's */
   ELSE DO;

/* Change Z's to X's before the or */
      SUBSTR(ARG1_B,1,16) = SUBSTR(ARG1_B,1,16) & ^SUBSTR(ARG1_ZX,1,16);
      SUBSTR(ARG1_B,17,16) = SUBSTR(ARG1_B,17,16) & ^SUBSTR(ARG1_ZX,17,16);
      SUBSTR(ARG2_B,1,16) = SUBSTR(ARG2_B,1,16) & ^SUBSTR(ARG2_ZX,1,16);
      SUBSTR(ARG2_B,17,16) = SUBSTR(ARG2_B,17,16) & ^SUBSTR(ARG2_ZX,17,16);

SUBSTR(RES_B,1,16)  = SUBSTR(ARG1_B,1,16)  | SUBSTR(ARG2_B,1,16);
      SUBSTR(RES_B,17,16) = SUBSTR(ARG1_B,17,16) | SUBSTR(ARG2_B,17,16);
      SUBSTR(RES_ZX,1,16) = SUBSTR(ARG1_ZX,1,16) | SUBSTR(ARG2_ZX,1,16);
      SUBSTR(RES_ZX,17,16) = SUBSTR(ARG1_ZX,17,16) | SUBSTR(ARG2_ZX,17,16);
      /* Change Z's to 1's in result */
      SUBSTR(RES_ZX,1,16) = SUBSTR(RES_ZX,1,16) & ^SUBSTR(RES_B,1,16);
      SUBSTR(RES_ZX,17,16) = SUBSTR(RES_ZX,17,16) & ^SUBSTR(RES_B,17,16);

END;

FSTKPTR = FSTKPTR - 1; /* pop operands and push result */
   FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 1; /* to next instruction */

GOTO NEXT_INST;

INSTRUCTION(@L_EXOR):;   /*** LOGICAL EXCLUSIVE OR ***/

ARG1_B = FUNSTACK_OVLAY(FSTKPTR).B_VALUE;
   ARG1_ZX = FUNSTACK_OVLAY(FSTKPTR).ZX_VALUE;
   ARG2_B = FUNSTACK_OVLAY(FSTKPTR - 1).B_VALUE;
   ARG2_ZX = FUNSTACK_OVLAY(FSTKPTR -1).ZX_VALUE;
   /* Change Z's to X's before the x-or */
   SUBSTR(ARG1_B,1,16) = SUBSTR(ARG1_B,1,16) & ^SUBSTR(ARG1_ZX,1,16);
   SUBSTR(ARG1_B,17,16) = SUBSTR(ARG1_B,17,16) & ^SUBSTR(ARG1_ZX,17,16);
   SUBSTR(ARG2_B,1,16) = SUBSTR(ARG2_B,1,16) & ^SUBSTR(ARG2_ZX,1,16);
   SUBSTR(ARG2_B,17,16) = SUBSTR(ARG2_B,17,16) & ^SUBSTR(ARG2_ZX,17,16);

SUBSTR(RES_B,1,16)  = (SUBSTR(ARG1_B,1,16)  | SUBSTR(ARG2_B,1,16) ) &
                         ^(SUBSTR(ARG1_B,1,16) & SUBSTR(ARG2_B,1,16) );
   SUBSTR(RES_B,17,16) = (SUBSTR(ARG1_B,17,16) | SUBSTR(ARG2_B,17,16) ) &
                         ^(SUBSTR(ARG1_B,17,16) & SUBSTR(ARG2_B,17,16) );
   SUBSTR(RES_ZX,1,16) = SUBSTR(ARG1_ZX,1,16) | SUBSTR(ARG2_ZX,1,16);
   SUBSTR(RES_ZX,17,16) = SUBSTR(ARG1_ZX,17,16) | SUBSTR(ARG2_ZX,17,16);
   SUBSTR(RES_B,1,16) = SUBSTR(RES_B,1,16) & ^SUBSTR(RES_ZX,1,16);
   SUBSTR(RES_B,17,16) = SUBSTR(RES_B,17,16) & ^SUBSTR(RES_ZX,17,16);

FSTKPTR = FSTKPTR - 1; /* pop operands and push result */

FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 1; /* to next instruction */

GOTO NEXT_INST;

INSTRUCTION(@L_AND):;    /*** LOGICAL AND ***/

ARG1_B = FUNSTACK_OVLAY(FSTKPTR).B_VALUE;
   ARG1_ZX = FUNSTACK_OVLAY(FSTKPTR).ZX_VALUE;
   ARG2_B = FUNSTACK_OVLAY(FSTKPTR - 1).B_VALUE;
   ARG2_ZX = FUNSTACK_OVLAY(FSTKPTR -1).ZX_VALUE;

/* Fast way to convert to BIN values. */
   UNSPEC(BIN1_ZX)=ARG1_ZX;
   UNSPEC(BIN2_ZX)=ARG2_ZX;
```

```
/* Do simple AND operation if no z,x values. */
/* Test on bin values more efficient than test on bit values. */
IF BIN1_ZX=0 & BIN2_ZX=0 THEN DO;

/* Sixteen bit operations are very efficient. */
   SUBSTR(RES_B,1,16)=SUBSTR(ARG1_B,1,16) & SUBSTR(ARG2_B,1,16);
   SUBSTR(RES_B,17,16)=SUBSTR(ARG1_B,17,16) & SUBSTR(ARG2_B,17,16);
   RES_ZX='0'B;
   END;

/* Otherwise handle general case if there are X's */
ELSE DO;
   /* change Z's to X's */
   SUBSTR(ARG1_B,1,16) = SUBSTR(ARG1_B,1,16) & ^SUBSTR(ARG1_ZX,1,16) ;
   SUBSTR(ARG1_B,17,16) = SUBSTR(ARG1_B,17,16) & ^SUBSTR(ARG1_ZX,17,16) ;
   SUBSTR(ARG2_B,1,16) = SUBSTR(ARG2_B,1,16) & ^SUBSTR(ARG2_ZX,1,16) ;
   SUBSTR(ARG2_B,17,16) = SUBSTR(ARG2_B,17,16) & ^SUBSTR(ARG2_ZX,17,16) ;

SUBSTR(RES_B,1,16) = SUBSTR(ARG1_B,1,16) & SUBSTR(ARG2_B,1,16) ;
   SUBSTR(RES_B,17,16) = SUBSTR(ARG1_B,17,16) & SUBSTR(ARG2_B,17,16) ;
   SUBSTR(RES_ZX,1,16) = (SUBSTR(ARG1_ZX,1,16) & SUBSTR(ARG2_ZX,1,16) ) |
            (SUBSTR(ARG1_ZX,1,16) & SUBSTR(ARG2_B,1,16) ) |
            (SUBSTR(ARG2_ZX,1,16) & SUBSTR(ARG1_B,1,16) );
   SUBSTR(RES_ZX,17,16) = (SUBSTR(ARG1_ZX,17,16) & SUBSTR(ARG2_ZX,17,16) ) |
            (SUBSTR(ARG1_ZX,17,16) & SUBSTR(ARG2_B,17,16) ) |
            (SUBSTR(ARG2_ZX,17,16) & SUBSTR(ARG1_B,17,16) );
   END;

FSTKPTR = FSTKPTR - 1; /* pop operands and push result */

FUNSTACK_OVLAY(FSTKPTR).B_VALUE = RES_B;
FUNSTACK_OVLAY(FSTKPTR).ZX_VALUE = RES_ZX;

RPNLOC = RPNLOC + 1; /* to next instruction */

GOTO NEXT_INST;

INSTRUCTION(@L_NOT):; /*** LOGICAL NOT ***/

DCL #BITS  FIXED BIN(15);
  DCL MASK   BIT(32) ALIGNED;
  #BITS = FUN_EVAL_TABLE(RPNLOC + 1); /* number of bits in operand */

IF @DEBUG_FLAG THEN DO;
     IF (#BITS >32) | (#BITS <1) THEN DO;
        CALL OUTSMSG(@ERROR_PE, 'Number of bits in operand of LOGICAL NOT ' ||
                                'is ' || CHAR(#BITS) || '. It should be ' ||
                                'between 1 and 32 inclusive (FMS$MN).');
        GOTO DONE;
        END;
     END;

ARG_B = FUNSTACK_OVLAY(FSTKPTR).B_VALUE;
  ARG_ZX = FUNSTACK_OVLAY(FSTKPTR).ZX_VALUE;

/* Sixteen bit mask operations are more efficient. Unused high */
  /* order bits must be zeroed out for arithmetic operations,    */
  /* overflow and carry_out detection.                           */

MASK = LEFTPAD(33-#BITS);
  SUBSTR(MASK,1,16)=^SUBSTR(MASK,1,16);
  SUBSTR(MASK,17,16)=^SUBSTR(MASK,17,16);
  SUBSTR(RES_B,1,16)=SUBSTR(MASK,1,16) & ^SUBSTR(ARG_B,1,16);
  SUBSTR(RES_B,17,16)=SUBSTR(MASK,17,16) & ^SUBSTR(ARG_B,17,16);
  SUBSTR(RES_ZX,1,16)=SUBSTR(MASK,1,16) & SUBSTR(ARG_ZX,1,16);
  SUBSTR(RES_ZX,17,16)=SUBSTR(MASK,17,16) & SUBSTR(ARG_ZX,17,16);
  SUBSTR(RES_B,1,16)=SUBSTR(RES_B,1,16) & ^SUBSTR(RES_ZX,1,16);
  SUBSTR(RES_B,17,16)=SUBSTR(RES_B,17,16) & ^SUBSTR(RES_ZX,17,16);

/* replace operand with result on stack */

FUNSTACK_OVLAY(FSTKPTR).B_VALUE = RES_B;
  FUNSTACK_OVLAY(FSTKPTR).ZX_VALUE = RES_ZX;
```

```
   RPNLOC = RPNLOC + 2; /* to next instruction */

GOTO NEXT_INST;

INSTRUCTION(@OR_REDUCE):;   /*** OR REDUCTION ***/
   %REPLACE @TRUE32 BY '00000000000000000000000000000001'B;

#BITS = FUN_EVAL_TABLE(RPNLOC + 1); /* number of bits in operand */

IF @DEBUG_FLAG THEN DO;
      IF (#BITS >32) | (#BITS <1) THEN DO;
         CALL OUT$MSG(@ERROR_PE,
                      'Number of bits in operand of OR REDUCTION ' ||
                      'is ' || CHAR(#BITS) || '. It should be ' ||
                      'between 1 and 32 inclusive (FMSSMN).');
         GOTO DONE;
         END;
      END;

ARG_B = FUNSTACK_OVLAY(FSTKPTR).B_VALUE;
   ARG_ZX = FUNSTACK_OVLAY(FSTKPTR).ZX_VALUE;
   /* Change Z's to X's */
   SUBSTR(ARG_B,1,16) = SUBSTR(ARG_B,1,16) & ^SUBSTR(ARG_ZX,1,16);
   SUBSTR(ARG_B,17,16) = SUBSTR(ARG_B,17,16) & ^SUBSTR(ARG_ZX,17,16);

IF (FIXED(ARG_B,15) ^= 0) THEN DO;
      RES_B = '00000001'B4;
      RES_ZX = '0'B;
      END;
   ELSE IF (FIXED(ARG_ZX,15) ^= 0) THEN DO;
      RES_B='0'B;
      RES_ZX = '00000001'B4;
      END;
   ELSE DO;
      RES_B='0'B;
      RES_ZX='0'B;
      END;

/* replace operand with result on stack */

FUNSTACK_OVLAY(FSTKPTR).B_VALUE = RES_B;
   FUNSTACK_OVLAY(FSTKPTR).ZX_VALUE = RES_ZX;
   RPNLOC = RPNLOC + 2; /* to next instruction */

GOTO NEXT_INST;

INSTRUCTION(@EXOR_REDUCE):;   /*** EX-OR REDUCTION ***/

DCL ODD#   BIT(1) ALIGNED;

#BITS = FUN_EVAL_TABLE(RPNLOC + 1); /* number of bits in operand */

IF @DEBUG_FLAG THEN DO;
      IF (#BITS >32) | (#BITS <1) THEN DO;
         CALL OUT$MSG(@ERROR_PE,
                      'Number of bits in operand of EX-OR REDUCTION '
                      || 'is ' || CHAR(#BITS) || '. It should be ' ||
                         'between 1 and 32 inclusive (FMSSMN).');
         GOTO DONE;
         END;
      END;

ARG_B = FUNSTACK_OVLAY(FSTKPTR).B_VALUE;
   ARG_ZX = FUNSTACK_OVLAY(FSTKPTR).ZX_VALUE;
   ARG_B = COPY('0'B, 32 - #BITS) || SUBSTR(ARG_B, 33 - #BITS, #BITS);
   ARG_ZX = COPY('0'B, 32 - #BITS) || SUBSTR(ARG_ZX, 33 - #BITS, #BITS);

RES_B = '0'B;
   RES_ZX = @TRUE32;
   IF (ARG_ZX = '00000000'B4) THEN DO; /* no zx values */
      RES_ZX = '00000000'B4;
```

```
      ODD# = @FALSE;
      DO I = (33 - #BITS) TO 32;
          IF SUBSTR(ARG_B,I,1) = '1'B THEN ODD# = ^ODD#;
          END;
      IF ODD# THEN RES_B = @TRUE32;
      END;

/* replace operand with result on stack */
   FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 2; /* to next instruction */

GOTO NEXT_INST;

INSTRUCTION(@AND_REDUCE):;   /*** AND REDUCTION ***/

DCL LMASK BIT(16) ALIGNED;
   DCL RMASK BIT(16) ALIGNED;

#BITS = FUN_EVAL_TABLE(RPNLOC + 1); /* number of bits in operand */

IF @DEBUG_FLAG THEN DO;
       IF (#BITS >32) | (#BITS <1) THEN DO;
           CALL OUTSMSG(@ERROR_PE,
                       'Number of bits in operand of AND REDUCTION ' ||
                       'is ' || CHAR(#BITS) || '. It should be ' ||
                       'between 1 and 32 inclusive (FMS$MN).');
           GOTO DONE;
           END;
       END;

ARG_B = FUNSTACK_OVLAY(FSTKPTR).B_VALUE;
   ARG_ZX = FUNSTACK_OVLAY(FSTKPTR).ZX_VALUE;
   /* Change Z's to X's */
   SUBSTR(ARG_B,1,16) = SUBSTR(ARG_B,1,16) & ^SUBSTR(ARG_ZX,1,16);
   SUBSTR(ARG_B,17,16) = SUBSTR(ARG_B,17,16) & ^SUBSTR(ARG_ZX,17,16);

LMASK = ^SUBSTR(LEFTPAD(33-#BITS),1,16);
   RMASK = ^SUBSTR(LEFTPAD(33-#BITS),17,16);
   IF ( FIXED(SUBSTR(ARG_B,1,16) & LMASK,15) = FIXED(LMASK,15) ) &
      ( FIXED(SUBSTR(ARG_B,17,16) & RMASK,15) = FIXED(RMASK,15) ) THEN DO;
       /* Since all Z's were changed to X's, there are guaranteed to be   */
       /* no X's in the argument (at this point)                          */
       RES_B='00000001'B4;
       RES_ZX='0'B;
       END;
   ELSE DO;
       /* We either have zeroes or X's in the non-one positions at this   */
       /* point. Change all X bits to 1's, and if we find that there are  */
       /* no longer any zeroes, then all bit positions are either 1 or X, */
       /* otherwise, there are zeroes in there.                           */
       SUBSTR(ARG_B,1,16) = SUBSTR(ARG_B,1,16) | SUBSTR(ARG_ZX,1,16);
       SUBSTR(ARG_B,17,16) = SUBSTR(ARG_B,17,16) | SUBSTR(ARG_ZX,17,16);
       IF ( FIXED(SUBSTR(ARG_B,1,16) & LMASK,15) = FIXED(LMASK,15) ) &
          ( FIXED(SUBSTR(ARG_B,17,16) & RMASK,15) = FIXED(RMASK,15) ) THEN DO;
           /* No zeroes. */
           RES_B='0'B;
           RES_ZX='00000001'B4;
           END;
       ELSE DO;
           RES_B='0'B;
           RES_ZX='0'B;
           END;
       END;
   /* replace operand with result on stack */

FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 2; /* to next instruction */
```

```
   GOTO NEXT_INST;

INSTRUCTION(@ADD):;    /*** ADD ***/

DCL ARG1      FIXED BIN(31);
   DCL ARG2      FIXED BIN(31);
   DCL SUM       FIXED BIN(31);
   DCL SGN1      BIT(1) ALIGNED;
   DCL SGN2      BIT(1) ALIGNED;
   DCL SGNSUM    BIT(1) ALIGNED;

#BITS = FUN_EVAL_TABLE(RPNLOC + 1); /* number of bits in operand */

IF @DEBUG_FLAG THEN DO;
      IF (#BITS >32) | (#BITS <1) THEN DO;
         CALL OUTSMSG(@ERROR_PE, 'Number of bits in operands of ADD ' ||
                                'is ' || CHAR(#BITS) || '. It should be ' ||
                                'between 1 and 32 inclusive (FMS$MN).');
         GOTO DONE;
         END;
      END;

/* Take care of simple case, with no X's first. */
   I=FSTKPTR-1;
   IF FUNSTACK(FSTKPTR).ZX_VALUE=0 & FUNSTACK(I).ZX_VALUE=0 & C_IN>=0 THEN DO;
      ARG1=FUNSTACK(FSTKPTR).B_VALUE;
      ARG2=FUNSTACK(I).B_VALUE;
      SUM=ARG1 + ARG2 + C_IN;
      FUNSTACK(I).B_VALUE=SUM;
      FUNSTACK(I).ZX_VALUE=0;
      FSTKPTR=I;
      /* The algorithm for setting carry out will differ, depending on */
      /* whether the carry out bit is directly available in the sum    */
      IF #BITS=32 THEN DO;
         IF (SUM<0) & (ARG1>0) & (ARG2>0) | (ARG1<0) & (ARG2<0) |
            ( (ARG1<0) & (ARG2>0) | (ARG1>0) & (ARG2<0) ) & (SUM>0)   THEN
            C_OUT=1;
         ELSE C_OUT=0;
         END;
      ELSE DO;
         IF SUBSTR(UNSPEC(SUM),32-#BITS,1) THEN C_OUT=1;
         ELSE C_OUT=0;
         END;
      /* Calculate the overflow. */
      SGN1=SUBSTR(UNSPEC(ARG1),33-#BITS,1);
      SGN2=SUBSTR(UNSPEC(ARG2),33-#BITS,1);
      SGNSUM=SUBSTR(UNSPEC(SUM),33-#BITS,1);
      IF (SGN1 & SGN2 & ^SGNSUM) | (^SGN1 & ^SGN2 & SGNSUM) THEN OVERFLOW=1;
      ELSE OVERFLOW=0;
      END;
   ELSE CALL FMS$ADD(#BITS);

RPNLOC = RPNLOC + 2; /* to next instruction */

GOTO NEXT_INST;

INSTRUCTION(@SUBTRACT):;  /*** SUBTRACT ***/

DCL C_IN_SAVE    FIXED BIN(15);

#BITS = FUN_EVAL_TABLE(RPNLOC + 1); /* number of bits in operand */

IF @DEBUG_FLAG THEN DO;
      IF (#BITS >32) | (#BITS <1) THEN DO;
         CALL OUTSMSG(@ERROR_PE, 'Number of bits in operands of SUBTRACT ' ||
                                'is ' || CHAR(#BITS) || '. It should be ' ||
                                'between 1 and 32 inclusive (FMS$MN).');
         GOTO DONE;
         END;
      END;

/* Take care of simple case, with no X's first. Note that carry in   */
   /* carry out and overflow are not handled yet.                       */
```

```
     I=FSTKPTR-1;
     IF FUNSTACK(FSTKPTR).ZX_VALUE=0 & FUNSTACK(I).ZX_VALUE=0 THEN DO;
         ARG1=FUNSTACK(FSTKPTR).B_VALUE;
         ARG2=FUNSTACK(I).B_VALUE;
         SUM=ARG2 - ARG1;
         FUNSTACK(I).B_VALUE=SUM;
         FUNSTACK(I).ZX_VALUE=0;
         FSTKPTR=I;
         END;
     ELSE DO;
         ARG1_B = FUNSTACK_OVLAY(FSTKPTR).B_VALUE;
         ARG1_ZX = FUNSTACK_OVLAY(FSTKPTR).ZX_VALUE;

ARG1_B = ^ARG1_B; /* complement ARG1_B */
         ARG1_B = COPY('0'B, 32 - #BITS) || SUBSTR(ARG1_B, 33 - #BITS, #BITS);
         ARG1_ZX = COPY('0'B, 32 - #BITS) || SUBSTR(ARG1_ZX, 33 - #BITS, #BITS);
         ARG1_B = ARG1_B & ^ARG1_ZX;   /* change Z's to X's */

/* values back on stack for ADD */
         FUNSTACK_OVLAY(FSTKPTR).B_VALUE = ARG1_B;
         FUNSTACK_OVLAY(FSTKPTR).ZX_VALUE = ARG1_ZX;

C_IN_SAVE = C_IN;
         C_IN = 1; /* carry in of 1 to get twos complement of ARG1 */
         CALL FMS$ADD(#BITS);
         C_IN = C_IN_SAVE;
         END;

RPNLOC = RPNLOC + 2; /* to next instruction */

GOTO NEXT_INST;

INSTRUCTION(@NEGATE):;    /*** NEGATE ***/

#BITS = FUN_EVAL_TABLE(RPNLOC + 1); /* number of bits in operand */

IF @DEBUG_FLAG THEN DO;
      IF (#BITS >32) | (#BITS <1) THEN DO;
          CALL OUT$MSG(@ERROR_PE, 'Number of bits in operands of NEGATE ' ||
                                  'is ' || CHAR(#BITS) || '. It should be ' ||
                                  'between 1 and 32 inclusive (FMS$MN).');
          GOTO DONE;
          END;
      END;

/* Take care of simple case, with no X's first. Note that carry in    */
  /* carry out and overflow are not handled yet.                        */
  I=FSTKPTR-1;
  IF FUNSTACK(FSTKPTR).ZX_VALUE=0 & FUNSTACK(I).ZX_VALUE=0 THEN DO;
      ARG1=FUNSTACK(FSTKPTR).B_VALUE;
      ARG2=FUNSTACK(I).B_VALUE;
      SUM=ARG2 - ARG1;
      FUNSTACK(I).B_VALUE=SUM;
      FUNSTACK(I).ZX_VALUE=0;
      FSTKPTR=I;
      END;
  ELSE DO;
      ARG_B = FUNSTACK_OVLAY(FSTKPTR).B_VALUE;
      ARG_ZX = FUNSTACK_OVLAY(FSTKPTR).ZX_VALUE;

ARG_B = ^ARG_B; /* complement ARG_B */
      ARG_B = COPY('0'B, 32 - #BITS) || SUBSTR(ARG_B, 33 - #BITS, #BITS);
      ARG_ZX = COPY('0'B, 32 - #BITS) || SUBSTR(ARG_ZX, 33 - #BITS, #BITS);
      ARG_B = ARG_B & ^ARG_ZX;   /* change Z's to X's */
      /*                                                                  */
      /*  set up stack to add 1 + ^ARG_B with ADD routine                 */
      /*                                                                  */
      FUNSTACK(FSTKPTR).B_VALUE = 0;
      FUNSTACK(FSTKPTR).ZX_VALUE = 0;
      FSTKPTR = FSTKPTR + 1;
      /* values back on stack for ADD */
```

```
          FUNSTACK_OVLAY(FSTKPTR).B_VALUE = ARG_B;
          FUNSTACK_OVLAY(FSTKPTR).ZX_VALUE = ARG_ZX;

C_IN_SAVE = C_IN;
          C_IN = 1;   /* carry in of 1 to get twos complement of ARG_B */
          CALL FMS$ADD(#BITS);
          C_IN = C_IN_SAVE;
          END;

RPNLOC = RPNLOC + 2;  /* to next instruction */

GOTO NEXT_INST;

INSTRUCTION(@DIVIDE)::
     CALL OUTSMSG(@ERROR,*UNIMPLEMENTED INSTRUCTION - @DIVIDE*);GOTO DONE;
     GOTO NEXT_INST;

INSTRUCTION(@MULTIPLY)::
     CALL OUTSMSG(@ERROR,*UNIMPLEMENTED INSTRUCTION - @MULTIPLY*);GOTO DONE;
     GOTO NEXT_INST;

INSTRUCTION(@SHIFT_LEFT)::   /*** SHIFT LEFT ***/

DCL NUM_B       FIXED BIN(31);
     DCL NUM_ZX      FIXED BIN(31);
     DCL ARG_B       BIT(32) ALIGNED;
     DCL ARG_ZX      BIT(32) ALIGNED;
     DCL RES_B       BIT(32) ALIGNED;
     DCL RES_ZX      BIT(32) ALIGNED;
     DCL SAVE_B      BIT(32) ALIGNED;
     DCL SAVE_ZX     BIT(32) ALIGNED;

#BITS = FUN_EVAL_TABLE(RPNLOC + 1);

IF @DEBUG_FLAG THEN DO;
        IF (#BITS >32) | (#BITS <1) THEN DO;
           CALL OUTSMSG(@ERROR_PE, *Number of bits in operand of SHIFT LEFT * ||
                                   *is * || CHAR(#BITS) || *. It should be * ||
                                   *between 1 and 32 inclusive (FMS$MN).*);
           GOTO DONE;
           END;
        END;

/* get fill bit */

B_BIT = SUBSTR(FUNSTACK_OVLAY(FSTKPTR).B_VALUE, 32, 1);
     ZX_BIT = SUBSTR(FUNSTACK_OVLAY(FSTKPTR).ZX_VALUE, 32, 1);

NUM_B = FUNSTACK(FSTKPTR - 1).B_VALUE;   /* get # of bits to be shifted */
     NUM_ZX = FUNSTACK(FSTKPTR - 1).ZX_VALUE;

ARG_B = FUNSTACK_OVLAY(FSTKPTR - 2).B_VALUE;  /* argument to be shifted */
     ARG_ZX = FUNSTACK_OVLAY(FSTKPTR - 2).ZX_VALUE;

/* set result in case of no shift */

RES_B = ARG_B;      /* results */
     RES_ZX = ARG_ZX;
     SAVE_B = *0*B;      /* shifted out bits */
     SAVE_ZX = *0*B;

IF (NUM_B < 0) | (NUM_ZX ^= 0) THEN DO;
        CALL OUTSMSG(@WARN, *Invalid operand on SHIFT_LEFT. No shift * ||
                             *performed.*);
        END;
     ELSE IF NUM_B ^= 0 THEN DO;  /* now we shift */
        RES_B = *0*B;
        RES_ZX = *0*B;
        IF NUM_B > #BITS THEN NUM_B = #BITS;

BIT_INDX1 = 33 - #BITS;   /* beginning of arg bits */
```

```
    BIT_INDX2 = 33 - #BITS + NUM_B;  /* beginning of bits to shift left */
    BIT_INDX3 = 33 - NUM_B;          /* beginning of shifted out bits in SAVE */

/* first save shifted bits */

SUBSTR(SAVE_B, BIT_INDX3, NUM_B) = SUBSTR(ARG_B, BIT_INDX1, NUM_B);
    SUBSTR(SAVE_ZX, BIT_INDX3, NUM_B) = SUBSTR(ARG_ZX, BIT_INDX1, NUM_B);

/* now shift and fill */

IF (NUM_B = #BITS) THEN DO;  /* all bits will get shifted out */
      SUBSTR(RES_B, BIT_INDX1, #BITS) = COPY(B_BIT, NUM_B);
      SUBSTR(RES_ZX, BIT_INDX1, #BITS) = COPY(ZX_BIT, NUM_B);
      END;
    ELSE DO;
      SUBSTR(RES_B, BIT_INDX1, #BITS) =
           SUBSTR(ARG_B, BIT_INDX2, #BITS - NUM_B) || COPY(B_BIT, NUM_B);
      SUBSTR(RES_ZX, BIT_INDX1, #BITS) =
           SUBSTR(ARG_ZX, BIT_INDX2, #BITS - NUM_B) || COPY(ZX_BIT, NUM_B);
      END;

END;

/* replace operands with result on stack */
  FSTKPTR = FSTKPTR - 1;

FUNSTACK_OVLAY(FSTKPTR - 1).B_VALUE = RES_B;   /* result */
  FUNSTACK_OVLAY(FSTKPTR - 1).ZX_VALUE = RES_ZX;

FUNSTACK_OVLAY(FSTKPTR).B_VALUE = SAVE_B;   /* shifted out bits */
  FUNSTACK_OVLAY(FSTKPTR).ZX_VALUE = SAVE_ZX;

RPNLOC = RPNLOC + 2; /* to next instruction */

GOTO NEXT_INST;

INSTRUCTION(@SHIFT_RIGHT):;   /*** SHIFT RIGHT ***/

DCL B_BIT       BIT(1) ALIGNED;
  DCL ZX_BIT      BIT(1) ALIGNED;
  DCL BIT_INDX1   FIXED BIN(15);
  DCL BIT_INDX2   FIXED BIN(15);
  DCL BIT_INDX3   FIXED BIN(15);

#BITS = FUN_EVAL_TABLE(RPNLOC + 1);

IF @DEBUG_FLAG THEN DO;
     IF (#BITS >32) | (#BITS <1) THEN DO;
        CALL OUT$MSG(@ERROR_PE, 'Number of bits in operand of SHIFT RIGHT ' ||
                      'is ' || CHAR(#BITS) || '. It should be ' ||
                      'between 1 and 32 inclusive (FM$$MN).');
        GOTO DONE;
        END;
     END;

B_BIT = SUBSTR(FUNSTACK_OVLAY(FSTKPTR).B_VALUE, 32, 1);
  ZX_BIT = SUBSTR(FUNSTACK_OVLAY(FSTKPTR).ZX_VALUE, 32, 1);

NUM_B = FUNSTACK(FSTKPTR - 1).B_VALUE;   /* get # of bits to be shifted */
  NUM_ZX= FUNSTACK(FSTKPTR - 1).ZX_VALUE;
    ARG_B = FUNSTACK_OVLAY(FSTKPTR - 2).B_VALUE;  /* argument to be shifted */
    ARG_ZX = FUNSTACK_OVLAY(FSTKPTR - 2).ZX_VALUE;

/* set result in case of no shift */

RES_B = ARG_B;       /* results */
  RES_ZX = ARG_ZX;
  SAVE_B = '0'B;       /* shifted out bits */
  SAVE_ZX = '0'B;

IF (NUM_B < 0) | (NUM_ZX ^= 0) THEN DO;
```

```
         CALL OUTSMSG(@WARN, 'Invalid operand on SHIFT_RIGHT. No shift ' ||
                      'performed.');
         END;
    ELSE IF NUM_B ^= 0 THEN DO;  /* now we shift */
       RES_B = '0'B;
       RES_ZX = '0'B;
       IF NUM_B > #BITS THEN NUM_B = #BITS;

BIT_INDX1 = 33 - #BITS;   /* starting bit in result */
       BIT_INDX2 = 33 - NUM_B;   /* starting bit of shifted out bits */

/* first save shifted bits */
       SUBSTR(SAVE_B, BIT_INDX2, NUM_B) = SUBSTR(ARG_B, BIT_INDX2, NUM_B);
       SUBSTR(SAVE_ZX, BIT_INDX2, NUM_B) = SUBSTR(ARG_ZX, BIT_INDX2, NUM_B);

/* now shift and fill */

IF (NUM_B = #BITS) THEN DO;  /* all bits will get shifted out */
          SUBSTR(RES_B, BIT_INDX1, #BITS) = COPY(B_BIT, NUM_B);
          SUBSTR(RES_ZX, BIT_INDX1, #BITS) = COPY(ZX_BIT, NUM_B);
          END;
       ELSE DO;
          SUBSTR(RES_B, BIT_INDX1, #BITS) = COPY(B_BIT, NUM_B) ||
                                   SUBSTR(ARG_B, BIT_INDX1, #BITS - NUM_B);
          SUBSTR(RES_ZX, BIT_INDX1, #BITS) = COPY(ZX_BIT, NUM_B) ||
                                   SUBSTR(ARG_ZX, BIT_INDX1, #BITS - NUM_B);
          END;
       END;

/* replace operands with result on stack */

FSTKPTR = FSTKPTR - 1;

FUNSTACK_OVLAY(FSTKPTR - 1).B_VALUE = RES_B;  /* result */
  FUNSTACK_OVLAY(FSTKPTR - 1).ZX_VALUE = RES_ZX;

FUNSTACK_OVLAY(FSTKPTR).B_VALUE = SAVE_B;  /* shifted out bits */
  FUNSTACK_OVLAY(FSTKPTR).ZX_VALUE = SAVE_ZX;

RPNLOC = RPNLOC + 2;  /* to next instruction */

GOTO NEXT_INST;

INSTRUCTION(@ROTATE_RIGHT):;    /*** ROTATE RIGHT ***/

#BITS = FUN_EVAL_TABLE(RPNLOC + 1);

IF @DEBUG_FLAG THEN DO;
     IF (#BITS >32) | (#BITS <1) THEN DO;
        CALL OUTSMSG(@ERROR_PE,
                     'Number of bits in operand of ROTATE RIGHT ' ||
                     'is ' || CHAR(#BITS) || '. It should be ' ||
                     'between 1 and 32 inclusive (FMS$MN).');
        GOTO DONE;
        END;
     END;

NUM_B = FUNSTACK(FSTKPTR).B_VALUE;  /* get # of bits to be shifted */
  NUM_ZX = FUNSTACK(FSTKPTR).ZX_VALUE;

ARG_B = FUNSTACK_OVLAY(FSTKPTR - 1).B_VALUE;
  ARG_ZX = FUNSTACK_OVLAY(FSTKPTR - 1).ZX_VALUE;
  /* set result in case of no rotation */

RES_B = ARG_B;
     RES_ZX = ARG_ZX;
     IF (NUM_B < 0) | (NUM_ZX ^= 0) THEN DO;
        CALL OUTSMSG(@WARN, 'Invalid operand on ROTATE_RIGHT. No shift ' ||
                      'performed.');
        END;
```

```
      ELSE DO;
         NUM_B = MOD(NUM_B, #BITS);
         IF NUM_B ^= 0 THEN DO;
            RES_B = '0'B;
            RES_ZX = '0'B;
            BIT_INDX1 = 33 - #BITS;
            BIT_INDX2 = 33 - NUM_B;
            SUBSTR(RES_B, BIT_INDX1, #BITS) = SUBSTR(ARG_B, BIT_INDX2, NUM_B) ||
                                    SUBSTR(ARG_B, BIT_INDX1, #BITS - NUM_B);
            SUBSTR(RES_ZX, BIT_INDX1, #BITS) = SUBSTR(ARG_ZX, BIT_INDX2, NUM_B) ||
                                    SUBSTR(ARG_ZX, BIT_INDX1, #BITS - NUM_B);
         END;
      END;

/* replace operands with result on stack */

FSTKPTR = FSTKPTR - 1;

FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 2; /* to next instruction */

GOTO NEXT_INST;

INSTRUCTION(@ROTATE_LEFT):;    /*** ROTATE LEFT ***/

#BITS = FUN_EVAL_TABLE(RPNLOC + 1);

IF @DEBUG_FLAG THEN DO;
         IF (#BITS >32) | (#BITS <1) THEN DO;
            CALL OUT$MSG(@ERROR_PE,
                        'Number of bits in operand of ROTATE RIGHT ' ||
                        'is ' || CHAR(#BITS) || '. It should be ' ||
                        'between 1 and 32 inclusive (FMSSMN).');
            GOTO DONE;
            END;
         END;

NUM_B = FUNSTACK(FSTKPTR).B_VALUE;  /* get # of bits to be shifted */
   NUM_ZX = FUNSTACK(FSTKPTR).ZX_VALUE;

ARG_B = FUNSTACK_OVLAY(FSTKPTR - 1).B_VALUE;
   ARG_ZX = FUNSTACK_OVLAY(FSTKPTR - 1).ZX_VALUE;

/* set result in case of no rotation */

RES_B = ARG_B;
   RES_ZX = ARG_ZX;
   IF (NUM_B < 0) | (NUM_ZX ^= 0) THEN DO;
      CALL OUT$MSG(@WARN, 'Invalid operand on ROTATE_LEFT. No shift ' ||
                        'performed.');
      END;
   ELSE DO;
      NUM_B = MOD(NUM_B, #BITS);
      IF NUM_B ^= 0 THEN DO;
         RES_B = '0'B;
         RES_ZX = '0'B;
         BIT_INDX1 = 33 - #BITS;
         BIT_INDX2 = 33 - #BITS + NUM_B;
         SUBSTR(RES_B, BIT_INDX1, #BITS) =
                        SUBSTR(ARG_B, BIT_INDX2, #BITS - NUM_B) ||
                                SUBSTR(ARG_B, BIT_INDX1, NUM_B);

SUBSTR(RES_ZX, BIT_INDX1, #BITS) =
                        SUBSTR(ARG_ZX, BIT_INDX2, #BITS - NUM_B) ||
                                SUBSTR(ARG_ZX, BIT_INDX1, NUM_B);
         END;
      END;

/* replace operands with result on stack */
```

```
   FSTKPTR = FSTKPTR - 1;

FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 2; /* to next instruction */

GOTO NEXT_INST;

INSTRUCTION(@TRUNCATE_RIGHT):;  /*** TRUNCATE RIGHT ***/

DCL NEW_WIDTH    FIXED BIN(15);

#BITS = FUN_EVAL_TABLE(RPNLOC + 1);

IF @DEBUG_FLAG THEN DO;
      IF (#BITS >32) | (#BITS <1) THEN DO;
         CALL OUT$MSG(@ERROR_PE,
                     'Number of bits in operand of TRUNCATE RIGHT ' ||
                     'is ' || CHAR(#BITS) || '. It should be ' ||
                     'between 1 and 32 inclusive (FMS$MN).');
         GOTO DONE;
         END;
      END;

NUM_B = FUNSTACK(FSTKPTR).B_VALUE;  /* get # of bits to be truncated */
                                        /* ignore zx values.            */
   RES_B = '0'B;
   RES_ZX = '0'B;
   IF NUM_B < #BITS THEN DO;
     NEW_WIDTH = #BITS - NUM_B;
     BIT_INDX1 = 33 - #BITS;
     BIT_INDX2 = 33 - NEW_WIDTH;
     SUBSTR(RES_B, BIT_INDX2, NEW_WIDTH) =
         SUBSTR(FUNSTACK(FSTKPTR - 1).B_VALUE, BIT_INDX1, NEW_WIDTH );
     SUBSTR(RES_ZX, BIT_INDX2, NEW_WIDTH) =
         SUBSTR(FUNSTACK(FSTKPTR - 1).ZX_VALUE, BIT_INDX1, NEW_WIDTH );
     END;

/* pop operands and push result on stack */

FSTKPTR = FSTKPTR - 1;

FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 2; /* to next instruction */

GOTO NEXT_INST;

INSTRUCTION(@TRUNCATE_LEFT):;  /*** TRUNCATE LEFT ***/

#BITS = FUN_EVAL_TABLE(RPNLOC + 1);

IF @DEBUG_FLAG THEN DO;
      IF (#BITS >32) | (#BITS <1) THEN DO;
         CALL OUT$MSG(@ERROR_PE,
                     'Number of bits in operand of TRUNCATE RIGHT ' ||
                     'is ' || CHAR(#BITS) || '. It should be ' ||
                     'between 1 and 32 inclusive (FMS$MN).');
         GOTO DONE;
         END;
      END;

NUM_B = FUNSTACK(FSTKPTR).B_VALUE;  /* get # of bits to be truncated */
                                        /* ignore zx values.            */
   RES_B = '0'B;
   RES_ZX = '0'B;
   IF NUM_B < #BITS THEN DO;
     NEW_WIDTH = #BITS - NUM_B;
     BIT_INDX2 = 33 - NEW_WIDTH;
     SUBSTR(RES_B, BIT_INDX2, NEW_WIDTH) =
```

```
        SUBSTR(FUNSTACK(FSTKPTR - 1).B_VALUE, BIT_INDX2, NEW_WIDTH );
    SUBSTR(RES_ZX, BIT_INDX2, NEW_WIDTH) =
        SUBSTR(FUNSTACK(FSTKPTR - 1).ZX_VALUE, BIT_INDX2, NEW_WIDTH );
    END;

/* pop operands and push result on stack */

FSTKPTR = FSTKPTR - 1;

FUNSTACK_OVLAY(FSTKPTR).B_VALUE = RES_B;
FUNSTACK_OVLAY(FSTKPTR).ZX_VALUE = RES_ZX;

RPNLOC = RPNLOC + 2; /* to next instruction */

GOTO NEXT_INST;

INSTRUCTION(@NOT_EQL):;   /*** NOT EQUAL ***/

DCL RESULT         FIXED BIN(31);

/* 1) Test for identically equal ... then false */
    /* 2) Test for any X's ... then X */
    /* 3) Else ... true */

/* Multiple accesses to these entries on the stack are more efficient  */
    /* with pointers.                                                      */
    TOSBASE=ADDR(FUNSTACK(FSTKPTR));
    NTOSBASE=ADDR(FUNSTACK(FSTKPTR-1));

IF TOSBASE->STACK_ITEM.B_VALUE = NTOSBASE->STACK_ITEM.B_VALUE &
       TOSBASE->STACK_ITEM.ZX_VALUE = NTOSBASE->STACK_ITEM.ZX_VALUE THEN DO;
        NTOSBASE->STACK_ITEM.B_VALUE=0;
        NTOSBASE->STACK_ITEM.ZX_VALUE=0;
        END;
    ELSE IF TOSBASE->STACK_ITEM.ZX_VALUE^=0 |
            NTOSBASE->STACK_ITEM.ZX_VALUE^=0 THEN DO;
        NTOSBASE->STACK_ITEM.B_VALUE=0;
        NTOSBASE->STACK_ITEM.ZX_VALUE=1;
        END;
    ELSE DO;
        NTOSBASE->STACK_ITEM.B_VALUE=1;
        NTOSBASE->STACK_ITEM.ZX_VALUE=0;
        END;

FSTKPTR=FSTKPTR-1;

RPNLOC = RPNLOC + 1; /* to next instruction */

GOTO NEXT_INST;

INSTRUCTION(@LESS_EQL):;   /*** LESS THAN OR EQUAL ***/

/* 1) Test for identically equal ... then true */
    /* 2) Test for any X's ... then X */
    /* 3) Test for integer less-than ... then true */

/* Multiple accesses to these entries on the stack are more efficient  */
    /* with pointers.                                                      */
    TOSBASE=ADDR(FUNSTACK(FSTKPTR));
    NTOSBASE=ADDR(FUNSTACK(FSTKPTR-1));

IF TOSBASE->STACK_ITEM.B_VALUE = NTOSBASE->STACK_ITEM.B_VALUE &
       TOSBASE->STACK_ITEM.ZX_VALUE = NTOSBASE->STACK_ITEM.ZX_VALUE THEN DO;
        NTOSBASE->STACK_ITEM.B_VALUE=1;
        NTOSBASE->STACK_ITEM.ZX_VALUE=0;
        END;
    ELSE IF TOSBASE->STACK_ITEM.ZX_VALUE^=0 |
            NTOSBASE->STACK_ITEM.ZX_VALUE^=0 THEN DO;
        NTOSBASE->STACK_ITEM.B_VALUE=0;
        NTOSBASE->STACK_ITEM.ZX_VALUE=1;
        END;
```

```
   ELSE IF NTOSBASE->STACK_ITEM.B_VALUE < TOSBASE->STACK_ITEM.B_VALUE THEN DO;
      NTOSBASE->STACK_ITEM.B_VALUE=1;
      NTOSBASE->STACK_ITEM.ZX_VALUE=0;
      END;
   ELSE DO;
      NTOSBASE->STACK_ITEM.B_VALUE=0;
      NTOSBASE->STACK_ITEM.ZX_VALUE=0;
      END;

FSTKPTR=FSTKPTR-1;

RPNLOC = RPNLOC + 1; /* to next instruction */

GOTO NEXT_INST;

INSTRUCTION(@GREAT_EQL);;     /*** GREATER THAN OR EQUAL ***/

DCL REL_FLAG     BIT(1) ALIGNED;

/* 1) Test for identically equal  ... then true */
   /* 2) Test for any X's ... then X */
   /* 3) Test for integer greater-than ... then true */

/* Multiple accesses to these entries on the stack are more efficient    */
   /* with pointers.                                                        */
   TOSBASE=ADDR(FUNSTACK(FSTKPTR));
   NTOSBASE=ADDR(FUNSTACK(FSTKPTR-1));

IF TOSBASE->STACK_ITEM.B_VALUE = NTOSBASE->STACK_ITEM.B_VALUE &
      TOSBASE->STACK_ITEM.ZX_VALUE = NTOSBASE->STACK_ITEM.ZX_VALUE THEN DO;
      NTOSBASE->STACK_ITEM.B_VALUE=1;
      NTOSBASE->STACK_ITEM.ZX_VALUE=0;
      END;
   ELSE IF TOSBASE->STACK_ITEM.ZX_VALUE^=0 |
      NTOSBASE->STACK_ITEM.ZX_VALUE^=0 THEN DO;
      NTOSBASE->STACK_ITEM.B_VALUE=0;
      NTOSBASE->STACK_ITEM.ZX_VALUE=1;
      END;
   ELSE IF NTOSBASE->STACK_ITEM.B_VALUE > TOSBASE->STACK_ITEM.B_VALUE THEN DO;
      NTOSBASE->STACK_ITEM.B_VALUE=1;
      NTOSBASE->STACK_ITEM.ZX_VALUE=0;
      END;
   ELSE DO;
      NTOSBASE->STACK_ITEM.B_VALUE=0;
      NTOSBASE->STACK_ITEM.ZX_VALUE=0;
      END;

FSTKPTR=FSTKPTR-1;

RPNLOC = RPNLOC + 1; /* to next instruction */

GOTO NEXT_INST;

INSTRUCTION(@EQL);;    /*** EQUAL ***/

/* 1) Test for identically equal  ... then true */
   /* 2) Test for any X's ... then X */
   /* 3) Else ... false */

/* Multiple accesses to these entries on the stack are more efficient    */
   /* with pointers.                                                        */
   TOSBASE=ADDR(FUNSTACK(FSTKPTR));
   NTOSBASE=ADDR(FUNSTACK(FSTKPTR-1));

IF TOSBASE->STACK_ITEM.B_VALUE = NTOSBASE->STACK_ITEM.B_VALUE &
      TOSBASE->STACK_ITEM.ZX_VALUE = NTOSBASE->STACK_ITEM.ZX_VALUE THEN DO;
      NTOSBASE->STACK_ITEM.B_VALUE=1;
      NTOSBASE->STACK_ITEM.ZX_VALUE=0;
      END;
   ELSE IF TOSBASE->STACK_ITEM.ZX_VALUE^=0 |
      NTOSBASE->STACK_ITEM.ZX_VALUE^=0 THEN DO;
      NTOSBASE->STACK_ITEM.B_VALUE=0;
```

```
         NTOSBASE->STACK_ITEM.ZX_VALUE=1;
         END;
      ELSE DO;
         NTOSBASE->STACK_ITEM.B_VALUE=0;
         NTOSBASE->STACK_ITEM.ZX_VALUE=0;
         END;

FSTKPTR=FSTKPTR-1;

RPNLOC = RPNLOC + 1; /* to next instruction */

GOTO NEXT_INST;

INSTRUCTION(&LESS):;    /*** LESS THAN ***/

/* 1) Test for identically equal ... then false */
   /* 2) Test for any X's ... then X */
   /* 3) Else if less than, then true */

/* Multiple accesses to these entries on the stack are more efficient  */
   /* with pointers.                                                      */
   TOSBASE=ADDR(FUNSTACK(FSTKPTR));
   NTOSBASE=ADDR(FUNSTACK(FSTKPTR-1));

IF TOSBASE->STACK_ITEM.B_VALUE = NTOSBASE->STACK_ITEM.B_VALUE &
      TOSBASE->STACK_ITEM.ZX_VALUE = NTOSBASE->STACK_ITEM.ZX_VALUE THEN DO;
      NTOSBASE->STACK_ITEM.B_VALUE=0;
      NTOSBASE->STACK_ITEM.ZX_VALUE=0;
      END;
   ELSE IF TOSBASE->STACK_ITEM.ZX_VALUE^=0 |
      NTOSBASE->STACK_ITEM.ZX_VALUE^=0 THEN DO;
      NTOSBASE->STACK_ITEM.B_VALUE=0;
      NTOSBASE->STACK_ITEM.ZX_VALUE=1;
      END;
   ELSE IF NTOSBASE->STACK_ITEM.B_VALUE < TOSBASE->STACK_ITEM.B_VALUE THEN DO;
      NTOSBASE->STACK_ITEM.B_VALUE=1;
      NTOSBASE->STACK_ITEM.ZX_VALUE=0;
      END;
   ELSE DO;
      NTOSBASE->STACK_ITEM.B_VALUE=0;
      NTOSBASE->STACK_ITEM.ZX_VALUE=0;
      END;

FSTKPTR=FSTKPTR-1;

RPNLOC = RPNLOC + 1; /* to next instruction */
   GOTO NEXT_INST;

INSTRUCTION(&GREATER):;    /*** GREATER THAN ***/

/* 1) Test for identically equal ... then false */
   /* 2) Test for any X's ... then X */
   /* 3) Else if greater than, then true */

/* Multiple accesses to these entries on the stack are more efficient  */
   /* with pointers.                                                      */
   TOSBASE=ADDR(FUNSTACK(FSTKPTR));
   NTOSBASE=ADDR(FUNSTACK(FSTKPTR-1));

IF TOSBASE->STACK_ITEM.B_VALUE = NTOSBASE->STACK_ITEM.B_VALUE &
      TOSBASE->STACK_ITEM.ZX_VALUE = NTOSBASE->STACK_ITEM.ZX_VALUE THEN DO;
      NTOSBASE->STACK_ITEM.B_VALUE=0;
      NTOSBASE->STACK_ITEM.ZX_VALUE=0;
      END;
   ELSE IF TOSBASE->STACK_ITEM.ZX_VALUE^=0 |
      NTOSBASE->STACK_ITEM.ZX_VALUE^=0 THEN DO;
      NTOSBASE->STACK_ITEM.B_VALUE=0;
      NTOSBASE->STACK_ITEM.ZX_VALUE=1;
      END;
   ELSE IF NTOSBASE->STACK_ITEM.B_VALUE > TOSBASE->STACK_ITEM.B_VALUE THEN DO;
      NTOSBASE->STACK_ITEM.B_VALUE=1;
      NTOSBASE->STACK_ITEM.ZX_VALUE=0;
      END;
```

```
   ELSE DO;
      NTOSBASE->STACK_ITEM.B_VALUE=0;
      NTOSBASE->STACK_ITEM.ZX_VALUE=0;
      END;

FSTKPTR=FSTKPTR-1;

RPNLOC = RPNLOC + 1; /* to next instruction */

GOTO NEXT_INST;
INSTRUCTION(&CEDGE_DET_MINUS):;   /*** CLOCK EDGE DETECT MINUS ***/

DCL STOR_INDEX  FIXED BIN(15);

STOR_INDEX = FUN_EVAL_TABLE(RPNLOC + 1);
   STORAGEBASE = FUNCTION.STORAGE_PTR->STORAGE_PTR(STOR_INDEX);

RESULT=0;
   IF (CLOCK_STR.STEP#_LAST_CHNG=TIMSTEP) THEN
      IF (OSCCNT=0) THEN
         IF CLOCK_STR.CURRENT_VALUE=@0 THEN RESULT=1;

FSTKPTR = FSTKPTR + 1;
   FUNSTACK(FSTKPTR).B_VALUE = RESULT;
   FUNSTACK(FSTKPTR).ZX_VALUE = 0;

RPNLOC = RPNLOC + 2;

GOTO NEXT_INST;

INSTRUCTION(@CEDGE_DET_PLUS):;   /*** CLOCK EDGE DETECT PLUS ***/

STOR_INDEX = FUN_EVAL_TABLE(RPNLOC + 1);
   STORAGEBASE = FUNCTION.STORAGE_PTR->STORAGE_PTR(STOR_INDEX);

RESULT=0;
   IF (CLOCK_STR.STEP#_LAST_CHNG=TIMSTEP) THEN
      IF (OSCCNT=0) THEN
         IF CLOCK_STR.CURRENT_VALUE=@1 THEN RESULT=1;

FSTKPTR = FSTKPTR + 1;
   FUNSTACK(FSTKPTR).B_VALUE = RESULT;
   FUNSTACK(FSTKPTR).ZX_VALUE = 0;

RPNLOC = RPNLOC + 2;

GOTO NEXT_INST;
INSTRUCTION(@CEDGE_DET):;   /*** CLOCK EDGE DETECT ANY TRANSITION ***/

STOR_INDEX = FUN_EVAL_TABLE(RPNLOC + 1);
   STORAGEBASE = FUNCTION.STORAGE_PTR->STORAGE_PTR(STOR_INDEX);

RESULT=0;
   IF (CLOCK_STR.STEP#_LAST_CHNG=TIMSTEP) THEN
      IF (OSCCNT=0) THEN RESULT=1;

FSTKPTR = FSTKPTR + 1;
   FUNSTACK(FSTKPTR).B_VALUE = RESULT;
   FUNSTACK(FSTKPTR).ZX_VALUE = 0;

RPNLOC = RPNLOC + 2;

GOTO NEXT_INST;

INSTRUCTION(@PEDGE_DET_MINUS):;   /*** PIN EDGE DETECT MINUS ***/

DCL IO_SLOT#   FIXED BIN(15);

IO_SLOT# = FUN_EVAL_TABLE(RPNLOC + 1);
   ITEMBASE = ADDR(FUNCTION.IO(IO_SLOT#));
   RPNLOC = RPNLOC + 2;
   FSTKPTR = FSTKPTR + 1;
```

```
        GOTO CHANGE_MINUS(CLOCK_ITEM.CHANGE_CODE);

CHANGE_MINUS(@1_0)::
                FUNSTACK(FSTKPTR).B_VALUE = 1;
                FUNSTACK(FSTKPTR).ZX_VALUE = 0;
                GOTO NEXT_INST;
            CHANGE_MINUS(@0_1)::
            CHANGE_MINUS(@0_X)::
            CHANGE_MINUS(@0_Z)::
            CHANGE_MINUS(@1_1)::
            CHANGE_MINUS(@X_1)::
            CHANGE_MINUS(@Z_1)::

CHANGE_MINUS(@0_0)::
                FUNSTACK(FSTKPTR).B_VALUE = 0;
                FUNSTACK(FSTKPTR).ZX_VALUE = 0;
                GOTO NEXT_INST;
            CHANGE_MINUS(@1_X)::
            CHANGE_MINUS(@1_Z)::
            CHANGE_MINUS(@X_0)::
            CHANGE_MINUS(@X_X)::
            CHANGE_MINUS(@X_Z)::
            CHANGE_MINUS(@Z_0)::
            CHANGE_MINUS(@Z_X)::
            CHANGE_MINUS(@Z_Z)::
                FUNSTACK(FSTKPTR).B_VALUE = 0;
                FUNSTACK(FSTKPTR).ZX_VALUE = 1;
                GOTO NEXT_INST;

GOTO NEXT_INST;

INSTRUCTION(@PEDGE_DET_PLUS)::    /*** PIN EDGE DETECT PLUS ***/

IO_SLOT# = FUN_EVAL_TABLE(RPVLOC + 1);
    ITEMBASE = ADDR(FUNCTION.ID(IO_SLOT#));
    RPNLOC = RPNLOC + 2;
    FSTKPTR = FSTKPTR + 1;

GOTO CHANGE_PLUS(CLOCK_ITEM.CHANGE_CODE);

CHANGE_PLUS(@0_1)::
            FUNSTACK(FSTKPTR).B_VALUE = 1;
            FUNSTACK(FSTKPTR).ZX_VALUE = 0;
            GOTO NEXT_INST;
        CHANGE_PLUS(@0_0)::
        CHANGE_PLUS(@X_0)::
        CHANGE_PLUS(@Z_0)::
        CHANGE_PLUS(@1_0)::
        CHANGE_PLUS(@1_1)::
        CHANGE_PLUS(@1_X)::
        CHANGE_PLUS(@1_Z)::
            FUNSTACK(FSTKPTR).B_VALUE = 0;
            FUNSTACK(FSTKPTR).ZX_VALUE = 0;
            GOTO NEXT_INST;
        CHANGE_PLUS(@0_X)::
        CHANGE_PLUS(@0_Z)::
        CHANGE_PLUS(@X_1)::
        CHANGE_PLUS(@X_X)::
        CHANGE_PLUS(@X_Z)::
        CHANGE_PLUS(@Z_1)::
        CHANGE_PLUS(@Z_X)::
        CHANGE_PLUS(@Z_Z)::
            FUNSTACK(FSTKPTR).B_VALUE = 0;
            FUNSTACK(FSTKPTR).ZX_VALUE = 1;
            GOTO NEXT_INST;

GOTO NEXT_INST;

INSTRUCTION(@PEDGE_DET)::    /*** PIN EDGE DETECT ANY TRANSITION ***/

IO_SLOT# = FUN_EVAL_TABLE(RPVLOC + 1);
    ITEMBASE = ADDR(FUNCTION.ID(IO_SLOT#));
```

```
  RPNLOC = RPNLOC + 2;
  FSTKPTR = FSTKPTR + 1;

GOTO CHANGE_ANY(CLOCK_ITEM.CHANGE_CODE);

CHANGE_ANY(@0_1)::
    CHANGE_ANY(@1_0)::
       FUNSTACK(FSTKPTR).B_VALUE = 1;
       FUNSTACK(FSTKPTR).ZX_VALUE = 0;
       GOTO NEXT_INST;
    CHANGE_ANY(@0_0)::
    CHANGE_ANY(@1_1)::
    CHANGE_ANY(@Z_Z)::
    CHANGE_ANY(@X_X)::
       FUNSTACK(FSTKPTR).B_VALUE = 0;
       FUNSTACK(FSTKPTR).ZX_VALUE = 0;
       GOTO NEXT_INST;
    CHANGE_ANY(@X_0)::
    CHANGE_ANY(@Z_0)::
    CHANGE_ANY(@1_X)::
    CHANGE_ANY(@1_Z)::
    CHANGE_ANY(@0_X)::
    CHANGE_ANY(@0_Z)::
    CHANGE_ANY(@X_1)::
    CHANGE_ANY(@X_Z)::
    CHANGE_ANY(@Z_1)::
    CHANGE_ANY(@Z_X)::
       FUNSTACK(FSTKPTR).B_VALUE = 0;
       FUNSTACK(FSTKPTR).ZX_VALUE = 1;
       GOTO NEXT_INST;

GOTO NEXT_INST;

INSTRUCTION(@LOGICAL)::   /*** LOGICAL ***/
  RPNLOC=RPNLOC+1;
  GOTO NEXT_INST;

INSTRUCTION(@CONVERT_BIT)::   /*** CONVERT_BIT ***/

DCL MSB_B       BIT(1) ALIGNED;
  DCL MSB_ZX      BIT(1) ALIGNED;

#BITS1 = FUN_EVAL_TABLE(RPNLOC + 1); /* number of bits in operand */
  #BITS2 = FUN_EVAL_TABLE(RPNLOC + 2); /* number of bits to extend */

#BITS = #BITS1 + #BITS2;
  IF @DEBUG_FLAG THEN DO;
     IF (#BITS >32) | (#BITS <1) THEN DO;
        CALL OUTSMSG(@ERROR_PE, 'Number of bits in result of @CONVERT_BIT ' ||
                     'is ' || CHAR(#BITS) || '. It should be ' ||
                     'between 1 and 32 inclusive (FMSSMV).');
        GOTO DONE;
        END;
     END;
/* The algorithm is as follows:                                          */
/*    if the msb of the operand is 1                                     */
/*       shift left only far enough to leave "# bits to extend" zeroes   */
/*             in the leftmost bit positions.                            */
/*       OR 1s into these bit positions                                  */
/*       shift right again                                               */

ARG_B = FUNSTACK_OVLAY(FSTKPTR).B_VALUE;
  ARG_ZX = FUNSTACK_OVLAY(FSTKPTR).ZX_VALUE;

IF SUBSTR(ARG_B,33-#BITS1,1) THEN DO;
     ARG_B = FMS$SHFT(ARG_B,32-#BITS);
     SUBSTR(ARG_B,1,16)=SUBSTR(ARG_B,1,16) | SUBSTR(LEFTPAD(#BITS2),1,16);
     SUBSTR(ARG_B,17,16)=SUBSTR(ARG_B,17,16) | SUBSTR(LEFTPAD(#BITS2),17,16);
     ARG_B=FMS$SHFT(ARG_B,#BITS-32);
     FUNSTACK_OVLAY(FSTKPTR).B_VALUE = ARG_B;
     END;
```

```
IF SUBSTR(ARG_ZX,33-#BITS1,1) THEN DO;
    ARG_ZX = FMSSSHFT(ARG_ZX,32-#BITS);
    SUBSTR(ARG_ZX,1,16)=SUBSTR(ARG_ZX,1,16) | SUBSTR(LEFTPAD(#BITS2),1,16);
    SUBSTR(ARG_ZX,17,16)=SUBSTR(ARG_ZX,17,16) |
                        SUBSTR(LEFTPAD(#BITS2),17,16);
    ARG_ZX=FMSSSHFT(ARG_ZX,#BITS-32);
    FUNSTACK_OVLAY(FSTKPTR).ZX_VALUE = ARG_ZX;
    END;

RPNLOC = RPNLOC + 3;

GOTO NEXT_INST;

INSTRUCTION(&CONVERT_FIRST_WORD):;
    CALL OUTSMSG(@ERROR,'UNIMPLEMENTED INSTRUCTION - &CONVERT_FIRST_WORD');
    GOTO DONE;
    GOTO NEXT_INST;

INSTRUCTION(@NEXT_BLK):;
    /* Add NEXT Block to end of list. */
    ALLOC FNXTBLK SET(FNXTBLKBASE);
    FNXTBLK.NEXT_PTR=FNXTBTOP;
    FNXTBTOP=FNXTBLKBASE;

/* Get first executable instruction for NEXT level code. */
    FNXTBLK.RPNLOC=RPNLOC+2;

/* Branch around NEXT Block. NOTE: @NEXT instruction generates a      */
    /* branch to it's associated @END_NEXT, thus RPNLOC must be bumped    */
    /* to get around this instruction.                                    */
    RPNLOC=FUN_EVAL_TABLE(RPNLOC+1);
    IF @DEBUG_FLAG THEN DO;
        IF NEXT_JUMP_ERR(RPNLOC) THEN GOTO DONE;
        END;
    RPNLOC=RPNLOC+1;
    GOTO NEXT_INST;

INSTRUCTION(@END_NEXT):;

/* Get the branch adrs from the beginning of the NEXT list. Free      */
    /* storage.                                                           */
    IF CURRENT_NEXT_BLOCK_PTR=NULL THEN DO;
        CALL END_NEXT_LEVEL_PROCESSING;
        /* If there are no more NEXT blocks to exec at this level, we're done */
        IF FNXTBTOP=NULL THEN GOTO DONE;
        ELSE DO;
            CURRENT_NEXT_BLOCK_PTR = FNXTBTOP;
            FNXTBTOP = NULL;
            RPNLOC=CURRENT_NEXT_BLOCK_PTR->FNXTBLK.RPNLOC;
            P=CURRENT_NEXT_BLOCK_PTR->FNXTBLK.NEXT_PTR;
            FREE CURRENT_NEXT_BLOCK_PTR->FNXTBLK;
            CURRENT_NEXT_BLOCK_PTR=P;
            END;
        GOTO NEXT_INST;
        END;
    ELSE DO;
        /* Execute next NEXT block at this level. */
        RPNLOC=CURRENT_NEXT_BLOCK_PTR->FNXTBLK.RPNLOC;
        P=CURRENT_NEXT_BLOCK_PTR->FNXTBLK.NEXT_PTR;
        FREE CURRENT_NEXT_BLOCK_PTR->FNXTBLK;
        CURRENT_NEXT_BLOCK_PTR=P;
        END;

GOTO NEXT_INST;

INSTRUCTION(@JUMP):;
    RPNLOC=FUN_EVAL_TABLE(RPNLOC+1);
    GOTO NEXT_INST;

INSTRUCTION(&JUMP_REL):;     /*** JUMP RELATIVE ***/
```

```
DCL #ENTRIES    FIXED BIN(15);
DCL OFFSET      FIXED BIN(15);

#ENTRIES = FUN_EVAL_TABLE(RPNLOC + 1);
OFFSET = FUNSTACK(FSTKPTR).B_VALUE;

IF (OFFSET >= #ENTRIES) | (OFFSET < 0) THEN
    RPNLOC = RPNLOC + #ENTRIES + 2;
ELSE
    RPNLOC = FUN_EVAL_TABLE(RPNLOC + 2 + OFFSET);

FSTKPTR=FSTKPTR-1;

GOTO NEXT_INST;

INSTRUCTION(@JUMP_X_EXP):;
  IF FUNSTACK(FSTKPTR).ZX_VALUE^=0 THEN
      RPNLOC=FUN_EVAL_TABLE(RPNLOC+1);
  ELSE RPNLOC=RPNLOC+2;
  GOTO NEXT_INST;

INSTRUCTION(@JUMP_NOT_FALSE):;  /*** JUMP IF NOT FALSE ***/

IF FUNSTACK(FSTKPTR).B_VALUE ^= 0 | FUNSTACK(FSTKPTR).ZX_VALUE^=0 THEN
      RPNLOC = FUN_EVAL_TABLE(RPNLOC + 1);
  ELSE RPNLOC = RPNLOC + 2;

GOTO NEXT_INST;

INSTRUCTION(@JUMP_NOT_TRUE):;  /*** JUMP IF NOT TRUE ***/

DCL MASK16 BIT(16) ALIGNED;

/* Turn 2*x into X's and inhibit jump only if any B_VALUE bits set. */

ARG1_B = FUNSTACK_OVLAY(FSTKPTR).B_VALUE;
  ARG1_ZX = FUNSTACK_OVLAY(FSTKPTR).ZX_VALUE;
  MASK16 = ^SUBSTR(ARG1_ZX,1,15) &
           SUBSTR(ARG1_B,1,16)   |
           ^SUBSTR(ARG1_ZX,17,16) &
           SUBSTR(ARG1_B,17,15);
  IF FIXED(MASK16,15)^=0 THEN RPNLOC = RPNLOC + 2;
  ELSE RPNLOC = FUN_EVAL_TABLE(RPNLOC + 1);

GOTO NEXT_INST;

INSTRUCTION(@CONCAT):;  /*** CONCATENATE ***/

DCL #BITS1   FIXED BIN(15);
  DCL #BITS2   FIXED BIN(15);

#BITS1 = FUN_EVAL_TABLE(RPNLOC + 1); /* number of bits in operand */
  #BITS2 = FUN_EVAL_TABLE(RPNLOC + 2); /* number of bits in operand */

#BITS = #BITS1 + #BITS2;
  IF @DEBUG_FLAG THEN DO;
      IF (#BITS >32) | (#BITS <1) THEN DO;
          CALL OUTSMSG(@ERROR_PE,
                  'Number of bits in result of CONCATENATION ' ||
                  'is ' || CHAR(#BITS) || '. It should be ' ||
                  'between 1 and 32 inclusive (FMSSMN).');
      GOTO DONE;
      END;
  END;

/*    ARG2 || ARG1. Shift left arg2 by length of arg1, then   */
  /*    OR arg2 with arg1                                        */
  ARG1_B = FUNSTACK_OVLAY(FSTKPTR).B_VALUE;
  ARG1_ZX = FUNSTACK_OVLAY(FSTKPTR).ZX_VALUE;
  ARG2_B = FUNSTACK_OVLAY(FSTKPTR - 1).B_VALUE;
  ARG2_ZX = FUNSTACK_OVLAY(FSTKPTR - 1).ZX_VALUE;
```

```
ARG2_B = FMS$SHFT(ARG2_B,#BITS1);
ARG2_ZX = FMS$SHFT(ARG2_ZX,#BITS1);

SUBSTR(RES_B,1,16)   = SUBSTR(ARG1_B,1,16)   | SUBSTR(ARG2_B,1,16);
SUBSTR(RES_B,17,16)  = SUBSTR(ARG1_B,17,16)  | SUBSTR(ARG2_B,17,16);
SUBSTR(RES_ZX,1,16)  = SUBSTR(ARG1_ZX,1,16)  | SUBSTR(ARG2_ZX,1,16);
SUBSTR(RES_ZX,17,16) = SUBSTR(ARG1_ZX,17,16) | SUBSTR(ARG2_ZX,17,16);

/* replace operands with result on stack */

FSTKPTR = FSTKPTR - 1;

FUNSTACK_OVLAY(FSTKPTR).B_VALUE = RES_B;
FUNSTACK_OVLAY(FSTKPTR).ZX_VALUE = RES_ZX;

RPNLOC = RPNLOC + 3; /* to next instruction */

GOTO NEXT_INST;

INSTRUCTION(&EXTEND);;
   CALL OUT$MSG(@ERROR,'UNIMPLEMENTED INSTRUCTION - @EXTEND');GOTO DONE;
   GOTO NEXT_INST;

INSTRUCTION(&POP);;  /*** POP ***/

FSTKPTR = FSTKPTR - 1;
   RPNLOC = RPNLOC + 1;
   GOTO NEXT_INST;

INSTRUCTION(&SWAP);;  /*** SWAP ***/

DCL 1 SWAP_TEMP,
         2 B_VALUE     FIXED BIN(31),
         2 ZX_VALUE    FIXED BIN(31),
         2 FL_PTR      POINTER OPTIONS(SHORT);

DCL SWAP_INDEX      FIXED BIN(15);

/* note: swap 0 swaps top of stack with itself           */
   SWAP_INDEX = FSTKPTR - FUN_EVAL_TABLE(RPNLOC + 1);
   SWAP_TEMP = FUNSTACK(SWAP_INDEX);
   FUNSTACK(SWAP_INDEX) = FUNSTACK(FSTKPTR);
   FUNSTACK(FSTKPTR) = SWAP_TEMP;

RPNLOC = RPNLOC + 2;  /* to next instruction */

GOTO NEXT_INST;

INSTRUCTION(&FLIP);;

#BITS = FUN_EVAL_TABLE(RPNLOC + 1); /* number of bits in operand */

ARG_B = FUNSTACK_OVLAY(FSTKPTR).B_VALUE;  /* get bits to be flipped */
   ARG_ZX = FUNSTACK_OVLAY(FSTKPTR).ZX_VALUE;

CALL FMS$FL(ARG_B, RES_B, #BITS);
   CALL FMS$FL(ARG_ZX, RES_ZX, #BITS);

FUNSTACK_OVLAY(FSTKPTR).B_VALUE = RES_B;
   FUNSTACK_OVLAY(FSTKPTR).ZX_VALUE = RES_ZX;

RPNLOC = RPNLOC + 2;

GOTO NEXT_INST;
INSTRUCTION(&MID_FLIP);;

DCL POS    FIXED BIN(15);

POS  = FUN_EVAL_TABLE(RPNLOC + 1);
   #BITS = FUN_EVAL_TABLE(RPNLOC + 2); /* number of bits in operand */
   BIT_INDX1 = 33 - #BITS;
```

```
    SUBSTR(ARG_B, BIT_INDX1, #BITS) =      /* get bits to be flipped */
            SUBSTR(FUNSTACK_OVLAY(FSTKPTR).B_VALUE, POS, #BITS);
    SUBSTR(ARG_ZX, BIT_INDX1, #BITS) =
            SUBSTR(FUNSTACK_OVLAY(FSTKPTR).ZX_VALUE, POS, #BITS);

CALL FMS$FL(ARG_B, RES_B, #BITS);
    CALL FMS$FL(ARG_ZX, RES_ZX, #BITS);

SUBSTR(FUNSTACK_OVLAY(FSTKPTR).B_VALUE, POS, #BITS) =
                                SUBSTR(RES_B, BIT_INDX1, #BITS);
    SUBSTR(FUNSTACK_OVLAY(FSTKPTR).ZX_VALUE, POS, #BITS) =
                                SUBSTR(RES_ZX, BIT_INDX1, #BITS);

RPNLOC = RPNLOC + 3;

GOTO NEXT_INST;

INSTRUCTION(@CLR_CARRY_IN):;
    C_IN=0;
    RPNLOC=RPNLOC+1;
    GOTO NEXT_INST;

INSTRUCTION(@CLR_CARRY_OUT):;
    C_OUT=0;
    RPNLOC=RPNLOC+1;
    GOTO NEXT_INST;

INSTRUCTION(@CLR_OVF):;
    OVERFLOW=0;
    RPNLOC=RPNLOC+1;
    GOTO NEXT_INST;

INSTRUCTION(@CLR_STATUS):;
    C_IN=0;
    C_OUT=0;
    OVERFLOW=0;
    RPNLOC=RPNLOC+1;
    GOTO NEXT_INST;

INSTRUCTION(@SET_CARRY_IN):;
    C_IN=1;
    RPNLOC=RPNLOC+1;
    GOTO NEXT_INST;

INSTRUCTION(@SET_CARRY_OUT):;
    C_OUT=1;
    RPNLOC=RPNLOC+1;
    GOTO NEXT_INST;

INSTRUCTION(@EXCHANGE_CARRY):;
    I=C_IN;
    C_IN=C_OUT;
    C_OUT=I;
    RPNLOC=RPNLOC+1;
    GOTO NEXT_INST;

INSTRUCTION(@LOAD_CLOCK):;     /*** LOAD CLOCK ***/

STOR_INDEX = FUN_EVAL_TABLE(RPNLOC + 1);
    STORAGEBASE = FUNCTION.STORAGE_PTR->STORAGE_PTR(STOR_INDEX);

RESULT = CLOCK_STR.CURRENT_VALUE;

FSTKPTR = FSTKPTR + 1;  /* push constant onto stack */

FUNSTACK(FSTKPTR).B_VALUE = RESULT;
    FUNSTACK(FSTKPTR).ZX_VALUE = 0;
    RPNLOC = RPNLOC + 2;

GOTO NEXT_INST;
```

```
INSTRUCTION(@LOAD_CONSTANT):;   /*** LOAD CONSTANT ***/

FSTKPTR = FSTKPTR + 1;  /* push constant onto stack */

TOSBASE=ADDR(FUNSTACK(FSTKPTR));
  TOSBASE->STACK_ITEM_15.B_VALUE1=FUN_EVAL_TABLE(RPNLOC+1);
  TOSBASE->STACK_ITEM_15.B_VALUE2=FUN_EVAL_TABLE(RPNLOC+2);
  TOSBASE->STACK_ITEM_15.ZX_VALUE1=FUN_EVAL_TABLE(RPNLOC+3);
  TOSBASE->STACK_ITEM_15.ZX_VALUE2=FUN_EVAL_TABLE(RPNLOC+4);

RPNLOC = RPNLOC + 5; /* to next instruction */
  GOTO NEXT_INST;

INSTRUCTION(@LOAD_INTEGER):;   /*** LOAD INTEGER ***/

RESULT = FUN_EVAL_TABLE(RPNLOC + 1);

FSTKPTR = FSTKPTR + 1;  /* push constant onto stack */

FUNSTACK(FSTKPTR).B_VALUE = RESULT;
  FUNSTACK(FSTKPTR).ZX_VALUE = 0;

RPNLOC = RPNLOC + 2;

GOTO NEXT_INST;

INSTRUCTION(@LOAD_BIPIN):;
INSTRUCTION(@LOAD_OC_PIN):;
INSTRUCTION(@LOAD_OE_PIN):;
INSTRUCTION(@LOAD_TRIPIN):;
INSTRUCTION(@LOAD_PIN):;

/* Get binary value on pin and push onto stack. */
  FSTKPTR=FSTKPTR+1;
  IF SUBSTR(FUNCTION.B_VALUE,FUN_EVAL_TABLE(RPNLOC+1),1) THEN I=1;
  ELSE I=0;
  FUNSTACK(FSTKPTR).B_VALUE=I;

/* Get ZX value on pin and push onto stack. */
  IF SUBSTR(FUNCTION.ZX_VALUE,FUN_EVAL_TABLE(RPNLOC+1),1) THEN I=1;
  ELSE I=0;
  FUNSTACK(FSTKPTR).ZX_VALUE=I;

/* Increment RPNLOC. */
  RPNLOC=RPNLOC+2;
  GOTO NEXT_INST;

INSTRUCTION(@LOAD_REG):;

#BITS = FUN_EVAL_TABLE(RPNLOC + 3); /* number of bits in operand */

IF @DEBUG_FLAG THEN DO;
      IF (#BITS >32) | (#BITS <1) THEN DO;
          CALL OUTSMSG(@ERROR_PE, 'Number of bits for LOAD REGISTER' ||
                                 'is ' || CHAR(#BITS) || '. It should be ' ||
                                 'between 1 and 32 inclusive (FMS$MN).');
          GOTO DONE;
          END;
      END;

RPNPTR=ADDR(FUN_EVAL_TABLE(RPNLOC));
  CALL FMS$LDR(ELMTBASE,RPNPTR);
  RPNLOC=RPNLOC+4;
  GOTO NEXT_INST;

INSTRUCTION(@LOAD_MEM):;

#BITS = FUN_EVAL_TABLE(RPNLOC + 3); /* number of bits in operand */

IF @DEBUG_FLAG THEN DO;
      IF (#BITS >32) | (#BITS <1) THEN DO;
          CALL OUTSMSG(@ERROR_PE, 'Number of bits for LOAD MEMORY' ||
```

```
                                              'is ' || CHAR(#BITS) || '.  It should be ' ||
                                              'between 1 and 32 inclusive (FMS$MV).');
        GOTO DONE;
        END;
     END;

RPNPTR=ADDR(FUN_EVAL_TABLE(RPNLOC));
  CALL FMS$LDM(ELMTBASE,RPNPTR);
  RPNLOC=RPNLOC+5;
  GOTO NEXT_INST;

INSTRUCTION(&LOAD_DP);;    /* LOAD DATA PATH */

DCL #PINS      FIXED BIN(15);

FSTKPTR=FSTKPTR+1;

RPNLOC = RPNLOC + 1;
  #PINS = FUN_EVAL_TABLE(RPNLOC);   /* number of pins in data path */

FUNSTACK(FSTKPTR).B_VALUE = 0;   /* clear top of stack */
  FUNSTACK(FSTKPTR).ZX_VALUE = 0;

DO I = 1 TO #PINS;
    RPNLOC = RPNLOC + 1;
    IO_SLOT# = FUN_EVAL_TABLE(RPNLOC);
    SUBSTR(FUNSTACK_OVLAY(FSTKPTR).B_VALUE, 33 - I, 1) =
            SUBSTR(FUNCTION.B_VALUE, IO_SLOT#, 1);
    SUBSTR(FUNSTACK_OVLAY(FSTKPTR).ZX_VALUE, 33 - I, 1) =
            SUBSTR(FUNCTION.ZX_VALUE, IO_SLOT#, 1);
    END;

/* Increment RPNLOC. */
  RPNLOC=RPNLOC+1;       /* remember RPNLOC was incremented in the loop */

GOTO NEXT_INST;

INSTRUCTION(&LOAD_CONTIGUOUS_DP);;   /* LOAD CONTINUGUOUS DATA PATH */
  FSTKPTR=FSTKPTR+1;

RPNLOC = RPNLOC + 1;
  I = FUN_EVAL_TABLE(RPNLOC);   /* Left most pos in B,ZX values. */

RPNLOC = RPNLOC + 1;
  #PINS = FUN_EVAL_TABLE(RPNLOC);   /* number of pins in data path */

FUNSTACK(FSTKPTR).B_VALUE = 0;   /* clear top of stack */
  FUNSTACK(FSTKPTR).ZX_VALUE = 0;

SUBSTR(FUNSTACK_OVLAY(FSTKPTR).B_VALUE,33-#PINS,#PINS)=
         SUBSTR(FUNCTION.B_VALUE,I,#PINS);
  SUBSTR(FUNSTACK_OVLAY(FSTKPTR).ZX_VALUE,33-#PINS,#PINS)=
         SUBSTR(FUNCTION.ZX_VALUE,I,#PINS);

/* Increment RPNLOC. */
  RPNLOC=RPNLOC+1;

GOTO NEXT_INST;

INSTRUCTION(&ASSIGN_PINS);;   /* Assign to data path, or concat of pins */

/* Perform datapath assignment */
  RPNPTR=ADDR(FUN_EVAL_TABLE(RPNLOC));
  CALL FMS$ASDP(ELMTBASE,RPNPTR);
  /* RPNLOC + 2 contains the number of bits being assigned. */
  RPNLOC=RPNLOC + 10 + FUN_EVAL_TABLE(RPNLOC+2)*2;

GOTO NEXT_INST;

/* Assign to data path, or concat of pins. This instruction is */
/* generated whenever an output pin is assigned to only once. */
```

```
                                     /* thus eliminating the need to accumulate assigned values.      */
INSTRUCTION(@ASSIGN_PINS_IMMEDIATE):;

/* Perform datapath assignment */
   RPNPTR=ADDR(FUN_EVAL_TABLE(RPNLOC));
   CALL ASSIGN_PINS_IMMEDIATE(ELMTBASE,RPNPTR);
   /* RPNLOC + 2 contains the number of bits being assigned. */
   RPNLOC=RPNLOC + 10 + FUN_EVAL_TABLE(RPNLOC+2)*2;

GOTO NEXT_INST;

INSTRUCTION(@ASSIGN_REG):;
   RPNPTR=ADDR(FUN_EVAL_TABLE(RPNLOC));
   CALL FMSSASRG(ELMTBASE,RPNPTR);
   RPNLOC=RPNLOC+5;
   GOTO NEXT_INST;

INSTRUCTION(@ASSIGN_MEM):;
   RPNPTR=ADDR(FUN_EVAL_TABLE(RPNLOC));
   CALL FMSSASMM(ELMTBASE,RPNPTR);
   RPNLOC=RPNLOC+7;
   GOTO NEXT_INST;

INSTRUCTION(@END_TAD):;

/* This is the last instruction in the evaluation table. It is      */
   /* reached whenever TAD execution advances to the NEXT level.       */

CALL END_NEXT_LEVEL_PROCESSING;

/* If there are no more NEXT blocks to exec at this level, we're done.  */
   IF FNXTBTOP=NULL THEN GOTO DONE;
   ELSE DO;
       CURRENT_NEXT_BLOCK_PTR = FNXTBTOP;
       FNXTBTOP = NULL;
       RPNLOC=CURRENT_NEXT_BLOCK_PTR->FNXTBLK.RPNLOC;
       P=CURRENT_NEXT_BLOCK_PTR->FNXTBLK.NEXT_PTR;
       FREE CURRENT_NEXT_BLOCK_PTR->FNXTBLK;
       CURRENT_NEXT_BLOCK_PTR=P;
       END;
   GOTO NEXT_INST;

INSTRUCTION(@END_IF):; /*** END INSTRUCTIONS: just increment rpnloc ***/

INSTRUCTION(@END_ELSE):;

INSTRUCTION(@END_DECODE):;

INSTRUCTION(@END_CASE):;

INSTRUCTION(@END_ELSEX):;

RPNLOC = RPNLOC + 1;

GOTO NEXT_INST;

DONE:
/* CLEAR CHANGE CODES IN CLOCK ID_SLOTS */

CALL CLR_CLK_PINS( FUN_EVAL_TABLE( FUN_EVAL_TABLE(0) ) );

RETURN;

/*==================INTERNAL ROUTINES==========================================*/

END_NEXT_LEVEL_PROCESSING: PROC;

/*----------------------------------------------------------------------------*/
/* This procedure does all the processing necessary for terminating a         */
/* terminating a level of NEXT processing. Pin assignments are scheduled,     */
/* STORAGES are written, and certain initialization operations take place.    */
/*----------------------------------------------------------------------------*/
```

```
/* Schedule pin assignments, if any. */
IF FIRSTPIN^=NULL THEN CALL FMS$SCPN(ELMTBASE);

/* Perform storage assignments. */
/* Reinitialization of temporary storage array is done by fms$wstr. */

CALL FMS$WSTR(ELMTBASE);
END END_NEXT_LEVEL_PROCESSING;

/*================================================================*/

INSTRUCTION_ERROR_DETECTED: PROC(RPNLOC) RETURNS(BIT(1) ALIGNED);

/*----------------------------------------------------------------*/
/* This error checking is done prior to the execution of each instruction. */
/*----------------------------------------------------------------*/

DCL RPNLOC          FIXED BIN(31);  /* IN - Required only because of SPL bug. */
DCL RETURN_VAL      BIT(1) ALIGNED;

RETURN_VAL=@FALSE;
IF RPNLOC>FUN_EVAL_TABLE(0) THEN DO;
    MESSAGE='RPNLOC ('||CHAR(RPNLOC)||') exceeds evaluation table size of '||
            CHAR(FUN_EVAL_TABLE(0))||' for function element type '||
            FUNCTION.TYPE_PTR->TYPETAB.TYPE||' (FMS$MN).';
    CALL OUT$MSG(@ERROR_PE,MESSAGE);
    RETURN_VAL=@TRUE;
    END;
ELSE IF RPNLOC<1 THEN DO;
    MESSAGE='RPNLOC ('||CHAR(RPNLOC)||') is less than zero'||
            ' for function element type '||
            FUNCTION.TYPE_PTR->TYPETAB.TYPE||' (FMS$MN).';
    CALL OUT$MSG(@ERROR_PE,MESSAGE);
    RETURN_VAL=@TRUE;
    END;
ELSE IF FUN_EVAL_TABLE(RPNLOC)<1 | FUN_EVAL_TABLE(RPNLOC)>@MAX_TAD_OPCODE
    THEN DO;
    MESSAGE='Invalid TAD opcode ('||CHAR(FUN_EVAL_TABLE(RPNLOC))||
            ') (FMS$MN).';
    CALL OUT$MSG(@ERROR_PE,MESSAGE);
    RETURN_VAL=@TRUE;
    END;

RETURN(RETURN_VAL);
END INSTRUCTION_ERROR_DETECTED;

/*================================================================*/

NEXT_JUMP_ERR: PROC(RPNLOC) RETURNS(BIT(1) ALIGNED);

/*----------------------------------------------------------------*/
/* This error checking is done when a &NEXT instruction is executed. */
/* The NEXT instruction should jump to it's associated @END_NEXT.    */
/*----------------------------------------------------------------*/

DCL RPNLOC          FIXED BIN(31); /* IN - Required because of SPL comp err. */

DCL RETURN_VAL      BIT(1) ALIGNED;

IF FUN_EVAL_TABLE(RPNLOC)^=@END_NEXT THEN DO;
    MESSAGE='Jump location of &NEXT instruction ('||CHAR(RPNLOC)||
            ' does not point to @END_NEXT instruction. The opcode '||
            'at this location is '||CHAR(FUN_EVAL_TABLE(RPNLOC))||
            '. The function element type is '||
            FUNCTION.TYPE_PTR->TYPETAB.TYPE||' (FMS$MN).';
    CALL OUT$MSG(@ERROR_PE,MESSAGE);
    RETURN_VAL=@TRUE;
    END;

RETURN(RETURN_VAL);

END NEXT_JUMP_ERR;
```

```
/*=====================================================================*/

CLR_CLK_PINS: PROC(IO_SLOT#); /* clears change codes for clock pins */

DCL IO_SLOT#        FIXED BIN(15); /* first io_slot */

DCL START_ADDR      PTR OPTIONS(SHORT);

IF (IO_SLOT# > 0) THEN DO;
   START_ADDR = ADDR(FUNCTION.IO(IO_SLOT#));
   ITEMBASE = START_ADDR;
   CLOCK_ITEM.CHANGE_CODE = @0_0;

DO ITEMBASE = CLOCK_ITEM.NEXT_PTR2   REPEAT CLOCK_ITEM.NEXT_PTR2
                                          WHILE (ITEMBASE ^= START_ADDR);
      CLOCK_ITEM.CHANGE_CODE = @0_0;
      END;
   END;

END CLR_CLK_PINS;

/*=====================================================================*/

ASSIGN_PINS_IMMEDIATE: PROC(ELMTBASE,RPNPTR);

DCL ELMTBASE        PTR OPTIONS(SHORT); /* IN - TO function occurrence. */
DCL RPNPTR          PTR OPTIONS(SHORT); /* IN - To rpn stack.           */

DCL SIM$SFS         ENTRY(PTR OPTIONS(SHORT),PTR OPTIONS(SHORT),
                          FIXED BIN(15),FIXED BIN(15),FIXED BIN(31),
                          FIXED BIN(15));

DCL FETCH_DELAY     BIT(1) ALIGNED;
DCL DELAY           FIXED BIN(31);
DCL VALUE           FIXED BIN(15);
DCL IOSLOT          FIXED BIN(15);
DCL BIT_POS         FIXED BIN(15);
DCL EVT_SLOT        FIXED BIN(15);
DCL PIN#            FIXED BIN(15);
DCL P_VAL           FIXED BIN(15);

DCL 1 ASGN_IMM_INST    BASED(RPNPTR),
      2 INST_CODE      FIXED BIN(15),
      2 START_POS      FIXED BIN(15),
      2 #BITS          FIXED BIN(15),
      2 DELAY_TYPE     FIXED BIN(15),
      2 DELAY_INDX(6)  FIXED BIN(15),
      2 PIN(@MX_DP_LENGTH),
        3 IOSLOT       FIXED BIN(15),
        3 TYPE         FIXED BIN(15);

/*---------------------------------------------------------------------*/
/* If this assignment uses default delays, or all the delays are the same, */
/* then there is no need to look up the delay for each pin. They will be the */
/* same.                                                               */
/*---------------------------------------------------------------------*/

FETCH_DELAY=@FALSE;
DLYBASE=FUNCTION.DELAY_PTR;
GOTO DELAY_TYPE(ASGN_IMM_INST.DELAY_TYPE);

DELAY_TYPE(@DEFAULT_DELAYS)::
      DELAY=FUNC_DLY_TABLE(ASGN_IMM_INST.DELAY_INDX(1));
      GOTO END_DELAY_TYPE;

DELAY_TYPE(@SAME_DELAYS)::
      DELAY=FUNC_DLY_TABLE(ASGN_IMM_INST.DELAY_INDX(1));
      GOTO END_DELAY_TYPE;

DELAY_TYPE(@SEPARATE_DELAYS)::
      FETCH_DELAY=@TRUE;
      GOTO END_DELAY_TYPE;
```

```
    END_DELAY_TYPE:;

DO PIN#=1 TO ASGN_IMM_INST.#BITS;

/*----------------------------------------------------------------------*/
    /* Get the new VALUE for this pin.                                      */
    /*----------------------------------------------------------------------*/

/* Bit pos moves left for each pin. */
    BIT_POS=ASGN_IMM_INST.START_POS-PIN#+1;
    VALUE=GET_VALUE(BIT_POS,ASGN_IMM_INST.PIN(PIN#).TYPE);

/*----------------------------------------------------------------------*/
    /* Get the old value for this pin.                                      */
    /*----------------------------------------------------------------------*/

IOSLOT = ASGN_IMM_INST.PIN(PIN#).IOSLOT;
    IF SUBSTR(FUNCTION.B_VALUE,IOSLOT,1) THEN P_VAL=1;
    ELSE P_VAL=0;
    IF SUBSTR(FUNCTION.ZX_VALUE,IOSLOT,1) THEN P_VAL=P_VAL+2;

/*----------------------------------------------------------------------*/
    /* Compute the DELAY of this event, based on VALUE.                     */
    /*----------------------------------------------------------------------*/

IF FETCH_DELAY THEN
       DELAY=COMPUTE_DELAY(P_VAL,VALUE,ASGN_IMM_INST.DELAY_INDX);

/*----------------------------------------------------------------------*/
    /* Get the event pointer slot for this output and schedule the new value*/
    /*----------------------------------------------------------------------*/

UNSPEC(EVT_SLOT)=UNSPEC(IOSLOT) & '0007'B4; /* IOSLOT mod 8 */
    EVT_SLOT=EVT_SLOT+1;
    CALL SIM$SFS(FUNCTION.EVT_PTR(EVT_SLOT),ELMTBASE,P_VAL,
                 VALUE,
                 DELAY,
                 IOSLOT);

END;

END ASSIGN_PINS_IMMEDIATE;

/*======================================================================*/

COMPUTE_DELAY: PROC(P_VAL,VALUE,DLY_INDX) RETURNS(FIXED BIN(15));

DCL P_VAL        FIXED BIN(15); /* IN - Present value of output pin. */
DCL VALUE        FIXED BIN(15); /* IN - New value of output pin. */
DCL DLY_INDX(6)  FIXED BIN(15); /* IN - Array of delay table indexes. */
DCL DELAY        FIXED BIN(15); /* RTN - Computed delay. */

%INCLUDE 'THEMISSRC>INSERT>DELAY_CODES.PL1G';

DCL DELAY1   FIXED BIN(15);
DCL DELAY2   FIXED BIN(15);
DCL CHGCODE  FIXED BIN(15);

CHGCODE=P_VAL*16 + VALUE;

DLYBASE = FUNCTION.DELAY_PTR;

/* DO CASE OF CHANGE CODE */

/*----------------------------------------------------------------------*/
/* Note: @0_0, @1_1, @X_X, and @Z_Z change codes are in anticipation of */
/* another value being scheduled on the same pin with a smaller delay. If*/
/* such a change is not scheduled, then @0_0, @1_1, etc. change will not be*/
/* scheduled.                                                           */
/*----------------------------------------------------------------------*/

GOTO CHG(CHGCODE);
```

```
CHG(@0_0): /* See above comment. */
    DELAY=FUNC_DLY_TABLE(DLY_INDX(@TPHL));
    GOTO END_DELAY;
CHG(@0_1):
    DELAY = FUNC_DLY_TABLE(DLY_INDX(@TPLH));
    GOTO END_DELAY;
CHG(@0_X):
    DELAY = FUNC_DLY_TABLE(DLY_INDX(@TPLH));
    GOTO END_DELAY;
CHG(@0_Z):
    DELAY = FUNC_DLY_TABLE(DLY_INDX(@TPLZ));
    GOTO END_DELAY;
CHG(@1_0):
    DELAY = FUNC_DLY_TABLE(DLY_INDX(@TPHL));
    GOTO END_DELAY;
CHG(@1_1): /* See above comment. */
    DELAY=FUNC_DLY_TABLE(DLY_INDX(@TPLH));
    GOTO END_DELAY;
CHG(@1_X):
    DELAY = FUNC_DLY_TABLE(DLY_INDX(@TPHL));
    GOTO END_DELAY;
CHG(@1_Z):
    DELAY = FUNC_DLY_TABLE(DLY_INDX(@TPHZ));
    GOTO END_DELAY;
CHG(@X_0):
    DELAY = FUNC_DLY_TABLE(DLY_INDX(@TPHL));
    GOTO END_DELAY;
CHG(@X_1):
    DELAY = FUNC_DLY_TABLE(DLY_INDX(@TPLH));
    GOTO END_DELAY;
CHG(@X_X): /* See above comment. */
    /* Schedule with longer of 0-1 and 1-0 delay. */
    DELAY1=FUNC_DLY_TABLE(DLY_INDX(@TPHL));
    DELAY2=FUNC_DLY_TABLE(DLY_INDX(@TPLH));
    IF DELAY1>DELAY2 THEN DELAY=DELAY1;
    ELSE DELAY=DELAY2;
    GOTO END_DELAY;
CHG(@X_Z):
    /* SCHEDULE WITH LONGER OF 0-Z OR 1-Z DELAY */
    DELAY1=FUNC_DLY_TABLE(DLY_INDX(@TPLZ));
    DELAY2=FUNC_DLY_TABLE(DLY_INDX(@TPHZ));
    IF DELAY1>DELAY2 THEN DELAY=DELAY1;
    ELSE DELAY=DELAY2;
    GOTO END_DELAY;
CHG(@Z_0):
    DELAY = FUNC_DLY_TABLE(DLY_INDX(@TPZL));
    GOTO END_DELAY;
CHG(@Z_1):
    DELAY = FUNC_DLY_TABLE(DLY_INDX(@TPZH));
    GOTO END_DELAY;
CHG(@Z_X):
    /* SCHEDULE WITH SHORTER OF Z-0 OR Z-1 DELAY. THIS IS PESSIMISTIC */
    /* BECAUSE CIRCUIT GOES TO X SOONER. */
    DELAY1=FUNC_DLY_TABLE(DLY_INDX(@TPZL));
    DELAY2=FUNC_DLY_TABLE(DLY_INDX(@TPZH));
    IF DELAY1<DELAY2 THEN DELAY=DELAY1;
    ELSE DELAY=DELAY2;
    GOTO END_DELAY;
CHG(@Z_Z): /* See above comment. */
    /* SCHEDULE WITH LONGER OF 0-Z OR 1-Z DELAY */
    DELAY1=FUNC_DLY_TABLE(DLY_INDX(@TPLZ));
    DELAY2=FUNC_DLY_TABLE(DLY_INDX(@TPHZ));
    IF DELAY1>DELAY2 THEN DELAY=DELAY1;
    ELSE DELAY=DELAY2;
    GOTO END_DELAY;

END_DELAY: RETURN(DELAY);
END COMPUTE_DELAY;

/*================================================================*/

GET_VALUE: PROC(BIT_POS,TYPE) RETURNS(FIXED BIN(15));
```

```
%INCLUDE '>CADSRC>INSERT>SYMBOL_TYPES.INS.SPL';

DCL BIT_POS FIXED BIN(15); /* IN - Within stack element B,ZX values. */
DCL TYPE    FIXED BIN(15); /* IN - Open emitter, collector, etc. */
DCL VALUE   FIXED BIN(15); /* RTV - Modified value from top of stack. */

/*--------------------------------------------------------------------*/
/* Read the value from the correct bit position of the working        */
/* stack, and case on the pin type to determine whether or not the value */
/* should be modified.                                                */
/*--------------------------------------------------------------------*/

GOTO PIN_TYPE(TYPE);

PIN_TYPE(@OUTPIN)::

/* Normal pin. */
     /* Transformation: */
     /* @0 -> @0 */
     /* @1 -> @1 */
     /* @X -> @X */
     /* @Z -> @X */

/* Get value from working stack. */

IF SUBSTR(FUNSTACK_OVLAY(FST<PTR).B_VALUE,BIT_POS,1) THEN VALUE=@1;
     ELSE VALUE=@0;
     IF SUBSTR(FUNSTACK_OVLAY(FST<PTR).ZX_VALUE,BIT_POS,1) THEN VALUE=@X;
     GOTO END_PIN_TYPE;

PIN_TYPE(@OPCPIN)::
     /* Value mapping for OC pins: */
     /* @0 -> @0 */
     /* @1 -> @Z */
     /* @X -> @X */
     /* @Z -> @X */

VALUE=@0;
     IF SUBSTR(FUNSTACK_OVLAY(FST<PTR).ZX_VALUE,BIT_POS,1) THEN VALUE=@X;
     ELSE IF SUBSTR(FUNSTACK_OVLAY(FSTKPTR).B_VALUE,BIT_POS,1) THEN VALUE=@Z;
     GOTO END_PIN_TYPE;

PIN_TYPE(@OPEPIN)::
     /* Value mapping for OE pins. */
     /* @0 -> @Z */
     /* @1 -> @1 */
     /* @X -> @X */
     /* @Z -> @X */

VALUE=@Z;
     IF SUBSTR(FUNSTACK_OVLAY(FST<PTR).ZX_VALUE,BIT_POS,1) THEN VALUE=@X;
     ELSE IF SUBSTR(FUNSTACK_OVLAY(FSTKPTR).B_VALUE,BIT_POS,1) THEN VALUE=@1;
     GOTO END_PIN_TYPE;

PIN_TYPE(@TRIPIN)::
   PIN_TYPE(@BIPIN)::
     /* No change in value. */
     IF SUBSTR(FUNSTACK_OVLAY(FST<PTR).B_VALUE,BIT_POS,1) THEN VALUE=1;
     ELSE VALUE=0;
     IF SUBSTR(FUNSTACK_OVLAY(FST<PTR).ZX_VALUE,BIT_POS,1) THEN VALUE=VALUE+2;
     GOTO END_PIN_TYPE;

END_PIN_TYPE::

RETURN(VALUE);
END GET_VALUE;

END FMSSMN;
/* FMSSADD.SPL, THEMISSRC>SOURCE>FMSS, CAD/CAM, 11/12/82          */
/* Routine to add two bit strings with Z's and X's                */
/* COPYRIGHT (C) 1982, Prime Computer, Inc., Natick, Ma 01760     */
```

```
FMS$ADD: PROC(#BITS);

/*----------------------------------------------------------------------*/
/* Description:                                                         */
/*    This procedure adds the two values on top of the working stack and */
/*    replaces them with the result.                                    */
/*    NBITS specifies the width of the operands (bits right justified). */
/*                                                                      */
/* History:                                                             */
/* Date      Programmer  Description of modification                    */
/* 11/12/82  MAS         Initial coding.                                */
/* 12/01/82  MAS         Rewrote code for handling X's                  */
/*----------------------------------------------------------------------*/

DCL #BITS     FIXED BIN(15);  /* # of bits in larger operand */

DCL 1 ARG1 BASED(PTR1),      /* OVERLAY FOR ARG 1 */
         2 B    BIT(32) ALIGNED,
         2 ZX   BIT(32) ALIGNED;

DCL 1 ARG1_OVLY BASED(PTR1), /* OVERLAY FOR ARG 1 TO ADD IN 16 BIT CHUNCKS */
         2 B1   FIXED BIN(15),
         2 B2   FIXED BIN(15);

DCL 1 ARG2 BASED(PTR2),      /* OVERLAY FOR ARG 2 */
         2 B    BIT(32) ALIGNED,
         2 ZX   BIT(32) ALIGNED;

DCL 1 ARG2_OVLY BASED(PTR2), /* OVERLAY FOR ARG 2 TO ADD IN 16 BIT CHUNCKS */
         2 B1   FIXED BIN(15),
         2 B2   FIXED BIN(15);

DCL PTR1       PTR OPTIONS(SHORT);
   DCL PTR2       PTR OPTIONS(SHORT);
   DCL ZERO       BIT(16) ALIGNED;

DCL A          FIXED BIN(31);
   DCL B          FIXED BIN(31);
   DCL SUM        BIT(32) ALIGNED;
   DCL SUM1       FIXED BIN(31);
   DCL SUM2       FIXED BIN(31);
   DCL CARRY      FIXED BIN(31);
   DCL OVFLOW     BIT(1) ALIGNED;
   DCL CARRY_BIT  BIT(1) ALIGNED;
   DCL SIGN_BIT_A BIT(1) ALIGNED;
   DCL SIGN_BIT_B BIT(1) ALIGNED;
   DCL SIGN_BIT_SUM BIT(1) ALIGNED;

DCL RES_B     BIT(32) ALIGNED;  /* b values for result */
   DCL RES_ZX    BIT(32) ALIGNED;  /* zx values for result */

DCL C_IN_X    BIT(1) ALIGNED;
   DCL A1_B      BIT(1) ALIGNED;
   DCL A1_X      BIT(1) ALIGNED;
   DCL A2_B      BIT(1) ALIGNED;
   DCL A2_X      BIT(1) ALIGNED;
   DCL CAR_B     BIT(1) ALIGNED;
   DCL CAR_X     BIT(1) ALIGNED;
   DCL A1_INT    FIXED BIN(15);
   DCL A2_INT    FIXED BIN(15);
   DCL CAR_INT   FIXED BIN(15);
   DCL SUM_INT   FIXED BIN(15);

DCL BIT_INDX1 FIXED BIN(15);
   DCL I         FIXED BIN(15);

%INCLUDE 'THEMISSRC>INSERT>FUNC_SIZE_LIMITS.INS.SPL';
%INCLUDE 'THEMISSRC>INSERT>FUNC_WORKING_STACK.INS.SPL';

%REPLACE @TRUE BY '1'B;
%REPLACE @FALSE BY '0'B;
   PTR1 = ADDR(FUNSTACK(FSTKPTR));    /* sets pointers for overlays for args */
   PTR2 = ADDR(FUNSTACK(FSTKPTR - 1));
```

```
/* convert Z's to X's */
ARG1.B = ARG1.B & ^ARG1.ZX;
ARG2.B = ARG2.B & ^ARG2.ZX;

/* sign extend to 32 bits */
/*BIT_INDX1 = 33 - #BITS;*/
/*ARG1.B = COPY(SUBSTR(ARG1.B, BIT_INDX1, 1), 32 - #BITS) ||*/
/*                              SUBSTR(ARG1.B, BIT_INDX1, #BITS);*/
/*ARG2.B = COPY(SUBSTR(ARG2.B, BIT_INDX1, 1), 32 - #BITS) ||*/
/*                              SUBSTR(ARG2.B, BIT_INDX1, #BITS);*/

ZERO = '0'B;

UNSPEC(A) = ZERO || UNSPEC(ARG1_OVLY.B2);  /* get right most word of arg 1 */
UNSPEC(B) = ZERO || UNSPEC(ARG2_OVLY.B2);  /* get right most word of arg 2 */

C_IN_X = @FALSE;  /* check carry_in */
CARRY = C_IN;
IF (CARRY = -1) THEN DO;
   CARRY = 0;
   C_IN_X = @TRUE;
   END;

SUM1 = A + B + CARRY;    /* add low order words */

CARRY = 0;
IF SUBSTR(UNSPEC(SUM1), 16, 1) = '1'B THEN CARRY = 1;

UNSPEC(A) = ZERO || UNSPEC(ARG1_OVLY.B1);  /* get second word of arg 1 */
UNSPEC(B) = ZERO || UNSPEC(ARG2_OVLY.B1);  /* get second word of arg 2 */

SUM2 = A + B + CARRY;    /* add higher order words */

SUM = SUBSTR(UNSPEC(SUM2), 17, 15) || SUBSTR(UNSPEC(SUM1), 17, 16);
BIT_INDX1 = 33 - #BITS;
IF #BITS < 32 THEN C_OUT = SUBSTR(SUM, BIT_INDX1 - 1, 1);  /* carry out */
ELSE C_OUT = SUBSTR(UNSPEC(SUM2), 16, 1);

/* truncate back to original size */
SUM = COPY('0'B, 32 - #BITS) || SUBSTR(SUM, BIT_INDX1, #BITS);

SIGN_BIT_A = SUBSTR(ARG1.B, BIT_INDX1, 1);
SIGN_BIT_B = SUBSTR(ARG2.B, BIT_INDX1, 1);
SIGN_BIT_SUM = SUBSTR(SUM, BIT_INDX1, 1);

OVERFLOW = '0'B;
IF ^(SIGN_BIT_A | SIGN_BIT_B) THEN OVERFLOW = SIGN_BIT_SUM;  /* both positive */
ELSE IF (SIGN_BIT_A & SIGN_BIT_B) THEN OVERFLOW = ^SIGN_BIT_SUM; /* both neg */

RES_B = SUM;
RES_ZX = '00000000'B4;

/* now check for any X's in the arguments */

IF (ARG1.ZX ^= '00000000'B4) | (ARG2.ZX ^= '00000000'B4) | C_IN_X THEN DO;
/* there are X's */

/*---------------------------------------------------------------------------*/
/* Let me describe the algorithm used to add bit values with X's. First, all */
/* Z's were converted to X's. So with 3 values (0,1,X) and 3 addends to add  */
/* (arg1, arg2, carry) at each bit position there are 10 combinations that   */
/* could result. At each bit position the binary values are converted to     */
/* integers with X getting the value of 4 and then added. The resulting sum  */
/* uniquely determines which of the 10 cases of addition has occurred.       */
/*                                                                           */
/*                       0 0 0 1 0 0 1 0 1 X                                 */
/*                       0 0 1 1 0 1 1 X X X                                 */
/*                       0 1 1 1 X X X X X X                                 */
/*                       --------------------                                */
/*          integer sum  0 1 2 3 4 5 6 8 9 12                                */
/*                                                                           */
/*                  sum  0 1 0 1 X X X X X X                                 */
/*                carry  0 0 1 1 0 X 1 X X X                                 */
```

```
/*                                                                          */
/*--------------------------------------------------------------------------*/

RES_B = '00000000'B4;  /* zero out sum before bit by bit addition */

/* set up carry for first addition */
    CAR_B = '0'B;
    CAR_X = '0'B;
    IF C_IN_X THEN CAR_X = '1'B;
    ELSE CAR_B = SUBSTR(UNSPEC(C_IN), 16, 1);

DO I = 32 TO BIT_INDX1 BY -1;
       A1_B = SUBSTR(ARG1.B, I, 1);
       A1_X = SUBSTR(ARG1.ZX, I, 1);
       A2_B = SUBSTR(ARG2.B, I, 1);
       A2_X = SUBSTR(ARG2.ZX, I, 1);

/* convert bit values to integers (x = 4) */
       A1_INT = A1_B + 4*A1_X;
       A2_INT = A2_B + 4*A2_X;
       CAR_INT = CAR_B + 4*CAR_X;

SUM_INT = A1_INT + A2_INT + CAR_INT;   /* add the integers */

/* replace bit in result */
       IF (SUM_INT = 1) | (SUM_INT = 3) THEN SUBSTR(RES_B, I, 1) = '1'B;
       ELSE IF (SUM_INT > 3) THEN  SUBSTR(RES_ZX, I, 1) = '1'B;

/* set up carry for next addition */
       CAR_B = '0'B;
       CAR_X = '0'B;
       IF (SUM_INT = 2) | (SUM_INT = 3) | (SUM_INT = 6) THEN CAR_B = '1'B;
       ELSE IF (SUM_INT > 4) THEN CAR_X = '1'B;

END;
          C_OUT = CAR_B;
          IF (CAR_X) THEN C_OUT = -1; /* propagate x to carry */
          IF (SUBSTR(RES_ZX, BIT_INDX1, 1) = '1'B) THEN OVERFLOW = -1;
       END;

FSTKPTR = FSTKPTR - 1;  /* pop 2, push result */

FUNSTACK_OVLAY(FSTKPTR).B_VALUE = RES_B;
    FUNSTACK_OVLAY(FSTKPTR).ZX_VALUE = RES_ZX;

END FMS$ADD;
/* SIMSTM.SPL, THEMISSRC>SOURCE>SIMS, CAD/CAM, 07/15/82                     */

/* SIMSTM.SPL, THEMISSRC>SOURCE>SIMS, CAD/CAM, 07/15/82                     */
/* Transmit an event on a good element output                              */
/* Copyright (C) 1982, Prime Computer, Inc., Natick, Ma 01760              */

SIMSTM: PROC(EVTBASE,ITEMPTR);

/*--------------------------------------------------------------------------*/
/*                                                                          */
/*    TRANSMITS A SIGNAL TO ALL LOADS AND CONTROL BLOCKS ON A NET           */
/*                                                                          */
/*        EVTBASE: (INPUT) PTS TO EVENT BEING TRANSMITTED                   */
/*        ITEMPTR: (INPUT) PTS TO FIRST ITEM ON NET                         */
/*                                                                          */
/*    NOTES:                                                                */
/*                                                                          */
/*      (1) The good element input is updated after fault propagation       */
/*          to simplify divergence.                                         */
/*                                                                          */
/*--------------------------------------------------------------------------*/
/*                                                                          */
/* History:                                                                 */
/* Date       Programmer    Description                                     */
```

```
/* 09/30/83    RICKS        Added aFGIN type                                    */
/* 05/31/83    RICKS        Recalculate FAULT_LIST ptr before each fanout       */
/* 05/10/83    RICKS        Added aDET_STROBE and aDET_IN                       */
/* 03/23/83    RICKS        Modified for fault simulation                       */
/* 11/17/82    RICKS        Modified to handle CLOCK function inputs.           */
/* 07/15/82    RBS          Added PASSIVE function inputs                       */
/*                                                                              */
/*------------------------------------------------------------------------------*/
/*                                                                              */
/*  HISTORY:                                                                    */
/*           15 MAR 1981 -DMS- CREATED                                          */
/*           28 OCT 1981 -DMS- ADDED INPUTS TO FUNCTION PRIMITIVES.             */
/*           08 DEC 1981 -RBS- ADDED INPUTS TO WHEN DETECTION BLOCKS            */
/*           08 JAN 1982 -DMS- ADDED PROCESSING OR DELAY_LINE INPUTS            */
/*           27 JAN 1982 -DMS- ADDED PROCESSING FOR FORCE GATE INPUTS           */
/*           10 MAY 1982 -DMS- CHANGED TRGATE TO UNIDIRECTIONAL                 */
/*                                                                              */
/*------------------------------------------------------------------------------*/

%INCLUDE '>CADSRC>INSERT>MAX_NAMSIZ.INS.SPL';
%INCLUDE '>THEMISSRC>INSERT>ITEM.PL1G';
%INCLUDE '>THEMISSRC>INSERT>EVENT.PL1G';
%INCLUDE '>THEMISSRC>INSERT>EVENTOVER.PL1G';
%INCLUDE '>THEMISSRC>INSERT>EVTCODE.PL1G';
%INCLUDE '>THEMISSRC>INSERT>BOOLEAN.PL1G';
%INCLUDE '>THEMISSRC>INSERT>BUSGATE.PL1G';
%INCLUDE '>THEMISSRC>INSERT>TRGATE.PL1G';
%INCLUDE '>THEMISSRC>INSERT>DELAY_LINE.PL1G';
%INCLUDE '>CADSRC>INSERT>FUNCTION.INS.SPL';
%INCLUDE '>THEMISSRC>INSERT>FORCE_GATE.INS.SPL';
%INCLUDE '>THEMISSRC>INSERT>WHEN_SIZE_LIMITS.PL1G';
%INCLUDE '>THEMISSRC>INSERT>WHENGATE.PL1G';
%INCLUDE '>THEMISSRC>INSERT>DELAYTAB.PL1G';
%INCLUDE '>THEMISSRC>INSERT>SIMLIST.PL1G';
%INCLUDE '>THEMISSRC>INSERT>MSG.P.1G';
%INCLUDE '>THEMISSRC>INSERT>NETCODE.PL1G';
%INCLUDE '>THEMISSRC>INSERT>CHGCODE.PL1G';
%INCLUDE '>THEMISSRC>INSERT>GEN_PRIM.PL1G';
%INCLUDE '>THEMISSRC>INSERT>FAULT_SIZE_LIMITS.INS.SPL';
DCL FFBASE PTR OPTIONS(SHORT);
%INCLUDE '>THEMISSRC>INSERT>DETECT_ELEMENT.INS.SPL';
%INCLUDE '>THEMISSRC>INSERT>WHEEL.PL1G';
%INCLUDE '>THEMISSRC>INSERT>GLOBAL.PL1G';
%INCLUDE '>THEMISSRC>INSERT>LAST_EVENT.INS.SPL';

DCL MASK        BIT(16) ALIGNED;
DCL P           PTR OPTIONS(SHORT);      /* TEMPORARY POINTER          */
DCL Q           PTR OPTIONS(SHORT);      /* TEMPORARY POINTER */
DCL ITEMPTR     PTR OPTIONS(SHORT);      /* PTS TO 1ST ITEM ON THE NET */
DCL ELMTBASE    PTR OPTIONS(SHORT);
DCL POS         FIXED BIN(15);
DCL NEW_EVT     PTR OPTIONS(SHORT);
DCL CHG_CODE    FIXED BIN(15);
DCL DELAY       FIXED BIN(31);
DCL SIM$SCH     ENTRY(FIXED BIN(31),PTR OPTIONS(SHORT),PTR OPTIONS(SHORT));

/*------------------------------------------------------------------------------*/
/* Fault simulation declarations. */

DCL EMIT_ELMTBASE PTR OPTIONS(SHORT);
DCL ELIST         PTR OPTIONS(SHORT);

DCL FLT$FFL       ENTRY(PTR OPTIONS(SHORT), PTR OPTIONS(SHORT),
                        PTR OPTIONS(SHORT), PTR OPTIONS(SHORT));

/*------------------------------------------------------------------------------*/

EMIT_ELMTBASE=EVTBASE->EVENT.ELMT_PTR;

/* DO FOR EACH ITEM ON THE NET */
/* STOP WHEN AN OUTPUT IS FOUND */
```

```
DO P=ITEMPTR  REPEAT(P->IN_ITEM.NEXT_PTR);

/* Get emitting elements fault list, which may change as faults are    */
   /* propagated.                                                          */
   ELIST=EMIT_ELMTBASE->GEN_PRIM.FAULT_LIST;

/* DO CASE OF ITEM CODE */
   GOTO ITEM_TYPE(P->IN_ITEM.CODE);

ITEM_TYPE(@FGIN):;              /* FORCE GATE INPUT */
      ELMTBASE = P->IN_ITEM.TOP_PTR;

/* Update input. */
      SUBSTR(FORCE_GATE.VALUES,P->IN_ITEM.POS,4)=
         SUBSTR(EVENT_OVER.CHG_CODE,13,4);

/* ADD PRIMITIVE TO SIMULATE LIST */

IF FORCE_GATE.SIM_FLAG = 0 THEN
      DO;
         SLCNT = SLCNT + 1;
         SIMLIST(SLCNT) = ELMTBASE;
         FORCE_GATE.SIM_FLAG = 1;
      END;
   GOTO NEXT_ITEM;

ITEM_TYPE(@BOOIN):              /* BOOLEAN INPUT */
   ELMTBASE = P->IN_ITEM.TOP_PTR;

/* USE IO MASK TO UPDATE BOOLEAN */

MASK = P->BOO_ITEM.MASK;
   %INCLUDE 'THEMISSRC>SOURCE>SIMS>BOO_UPDATE_IN.PL1G';

/* ADD PRIMITIVE TO SIMULATE LIST */

IF BOOLEAN.SIM_FLAG = 0 THEN
      DO;
         SLCNT = SLCNT + 1;
         SIMLIST(SLCNT) = ELMTBASE;
         BOOLEAN.SIM_FLAG = 1;
      END;
   GOTO NEXT_ITEM;

ITEM_TYPE(@TRGIN):              /* UNIDIRECTIONAL TRGATE INPUT   */
   ELMTBASE = P->IN_ITEM.TOP_PTR;
   SUBSTR(TRGATE.IO_VALUE,5,4) = SUBSTR(EVENT_OVER.CHG_CODE,13,4);

/* ADD PRIMITIVE TO SIMULATE LIST */

IF TRGATE.SIM_FLAG = 0 THEN
      DO;
         SLCNT = SLCNT + 1;
         SIMLIST(SLCNT) = ELMTBASE;
         TRGATE.SIM_FLAG = 1;
      END;
   GOTO NEXT_ITEM;
ITEM_TYPE(@TRGCNTL):            /* UNIDIRECTIONAL TRGATE CONTROL INPUT */
   ELMTBASE = P->IN_ITEM.TOP_PTR;
   IF P->IN_ITEM.POS = @TRG_CNTL1 THEN
      SUBSTR(TRGATE.IO_VALUE,9,2) = SUBSTR(EVENT_OVER.CHG_CODE,15,2);
   ELSE IF P->IN_ITEM.POS = @TRG_CNTL2 THEN
      SUBSTR(TRGATE.IO_VALUE,11,2) = SUBSTR(EVENT_OVER.CHG_CODE,15,2);
   ELSE
      CALL OUTSMSG(@GETHELP_PE,'Illegal TRGCNTL code was found in'||
                   ' I/O slot (SIMSTM).');

/* ADD PRIMITIVE TO SIMULATE LIST */

IF TRGATE.SIM_FLAG = 0 THEN
      DO;
         SLCNT = SLCNT + 1;
```

```
            SIMLIST(SLCNT) = ELMTBASE;
            TRGATE.SIM_FLAG = 1;
         END;
      GOTO NEXT_ITEM;

ITEM_TYPE(@BUSIN):;          /* BUSGATE INPUT */
   ELMTBASE = P->IN_ITEM.TOP_PTR;

/* Propagate fault lists if there are any. */
   IF ELIST^=EMIT_ELMTBASE | BUSGATE.FAULT_LIST^=ELMTBASE THEN DO;
      CALL FLTSPFL(EVTBASE,P,EMIT_ELMTBASE,ELMTBASE);
      END;

%INCLUDE 'THEMISSRC>SOURCE>SIMS>BUS_UPDATE.PL1G';

/* ADD PRIMITIVE TO BUS SIMULATE LIST */

IF BUSGATE.SIM_FLAG = 0 THEN
      DO;
         BSLCNT = BSLCNT + 1;
         BSIMLIST(BSLCNT) = ELMTBASE;
         BUSGATE.SIM_FLAG = 1;
      END;
   GOTO NEXT_ITEM;

ITEM_TYPE(@CLKFUNCIN):          /* CLOCK input to function */

/* Store change code in second slot of clock item. This will be  */
   /* used for edge detection in the function evalution routine.    */
   /* Mask out weak and dynamic values.                             */

UNSPEC(P->CLOCK_ITEM.CHANGE_CODE)=
         EVENT_OVER.CHG_CODE & '0000000000110011'B;

/* The rest is the same as active function inputs. */

ITEM_TYPE(@FUNCIN):          /* ACTIVE function primitive input */
   ELMTBASE = P->IN_ITEM.TOP_PTR;

/* UPDATE FUNCTION INPUT */

POS = P->IN_ITEM.POS;
   SUBSTR(FUNCTION.B_VALUE, POS,1) = SUBSTR(EVENT_OVER.CHG_CODE,16,1);
   SUBSTR(FUNCTION.ZX_VALUE,POS,1) = SUBSTR(EVENT_OVER.CHG_CODE,15,1);

/* ADD PRIMITIVE TO SIMULATE LIST */

IF FUNCTION.SIM_FLAG = 0 THEN
      DO;
         SLCNT = SLCNT + 1;
         SIMLIST(SLCNT) = ELMTBASE;
         FUNCTION.SIM_FLAG = 1;
      END;

GOTO NEXT_ITEM;

ITEM_TYPE(@PFUNCIN):;          /* PASSIVE function primitive input */

ELMTBASE = P->IN_ITEM.TOP_PTR;
   /* Update FUNCTION input, do NOT place on SIMLIST */

POS = P->IN_ITEM.POS;
   SUBSTR(FUNCTION.B_VALUE, POS,1) = SUBSTR(EVENT_OVER.CHG_CODE,16,1);
   SUBSTR(FUNCTION.ZX_VALUE,POS,1) = SUBSTR(EVENT_OVER.CHG_CODE,15,1);

GOTO NEXT_ITEM;

ITEM_TYPE(@TIMBLKIN):;          /* TIMING BLOCK INPUT */

ITEM_TYPE(@CNPIN):             /* CONN_PIN INPUT */
   GOTO NEXT_ITEM;
```

```
ITEM_TYPE(@DLYIN):              /* DELAY INPUT */
    ELMTBASE = P->IN_ITEM.TOP_PTR;

/* DELAY_LINE HAS THE SAME STRUCTURE AS A BOOLEAN */
    /* WITH ONE INPUT (ALWAYS THE 2ND IO)             */

SUBSTR(DELAY_LINE.B_VALUE, 15,1) = SUBSTR(EVENT_OVER.CHG_CODE,16,1);
    SUBSTR(DELAY_LINE.ZX_VALUE,15,1) = SUBSTR(EVENT_OVER.CHG_CODE,15,1);

/* ONE PASS EVALUATION IS USED FOR EFFICIENCY */

DELAY = DELAY_LINE.DELAY_PTR->DELAY_TABLE(1);
    CALL SIM$SCH(DELAY,DELAY_LINE.EVT_PTR,NEW_EVT);
    NEW_EVT->EVENT.CODE     = @NORMAL;
    NEW_EVT->EVENT.CHG_CODE = EVENT.CHG_CODE; /* SAME AS PRESENT CHANGE */
    NEW_EVT->EVENT.ELMT_PTR = ELMTBASE;
    NEW_EVT->EVENT.OUT_POS  = 1;

GOTO NEXT_ITEM;

ITEM_TYPE(@OUTPUT):             /* ANY OUTPUT */
    RETURN;

ITEM_TYPE(@WHENDET):;           /* WHEN DETECTION BLOCK */
    ELMTBASE = P->IN_ITEM.TOP_PTR;
    /* UPDATE WHEN GATE INPUT */

POS = P->IN_ITEM.POS;
    SUBSTR(WHENGATE.B_VAL, POS,1) = SUBSTR(EVENT_OVER.CHG_CODE,16,1);
    SUBSTR(WHENGATE.ZX_VAL,POS,1) = SUBSTR(EVENT_OVER.CHG_CODE,15,1);

/* ADD PRIMITIVE TO SIMULATE LIST */

IF WHENGATE.SIM_FLAG = 0 THEN
        DO;
            SLCNT = SLCNT + 1;
            SIMLIST(SLCNT) = ELMTBASE;
            WHENGATE.SIM_FLAG = 1;
        END;
    GOTO NEXT_ITEM;

ITEM_TYPE(@DET_IN):;                    /* Test point detect element input */
    ELMTBASE=P->IN_ITEM.TOP_PTR;
    /* Make sure that input will change before doing anything. */
    UNSPEC(CHG_CODE)=EVENT_OVER.CHG_CODE & '0033'B4;
    IF CHG_CODE^=@0_0 & CHG_CODE^=@1_1 & CHG_CODE^=@X_X & CHG_CODE^=@Z_Z
        THEN DO;
        /* Propagate fault lists if there are any. */
        IF ELIST^=EMIT_ELMTBASE | DETECT.FAULT_LIST^=ELMTBASE THEN DO;
            CALL FLT$PFL(EVTBASE,P,EMIT_ELMTBASE,ELMTBASE);
            END;
        /* Update input. */
        POS=P->IN_ITEM.POS;
        SUBSTR(DETECT.B_VALUE,POS,1)=SUBSTR(UNSPEC(CHG_CODE),16,1);
        SUBSTR(DETECT.ZX_VALUE,POS,1)=SUBSTR(UNSPEC(CHG_CODE),15,1);
        DETECT.GOOD_CHG_TIME=TIMSTEP;
        /* Schedule last event to do detection reporting. */
        IF DETECT.LE_FLAG=0 THEN DO;
            DETECT.LE_FLAG=1;
            LEFLG=1;
            ALLOC LAST_EVENT SET(Q);
            Q->LAST_EVENT.NEXT=DETLE;
            Q->LAST_EVENT.DATA=ELMTBASE;
            DETLE=Q;
            END;
        END;
    GOTO NEXT_ITEM;

ITEM_TYPE(@DET_STROBE):;                /* Testpoint strobe input. */
    ELMTBASE=P->IN_ITEM.TOP_PTR;
    DETECT.STROBE_CHG_TIME=TIMSTEP;
    P->IN_ITEM.POS=EVENT.CHG_CODE;
```

```
      /* Schedule last event to do detection reporting. */
      IF DETECT.LE_FLAG=0 THEN DO;
         DETECT.LE_FLAG=1;
         LEFLG=1;
         ALLOC LAST_EVENT SET(Q);
         Q->LAST_EVENT.NEXT=DETLE;
         Q->LAST_EVENT.DATA=ELMTBASE;
         DETLE=Q;
         END;
      GOTO NEXT_ITEM;

ITEM_TYPE(@TRACDET):;        /* TRACE DETECTION BLOCK */

ITEM_TYPE(@DPCOLLECT):;      /* DATA PATH COLLECTION BLOCK */

NEXT_ITEM:            /* END OF DO REPEAT LOOP */
   END;

END SIM$TM;
/* WHN$G.DEREMER, THEMISSRC>SOURCE>WHN$, CAD/CAM, 06/11/82             */
/* Grammar for logic analyzer WHEN and TRACE command data input        */
/* Copyright (C) 1982, Prime Computer, Inc., Natick, Ma 01760          */

%PARSER WHN$G (WINDOW,DONE,NO_WHEN_TESTS,DSCBASE,SRCBASE);

/*---------------------------------------------------------------------*/
/*                                                                     */
/* History:                                                            */
/* Date       Programmer    Description                                */
/* 08/05/83   RICKS         Moved trace on window code from whn$mn to here. */
/* 04/25/83   RICKS         Modified to precompile action lists.       */
/* 01/25/83   RICKS         Modified to save Action list source code.  */
/* 12/16/82   RICKS         Modified to handle CLOCKS.                 */
/* 12/13/82   RICKS         Print err if NO_WHEN_TESTS & action lists entrd */
/* 09/16/82   RICKS         Handles traceing of registers and memories */
/* 06/11/82   RBS           Now accepts commas between tests           */
/*                                                                     */
/*---------------------------------------------------------------------*/
/* HISTORY:                                                            */
/*         MON, 19 NOV 1981 -RBS- CREATED                              */
/*         WED, 16 DEC 1981 -RBS- WHN$CI NOW RETURNS PRINTMODE, WHICH IS */
/*                                STORED IN WHENGATE STRUCTURE.        */
/*         FRI, 18 DEC 1981 -RBS- ADDED TRACE CAPABILITY.              */
/*         WED, 10 FEB 1982 -RBS- MADE DECIMAL THE DEFAULT CONSTANT RADIX */
/*         FRI, 05 MAR 1982 -RBS- STORE CONST MSB..LSB INSTEAD OF LSB..MSB */
/*         WED, 17 MAR 1982 -RBS- WHN$DWG -> GTS$DWG                   */
/*         FRI, 02 APR 1982 -RBS- INCREASED @MXCONSTSZ TO 64           */
/*                                                                     */
/*---------------------------------------------------------------------*/

/*---------------------------------------------------------------------*/
/* This procedure handles both WHEN and TRACE test specification       */
/* parsing, block allocation and initialization. The only differences  */
/* between WHEN and TRACE control blocks are the type codes. The grammar */
/* for data input is also identical, except that trace blocks do not support */
/* action lists.                                                       */
/*---------------------------------------------------------------------*/

/* WHN$G.DEREMER, THEMISSRC>SOURCE>WHN$, CAD/CAM, 06/11/82             */

%SYSTEM INHIBIT;

%DECLARATIONS

%INCLUDE 'CADSRC>INSERT>MAX_NAMSIZ.INS.SPL'; /* Incl first */
    %INCLUDE 'THEMISSRC>SOURCE>WHN$>TRACE_ITEM.INS.SPL';
    %INCLUDE 'THEMISSRC>INSERT>STORAGE_TRACE_BLOCK.INS.SPL';
    %INCLUDE 'THEMISSRC>INSERT>INP$GVR_CODES.PL1G';
    %INCLUDE 'CADSRC>ENTRIES>OUT$MSG.INS.SPL';
```

```
%INCLUDE 'THEMISSRC>INSERT>WHEN_SIZE_LIMITS.PL1G';
%INCLUDE 'THEMISSRC>INSERT>WHEN_TESTCODES.PL1G';
%INCLUDE 'THEMISSRC>INSERT>WHENGATE.PL1G';
%INCLUDE 'THEMISSRC>INSERT>CONTROL_BLOCKS.INS.SPL';
%INCLUDE 'CADSRC>INSERT>LINE.INS.SPL';
%INCLUDE 'THEMISSRC>INSERT>TYPECODE.PL1G';
%INCLUDE 'CADSRC>INSERT>RESPND_CODES.INS.SPL';  /* before INPUT_BUFFER */
%INCLUDE 'CADSRC>INSERT>INPUT_BUFFER.SPL';
%REPLACE &MXCONSTSZ BY 64;

DCL WINDOW              BIT(1) ALIGNED;         /* IN - TRACE ON WINDOW?      */
DCL DONE                BIT(1) ALIGNED,         /* OUT - WHEN DATA INPUT DONE */
    NO_WHEN_TESTS       BIT(1) ALIGNED,         /* IO -Any tests entered yet ?*/
    DSCBASE             PTR OPTIONS(SHORT),     /* OUT - WHN OR TRACE DESC PTR*/
    SRCBASE             PTR OPTIONS(SHORT);     /* IO - To list of command src*/

/*------------------------------------------------------------------------*/

DCL LEXER       ENTRY(FIXED BIN(15), POINTER);
DCL UNRCGZ      ENTRY();
DCL WHNSUNW     ENTRY((&MXGVR_STK) FIXED BIN(15), FIXED BIN(15),
                     (&MXGVR_STK) PTR,           FIXED BIN(15),
                     FIXED BIN(15), PTR OPTIONS(SHORT),
                     FIXED BIN(15),   FIXED BIN(15))
                RETURNS(BIT(1) ALIGNED);
DCL GTS$DWG     ENTRY(PTR OPTIONS(SHORT));
DCL GTS$DSTB    ENTRY(PTR OPTIONS(SHORT));
DCL GTS$GSTV    ENTRY(PTR OPTIONS(SHORT), FIXED BIN(15),
                     BIT(*) ALIGNED, BIT(*) ALIGNED);
DCL GTS$SSRC    ENTRY(PTR OPTIONS(SHORT),CHAR(*),FIXED BIN(15));
DCL WHN$ACTG    ENTRY(FIXED BIN(15),BIT(1) ALIGNED,PTR OPTIONS(SHORT))
                RETURNS(PTR);
DCL NEWRSP      ENTRY(CHAR(6),FIXED BIN(15),FIXED BIN(15));
DCL WHN$PTS     ENTRY(CHAR(1024) VAR, CHAR(&MXTERMLN) VAR);
DCL WHN$AWG     ENTRY(PTR OPTIONS(SHORT),PTR OPTIONS(SHORT));
DCL WHN$ASTB    ENTRY(PTR OPTIONS(SHORT),FIXED BIN(15),PTR OPTIONS(SHORT));
DCL SUBSCNVB    ENTRY(BIT(1) ALIGNED, CHAR(*), FIXED BIN(15),
                     FIXED BIN(15), FIXED BIN(15),
                     FIXED BIN(15), (*) FIXED BIN(15),
                     (*) FIXED BIN(15))
                RETURNS(BIT(1) ALIGNED);
DCL INP$GVR     ENTRY((&MXGVR_STK) FIXED BIN(15), FIXED BIN(15),
                     (&MXGVR_STK) PTR,           FIXED BIN(15))
                RETURNS(PTR);
DCL WND$GTLN    ENTRY(FIXED BIN(15)) RETURNS(FIXED BIN(15));

/****************************************************************************/

DCL NAMDEPTH                    FIXED BIN(15);
DCL NAMSTK(&MXGVR_STK)          PTR;
DCL RPNDEPTH                    FIXED BIN(15);
DCL RPNSTK(&MXGVR_STK)          FIXED BIN(15);
DCL NAMELIST                    PTR OPTIONS(SHORT);
DCL TOKEN_VALUE                 CHAR(100) VARYING BASED;
DCL ELMTBASE                    PTR OPTIONS(SHORT);
DCL TSTCODE                     FIXED BIN(15);
DCL TYPE                        FIXED BIN(15);
DCL B_VAL                       BIT(&MX_TRCBITS) ALIGNED;
DCL ZX_VAL                      BIT(&MX_TRCBITS) ALIGNED;
DCL RADIX_FLAG                  BIT(1) ALIGNED;
DCL BIT_WID                     FIXED BIN(15);
DCL CONSTANT                    CHAR(&MXCONSTSZ);
DCL SIZE                        FIXED BIN(15);
DCL #BITS                       FIXED BIN(15);
DCL #TRACE_BITS                 FIXED BIN(15);
DCL STB_PTR                     PTR OPTIONS(SHORT);
DCL BARRAY(&MXBZXARRAY)         FIXED BIN(15);
DCL ZXARRAY(&MXBZXARRAY)        FIXED BIN(15);
DCL BITVAL(0:1)                 BIT(1) ALIGNED STATIC INIT('0'B,'1'B);
DCL I                           FIXED BIN(15);
DCL TESTERR                     BIT(1) ALIGNED;
```

```
    DCL #ALCD_WHENGATES          FIXED BIN(15);
    DCL #ALCD_STG_TRACE_BLKS     FIXED BIN(15);
    DCL OLD_NO_WHEN_TESTS        BIT(1) ALIGNED;
    DCL INLINE                   CHAR(1024) VAR;
    DCL TERM                     CHAR(@MXTERMLN) VAR;
    DCL BRKT_DEPTH               FIXED BIN(15);
    DCL ACTIONS                  PTR OPTIONS(SHORT);
    DCL LAST                     PTR OPTIONS(SHORT);
    DCL WINDOW_LINE_NUM          FIXED BIN(15);

%REPLACE  @TRUE     BY '1'B;
    %REPLACE  @FALSE    BY '0'B;

/*---------------------------------------------------------------*/
/*                                                               */
/* Initialization Code                                           */
/*---------------------------------------------------------------*/

DONE=@FALSE;
    TSTCODE=@ONCHANGE;
    BIT_WID=0;
    TESTERR=@FALSE;
    OLD_NO_WHEN_TESTS=NO_WHEN_TESTS;

/* SAVE THE INPUT LINE FOR PARSING. THE WHEN TESTS WILL BE EXTRACTED */
    /* AND SAVED FOR SUBSEQUENT PRINTING.                                */

INLINE=SUBSTR(LINEX.LINE,1,LINEX.NLINE);

/* The following counters will keep track of the number of WHENGATEs */
    /* and STG_TRACE_BLKs allocated when this line is parsed. If an error*/
    /* occurs, all WHENGATEs and STG_TRACE_BLKs allocated for this line  */
    /* of input are freed.                                               */
    #ALCD_WHENGATES=0;
    #ALCD_STG_TRACE_BLKS=0;
    WINDOW_LINE_NUM=0;

%END_DECLARATIONS ;

%ERROR
                /*-------------------------------------------------*/
                /* All Deremer syntax errors exit to here.         */
                /*-------------------------------------------------*/

CALL UNRCGZ;

/*-------------------------------------------------*/
                /* All semantic errors exit to here.               */
                /*-------------------------------------------------*/

/* DELETE ALL WHEN GATES THAT HAVE BEEN ALLOCATED AS A */
                /* RESULT OF PARSING THIS LINE OF INPUT.               */
    ERROR:      DP$_LOOKAHEAD_VALID = @FALSE;
                DO I=1 TO #ALCD_WHENGATES;
                    /* UNHOOK THE WHEN GATE FROM THE WHEN DESCRIPTOR. */
                    ELMTBASE=WHNDSC.GATES;
                    /* HOOK NEXT WHEN GATE TO THE WHEN DESCRIPTOR.    */
                    WHNDSC.GATES=WHENGATE.RING_PTR;
                    /* DELETE THE WHEN GATE.                          */
                    CALL GTS$DWG(ELMTBASE); /* Delete When Gate.      */
                END;
                /* Delete all allocated STORAGE_TRACE_BLOCKS.         */
                DO I=1 TO #ALCD_STG_TRACE_BLKS;
                    /* Unhook the trace block from the trace descriptor. */
                    ELMTBASE=WHNDSC.STG_TRACE_BLKS;
                    /* Hook the next trace block to the trace descriptor.*/
                    WHNDSC.STG_TRACE_BLKS=ELMTBASE->STG_TRACE_BLOCK.NEXT;
                    CALL GTS$DSTB(ELMTBASE); /* Delete Stg Trace Block. */
                END;
                /* RESET GATE COUNT                                   */
                WHNDSC.#TERMS=WHNDSC.#TERMS-#ALCD_STG_TRACE_BLKS-#ALCD_WHENGATES;
                NO_WHEN_TESTS=OLD_NO_WHEN_TESTS;
    %END_ERROR;
```

```
%STACK
    200 EXTERNAL;

$INSERT AIDSSRC>INSERT>TOKENS_LIST.PARSER

%RULES;

/**================================================================**/

<COMMAND>        ::= <TESTS> S_EOL

%ACTION

/** <COMMAND>        ::= <TESTS> S_EOL                          */

%END_ACTION
;

/**----------------------------------------------------------------*/

<COMMAND>        ::= S_EOL

%ACTION

/** <COMMAND>        ::= S_EOL                                  */

DONE=@TRUE;
    %END_ACTION
;

/**----------------------------------------------------------------*/

<COMMAND>        ::= $L_SQBRKT <ACTION_LIST>

%ACTION
    /** <COMMAND>        ::= $L_SQBRKT <ACTION_LIST> **/

%END_ACTION
;

/**================================================================**/

<TESTS>          ::= <TESTS> VERTBAR$ <TEST>;

<TESTS>          ::= <TESTS> $COMMA <TEST>;

<TESTS>          ::=  <TEST>;

/**----------------------------------------------------------------*/

<TEST>           ::= <SIGNAL> [TESTSPEC]

%ACTION

/** <TEST>          :: <SIGNAL> [TESTSPEC]                      */

IF WHNDSC.#TERMS+1>@MXWHNTERMS THEN DO;
        MESSAGE='The maximum allowable number of tests '||
                '('||TRIM(CHARACTER(@MXWHNTERMS),'11'B)||') '||
                ' has already been entered.'||
                'Have System Administrator increase "@MXWHNTERMS".';
        CALL OUT$MSG(@ERROR_PL,MESSAGE);
        END;
    ELSE DO;

/* Unwind all the names in the concatenation.               */

TESTERR=WHN$UNW(RPNSTK,R>NDEPTH,NAMSTK,NAMDEPTH,TSTCODE,NAMELIST,TYPE,
                       #TRACE_BITS);

/* EXTRACT THE TEST SPECIFICATION FROM THE INPUT LINE AND SAVE  */
        /* IN THE WHEN DESCRIPTOR CONTROL BLOCK FOR PRINTING WHEN (1)   */
```

```
/* A WHEN BREAK IS DETECTED, AND (2) A LIST COMMAND IS GIVEN.       */
/* ALSO USED IN TRACE MESSAGES.                                     */

CALL WHN$PTS(INLINE,TERM);

/* If this is a TRACE ON WINDOW, make sure there is room on the    */
/* window.                                                          */
IF WINDOW THEN DO;
   WINDOW_LINE_NUM=WND$GTLN(WHNDSC.WHEN#);
   IF WINDOW_LINE_NUM=0 THEN DO;
      CALL OUT$MSG(@ERROR, 'Can not add ' ||
                   TERM ||
                   ' to the window, as there is not enough space.');
      TESTERR=@TRUE;
      /* No sense in continuing. All further vars will be rejected. */
      DONE=@TRUE;
      END;
   END;

/* If lookup error or no room on window, then take the error exit. */
IF TESTERR THEN GOTO ERROR;

IF TSTCODE=@EQLCONST THEN DO;
   /* Convert the constant to internal bit format.                  */
   RADIX_FLAG=@TRUE;
   IF ^SUB$CNVB(RADIX_FLAG,CONSTANT,SIZE,BIT_WID,@MXBZXARRAY,#BITS,
      BARRAY,ZXARRAY) THEN DO;
      MESSAGE='Unable to convert supplied constant '||CONSTANT||
              '.';
      CALL OUT$MSG(@ERROR,MESSAGE);
      TESTERR=@TRUE;
      END;
   ELSE DO;
      /* Check to see if number of bits exceeds max allowed for    */
      /* tracing.                                                  */
      IF #BITS > @MX_TRCBITS THEN DO;
         MESSAGE='Number of bits in constant specification '||
                 SUBSTR(CONSTANT,1,SIZE)||' exceeds '||
                 'maximum number of bits ('||CHAR(@MX_TRCBITS)||
                 ') allowed.';
         CALL OUT$MSG(@ERROR_PL,MESSAGE);
         TESTERR=@TRUE;
         END;
      IF #BITS > #TRACE_BITS THEN DO;
         MESSAGE='The '||CHAR(#BITS-#TRACE_BITS)||
                 ' high order bit(s) of '||
                 SUBSTR(CONSTANT,1,SIZE)||
                 ' will be truncated.';
         CALL OUT$MSG(@WARN,MESSAGE);
         #BITS=#TRACE_BITS;
         END;
      /* CONVERT FIXED BIN CODES TO BIT CODES. */
      /* STORE AS MSB....SB                    */
      B_VAL='0'B; /* CLEARS ENTIRE ARRAY */
      ZX_VAL='0'B;
      DO I=1 TO #BITS;
         IF BARRAY(I)>1 | BARRAY(I)<0 |
            ZXARRAY(I)<0 | ZXARRAY(I)>1 THEN DO;
            MESSAGE='An unexpected value was returned by'||
                    ' the SUB$CNVB routine (WHN$G).';
            CALL OUT$MSG(@ERROR_PE,MESSAGE);
            BARRAY(I)=0;
            ZXARRAY(I)=1;
            END;
         SUBSTR(B_VAL,@MX_TRCBITS-I+1,1)=BITVAL(BARRAY(I));
         SUBSTR(ZX_VAL,@MX_TRCBITS-I+1,1)=BITVAL(ZXARRAY(I));
         END;
      END;
   BIT_WID=0;
   END;

IF TYPE=@TRACE_REG | TYPE=@TRACE_MEM |TYPE=@TRACE_CLK THEN DO;
```

```
                #ALCD_STG_TRACE_BLKS=#ALCD_STG_TRACE_BLKS+1;
                CALL WHN$ASTB(NAMELIST,TYPE,STB_PTR);
                STB_PTR->STG_TRACE_BLOCK.NEXT=WHNDSC.STG_TRACE_BLKS;
                WHNDSC.STG_TRACE_BLKS=STB_PTR;
                WHNDSC.#TERMS=WHNDSC.#TERMS+1;
                STB_PTR->STG_TRACE_BLOCK.TSTCODE=TSTCODE;
                STB_PTR->STG_TRACE_BLOCK.DSCBASE=DSCBASE;
                STB_PTR->STG_TRACE_BLOCK.TERMPOS=WHNDSC.#TERMS;
                STB_PTR->STG_TRACE_BLOCK.#BITS=#TRACE_BITS;
                STB_PTR->STG_TRACE_BLOCK.CONST_B_VAL=B_VAL;
                STB_PTR->STG_TRACE_BLOCK.CONST_ZX_VAL=ZX_VAL;
                STB_PTR->STG_TRACE_BLOCK.WINDOW_LINE_NUM=WINDOW_LINE_NUM;
                I=STB_PTR->STG_TRACE_BLOCK.CONCAT_LIST->WATCH_STG.BEG_ADRS;
                CALL GTS$GSTV(STB_PTR->STG_TRACE_BLOCK.CONCAT_LIST,
                        I, /* Address of memory                            */
                        STB_PTR->STG_TRACE_BLOCK.B_VAL,
                        STB_PTR->STG_TRACE_BLOCK.ZX_VAL);
                END;
            ELSE IF TYPE=@TRACE_SIG THEN DO;
                /* Allocate the WHENGATE.                                  */
                #ALCD_WHENGATES=#ALCD_WHENGATES+1;
                CALL WHN$AWG(NAMELIST,ELMTBASE);
                /* Insert the WHENGATE at the head of the list of WHENGATEs */
                /* for this WHEN DESCRIPTOR.                               */
                WHENGATE.RING_PTR=WHNDSC.GATES;
                WHNDSC.GATES=ELMTBASE;
                WHENGATE.CONST_B_VAL=B_VAL;
                WHENGATE.CONST_ZX_VAL=ZX_VAL;
                WHENGATE.TSTCODE=TSTCODE;
                WHENGATE.DSCBASE=DSCBASE;
                WHENGATE.WINDOW_LINE_NUM=WINDOW_LINE_NUM;
                WHNDSC.#TERMS=WHNDSC.#TERMS+1;
                WHENGATE.TERMPOS=WHNDSC.#TERMS;
                END;

WHNDSC.TERMS(WHNDSC.#TERMS)=TERM;

/* Error message if no room in window. */

IF TESTERR THEN GOTO ERROR;
        ELSE NO_WHEN_TESTS=@FALSE;
        END;
        /* REINITIALIZE VARIABLES FOR NEXT TEST.                           */
        TSTCODE=@ONCHANGE;
        TESTERR=@FALSE;
        %END_ACTION
    ;

/*-------------------------------------------------------------------------*/

[TESTSPEC]        ::=

%ACTION

/** [TESTSPEC]        ::=                                              */

TSTCODE=@ONCHANGE;
    %END_ACTION
    ;

/*-------------------------------------------------------------------------*/

[TESTSPEC]        ::= $EQL <TESTCODE>

%ACTION

/** [TESTSPEC]        ::=    $EQL <TESTCODE>                           */

%END_ACTION
    ;

/*-------------------------------------------------------------------------*/
```

```
<TESTCODE>          ::= PLUS$

%ACTION

/** [TESTCODE]         ::=     PLUS$                                   */
     TSTCODE=&ONINC;
     %END_ACTION
;

/**----------------------------------------------------------------*/

<TESTCODE>          ::= S_INTEGER

%ACTION

/** <TESTCODE>          ::=     S_INTEGER                              */

CONSTANT=$1->TOKEN_VALUE || ":D";
    SIZE=LENGTH($1->TOKEN_VALUE)+2;
    TSTCODE=&EQLCONST;
    %END_ACTION
;

/**----------------------------------------------------------------*/

<TESTCODE>          ::= S_CONST
%ACTION

/** <TESTCODE>          ::=     S_CONST                                */

CONSTANT=$1->TOKEN_VALUE;
    SIZE=LENGTH($1->TOKEN_VALUE);
    TSTCODE=&EQLCONST;
    %END_ACTION
;

/**----------------------------------------------------------------*/

<TESTCODE>          ::= S_CONST <WIDTH>
%ACTION

/** <TESTCODE>          ::=   S_CONST <WIDTH>                          */
    CONSTANT=$1->TOKEN_VALUE;
    SIZE=LENGTH($1->TOKEN_VALUE);
    TSTCODE=&EQLCONST;
    %END_ACTION
;

/**----------------------------------------------------------------*/

<WIDTH>          ::= $L_PAREN S_INTEGER $R_PAREN
%ACTION

/** <WIDTH>          ::=   $L_PAREN S_INTEGER $R_PAREN                 */

BIT_WID=$2->TOKEN_VALUE;
    %END_ACTION
;

/**----------------------------------------------------------------*/

<TESTCODE>          ::= STAR$

%ACTION

/** <TESTCODE>          ::=     STAR$                                  */

TSTCODE=&ONCHANGE;
    %END_ACTION
;

/**----------------------------------------------------------------*/
```

```
<TESTCODE>              ::= MINUS$

%ACTION

/** <TESTCODE>       ::= MINUS$                                          */
    TSTCODE=@ONDEC;
    %END_ACTION
;

/**------------------------------------------------------------------------**/

<SIGNAL>                ::=

%ACTION

/** <SIGNAL>         ::=                                                 */

RPNDEPTH=0;
    NAMDEPTH=0;
    $$ = INP$GVR(RPNSTK,RPNDEPTH,NAMSTK,NAMDEPTH);
    IF $$ = NULL() THEN DO;
        MESSAGE='Variable specification entered incorrectly. '||
                'Check syntax (WHN$G).';
        CALL OUT$MSG(@ERROR,MESSAGE);
        GOTO ERROR;
        END;
    %END_ACTION
;

/**------------------------------------------------------------------------**/

<ACTION_LIST>           ::=

%ACTION

BRKT_DEPTH=1;
    LAST=NULL;
    IF NO_WHEN_TESTS THEN DO;
        MESSAGE='An action list cannot be entered if there are no '||
                'WHEN tests to trigger it!';
        CALL OUT$MSG(@ERROR,MESSAGE);
        DONE=@TRUE;
        END;
    ELSE DO;
        /* WHN$ACTG reads a line of action list input, allocates an input */
        /* buffer line, and returns a ptr to the line of input, which is  */
        /* then placed in the list of input lines for this when descriptor*/
        DO WHILE(^DONE);
            IF (WHN$ACTG(BRKT_DEPTH,DONE,ACTIONS)^=NULL) THEN DO;
                IF LAST=NULL THEN DO; /* ATTACH BUFLINE TO WHEN CONTROL BLOCK. */
                    WHNDSC.ACTIONS=ACTIONS;
                    LAST=ACTIONS;
                    END;
                ELSE DO; /* ATTACH TO LAST ACTION ITEM */
                    LAST->BUFLINE.NEXT=ACTIONS;
                    LAST=ACTIONS;
                    END;
                END;
            IF ^DONE THEN DO;
                /* Save action list source before reading new input line.  */
                /* Note that the last line of action list input is save by */
                /* WHN$MN, and so should not be save here.                 */
                CALL GTS$SSRC(SRCBASE,LINEX.LINE,LINEX.NLINE);
                CALL NEWRSP('ACT: ',5,0);
                END;
            ELSE DO;
                /* Append Delimit Action List control command to end of action */
                /* list.                                                       */
                ALLOCATE BUFLINE SET(ACTIONS);
                ACTIONS->BUFLINE.DATA=';;;DAL';
                ACTIONS->BUFLINE.NEXT=NULL;
                LAST->BUFLINE.NEXT=ACTIONS;
```

```
            END;
          END;
        END;
     %END_ACTION
  ;

/*==================================================================*/
     %PROGRAMS;
     %END_PROGRAMS;
     %END_PARSER;
/* WHNSAWG.SPL, THEMISSRC>SOURCE>WHNS, CAD/CAM, 09/13/82           */

/* WHNSAWG.SPL, THEMISSRC>SOURCE>WHNS, CAD/CAM, 09/13/82           */
/* Allocate WHENGATE                                                */
/* COPYRIGHT (C) 1982, Prime Computer, Inc., Natick, Ma 01760       */

WHNSAWG: PROCEDURE(NAMELIST,ELMTBASE);

/*----------------------------------------------------------------*/
/* Description:                                                    */
/*    This procedure takes as input a list of slot  pointers, which */
/* comprise the concatenated signals to be monitored, and returns a pointer */
/* to the WHENGATE occurrence structure. The io slots in the list are */
/* connected to the inputs of the WHENGATE. The list is freed as it is */
/* processed.                                                      */
/*----------------------------------------------------------------*/
/*                                                                 */
/* History:                                                        */
/* Date        Programmer   Description of modification            */
/* 10/05/83    RICKS        Modified to handle new force gate structure */
/* 05/11/83    LORNE        Added initialization for window_line_num */
/* 04/11/83    RICKS        Fault list points to ELMTBASE          */
/* 09/13/83    RICKS        Initial coding.                        */
/*----------------------------------------------------------------*/

DCL NAMELIST              PTR OPTIONS(SHORT); /* IN - To list of slot ptrs */
DCL ELMTBASE              PTR OPTIONS(SHORT); /* OUT - To WHENGATE */

DCL IN#                   FIXED BIN(15);
DCL P                     PTR OPTIONS(SHORT);
DCL ITEMBASE              PTR OPTIONS(SHORT);

DCL NULL                  BUILTIN;

%INCLUDE 'CADSRC>INSERT>MAX_NAMSIZ.INS.SPL';
%INCLUDE 'THEMISSRC>INSERT>NETCODE.PL1G';
%INCLUDE 'THEMISSRC>INSERT>WHEN_SIZE_LIMITS.PL1G';
%INCLUDE 'THEMISSRC>INSERT>WHENGATE.PL1G';
%INCLUDE 'THEMISSRC>INSERT>TYPECODE.PL1G';
%INCLUDE 'THEMISSRC>SOURCE>WHNS>TRACE_ITEM.INS.SPL';
%INCLUDE 'CADSRC>INSERT>SYMBOLS.INS.SPL';

%REPLACE @TRUE BY '1'B;
%REPLACE @FALSE BY '0'B;

/* Allocate and initialize the WHENGATE structure.                 */

ALLOC WHENGATE SET(ELMTBASE);
WHENGATE.CODE=&WHENGATE;
WHENGATE.#INPUTS=0;
WHENGATE.SIM_FLAG=0;
WHENGATE.FAULT_LIST=ELMTBASE;
WHENGATE.B_VAL='0'B;
WHENGATE.ZX_VAL='0'B;
WHENGATE.LAST_B_VAL='0'B;
WHENGATE.LAST_ZX_VAL='0'B;
WHENGATE.WINDOW_LINE_NUM = 0;

/* Connect WHENGATE inputs to monitored signals.                   */
```

```
DO WHILE(NAMELIST¬=NULL);
   WHENGATE.#INPUTS=WHENGATE.#INPUTS+1;
   IN#=@MX_TRCBITS-WHENGATE.#INPUTS+1; /* Position of value in B,ZX strings. */
   ITEMBASE=ADDR(WHENGATE.INPUTS(WHENGATE.#INPUTS));
   WHENGATE.PMODE=NAMELIST->TRACE_ITEM.SYMBBASE->GEN_PIN.PRT_MODE;
   CALL CONNECT_WG_INPUT(ELMTBASE,ITEMBASE,IN#,NAMELIST->TRACE_ITEM.IOSLOT);
   P=NAMELIST;
   NAMELIST=P->TRACE_ITEM.NEXT;
   FREE P->TRACE_ITEM;
   END;

RETURN;

/*===============================================================================*/

CONNECT_WG_INPUT: PROC(WGBASE,ITEMBASE,INPUT#,SLOT_PTR);

%INCLUDE *THEMISSRC>INSERT>ITEM.PL1G*;
   %INCLUDE *THEMISSRC>INSERT>FORCE_GATE.INS.SPL*;

DCL WGBASE            POINTER OPTIONS(SHORT);  /* IN - Points to WHENGATE  */
/* DCL ITEMBASE          POINTER OPTIONS(SHORT);     IN - To WHENGATE in slot */
   DCL INPUT#            FIXED BIN(15);           /* IN - Pos of val in B,ZX  */
   DCL SLOT_PTR          POINTER OPTIONS(SHORT);  /* IN - To monitored SLOT   */

DCL ELMTBASE          POINTER OPTIONS(SHORT);
   DCL NETVAL            FIXED BIN(15);
   DCL FORCED_OUTPUT     BIT(1) ALIGNED;
   DCL BITNETVAL         BIT(16) ALIGNED;

DCL GTSSGPV           ENTRY(PTR OPTIONS(SHORT),PTR OPTIONS(SHORT),
                               BIT(1) ALIGNED)
                         RETURNS(FIXED BIN(15));

/*------------------------------------------------------------------*/
   /* IF THIS OUTPUT FEEDS A FORCE GATE, THEN THE WHENGATE SHOULD MONITOR */
   /* THE OUTPUT OF THE FORCE GATE.                                    */
   /*------------------------------------------------------------------*/

%INCLUDE *THEMISSRC>INSERT>FORCED_OUTPUT.INS.SPL*;
   IF FORCED_OUTPUT THEN DO;
      ELMTBASE=SLOT_PTR->NET_ITEM.NEXT_PTR->BOO_ITEM.TOP_PTR;
      SLOT_PTR=ADDR(ELMTBASE->FORCE_GATE.IO(@FG_OUT_SLOT));
      IF FORCE_GATE.IO(@FG_OUT_S_OT).NEXT_PTR=SLOT_PTR THEN
         /* This is an inverting force gate. */
         SLOT_PTR=ADDR(FORCE_GATE.IO(@FG_INVOUT_SLOT));
      END;

/*------------------------------------------------------------------*/
   /* Get the value on the monitored net.                              */
   /*------------------------------------------------------------------*/

NETVAL=GTSSGPV(SLOT_PTR,NULL,@FALSE);
   BITNETVAL=UNSPEC(NETVAL);

/*------------------------------------------------------------------*/
   /* Wire the input of the WHENGATE to the monitored net.             */
   /*------------------------------------------------------------------*/

IN_ITEM.CODE=@WHENDET;
   IN_ITEM.POS=INPUT#;
   IN_ITEM.NEXT_PTR=SLOT_PTR->IN_ITEM.NEXT_PTR;
   SLOT_PTR->IN_ITEM.NEXT_PTR=ITEMBASE;
   IN_ITEM.TOP_PTR=WGBASE;

/*------------------------------------------------------------------*/
   /* Update current and last B_VAL and ZX_VAL                         */
   /*------------------------------------------------------------------*/

SUBSTR(WGBASE->WHENGATE.B_VAL, INPUT#,1) = SUBSTR(BITNETVAL,16,1);
   SUBSTR(WGBASE->WHENGATE.ZX_VAL,INPUT#,1) = SUBSTR(BITNETVAL,15,1);
```

```
    SUBSTR(WGBASE->WHENGATE.LAST_3_VAL, INPUT#,1) = SUBSTR(BITNETVAL,16,1);
    SUBSTR(WGBASE->WHENGATE.LAST_2X_VAL,INPUT#,1) = SUBSTR(BITNETVAL,15,1);

END CONNECT_WG_INPUT;

END WHN$AWG;

/* SIMSWHN.SPL, THEMISSRC>SOURCE>SIMS, CAD/CAM, 09/13/82                       */
/* Evaluate WHEN GATE                                                          */
/* COPYRIGHT (C) 1982, Prime Computer, Inc., Natick, Ma 01760                  */

SIM$WHN: PROC(ELMTBASE);

/*---------------------------------------------------------------------------*/
/* History:                                                                   */
/* Date      Programmer    Description of modification                        */
/* 05/16/83  LORNE         Added print-mode to trace-to-window data           */
/* 05/04/83  LORNE         Support for trace-to-window                        */
/* 04/25/83  RICKS         Added precompiled action lists.                    */
/* 03/08/83  LORNE         Added out$msg include                              */
/* 09/13/82  RICKS         Modifications to support REG, MEM traceing         */
/*---------------------------------------------------------------------------*/
/* HISTORY:                                                                   */
/*     01 DEC 81 -RBS- CREATED                                                */
/*---------------------------------------------------------------------------*/

%INCLUDE 'CADSRC>INSERT>MAX_NAMSIZ.INS.SPL';
%INCLUDE 'CADSRC>ENTRIES>OUT$MSG.INS.SPL';
%INCLUDE 'THEMISSRC>INSERT>LAST_EVENT.INS.SPL';
%INCLUDE 'THEMISSRC>INSERT>EVTCODE.PL1G';
%INCLUDE 'THEMISSRC>INSERT>EVENT.PL1G';
%INCLUDE 'THEMISSRC>INSERT>WHEN_TESTCODES.PL1G';
%INCLUDE 'THEMISSRC>INSERT>WHEN_SIZE_LIMITS.PL1G';
%INCLUDE 'THEMISSRC>INSERT>WHENGATE.PL1G';
%INCLUDE 'THEMISSRC>INSERT>CONTROL_BLOCKS.INS.SPL';
%INCLUDE 'THEMISSRC>INSERT>WHEEL.PL1G';
%INCLUDE 'THEMISSRC>INSERT>GLOBAL.PL1G';
%INCLUDE 'THEMISSRC>INSERT>WINDOW.INS.SPL';

%REPLACE @TRUE BY '1'B;
%REPLACE @FALSE BY '0'B;
%REPLACE @FTN_TRUE BY 1;
%REPLACE @FTN_FALSE BY 0;

DCL ELMTBASE            POINTER OPTIONS(SHORT); /* IN - Points to WHENGATE */
DCL WHENTEST            BIT(1) ALIGNED,
    WHENTERM            CHAR(@MXTERMLN) VAR,
    EQLLOC              FIXED BIN(15),
    ACTIVE_TERM         FIXED BIN(15),
    RC                  FIXED BIN(15),
    STR                 CHAR(@MXSTRLN) VAR,
    VALSTR              CHAR(128) VAR,
    MODECHAR            CHAR(1),
    P                   PTR OPTIONS(SHORT),
    TEMP_CUR_VAL        BIT(@MX_TRCBITS) ALIGNED,
    TEMP_OLD_VAL        BIT(@MX_TRCBITS) ALIGNED;

DCL NULL                BUILTIN;

DCL GTS$INFR            ENTRY(PTR OPTIONS(SHORT),PTR OPTIONS(SHORT)),

OUT$RPT             ENTRY(POINTER,CHAR(@MXFLNM) VAR,FIXED BIN(15),
                              CHAR(@MXSTRLN) VAR,PTR OPTIONS(SHORT),
                              FIXED BIN(15))
                        RETURNS(BIT(1) ALIGNED),

GTS$CBVS            ENTRY(BIT(*) ALIGNED, BIT(*) ALIGNED,
                              BIT(*) ALIGNED, FIXED BIN(15),
                              FIXED BIN(15), CHAR(*) VAR);

/*---------------------------------------------------------------------------*/
/* Determine whether the WHEN test evaluates true.                            */
/*---------------------------------------------------------------------------*/
```

```
GOTO EVALUATE(WHENGATE.TSTCODE);

EVALUATE(@ONCHANGE):

/*---------------------------------------------------------------*/
        /* This explicit test is needed so that W0->0 AND W1->1 transitions */
        /* are not counted as changes. Otherwise, the mere fact that this   */
        /* routine was called would suffice.                                */
        /*---------------------------------------------------------------*/

WHENTEST=( WHENGATE.B_VAL^=WHENGATE.LAST_B_VAL |
                   WHENGATE.ZX_VAL^=WHENGATE.LAST_ZX_VAL);
        GOTO END_EVALUATION;

EVALUATE(@EQLCONST):

WHENTEST=( (WHENGATE.B_VAL=WHENGATE.CONST_B_VAL) &
                   (WHENGATE.ZX_VAL=WHENGATE.CONST_ZX_VAL) );
        GOTO END_EVALUATION;

EVALUATE(@ONINC):

/*---------------------------------------------------------------*/
        /* Z,X VALUES MAP ONTO 1                                         */
        /*---------------------------------------------------------------*/

TEMP_CUR_VAL=WHENGATE.B_VAL | WHENGATE.ZX_VAL;
        TEMP_OLD_VAL=WHENGATE.LAST_B_VAL | WHENGATE.LAST_ZX_VAL;
        WHENTEST=TEMP_CUR_VAL>TEMP_OLD_VAL;
        GOTO END_EVALUATION;

EVALUATE(@ONDEC):

/*---------------------------------------------------------------*/
        /* Z,X VALUES MAP ONTO 0                                         */
        /*---------------------------------------------------------------*/

TEMP_CUR_VAL=WHENGATE.B_VAL & ^WHENGATE.ZX_VAL;
        TEMP_OLD_VAL=WHENGATE.LAST_B_VAL & ^WHENGATE.LAST_ZX_VAL;
        WHENTEST=TEMP_CUR_VAL<TEMP_OLD_VAL;
        GOTO END_EVALUATION;

END_EVALUATION:

/*---------------------------------------------------------------*/
/* Cause break to occur if when evaluated true.                  */
/*---------------------------------------------------------------*/

IF WHENTEST=@TRUE THEN DO;
   DSCBASE=WHENGATE.DSCBASE;

/*---------------------------------------------------------------*/
    /* Raise the Last Event Flag. When all processing for a time     */
    /* step is completed, the "LAST EVENT" section of code will be   */
    /* executed. At this time scheduled last events will be processed and */
    /* the teststate flags will be cleared.                          */
    /* The STOPFLAG will be set in SIMSLE if a whenbreak has occurred. */
    /*---------------------------------------------------------------*/

LEFLG=@FTN_TRUE;
    ALLOC LAST_EVENT SET(P);
    P->LAST_EVENT.DATA=WHENGATE.DSCBASE;
    CALL GTS$INFR(TRACELE,P); /* Schedule last event.                */

/*---------------------------------------------------------------*/
    /* Indicate to SIMSLE that the test has evaluated true. SIMSLE will */
    /* clear the TESTSTATE flag. The count gets incremented only once. */
    /*---------------------------------------------------------------*/

IF WHNDSC.TESTSTATE=@TESTFALSE THEN WHNDSC.COUNT=WHNDSC.COUNT+1;
    WHNDSC.TESTSTATE=@TESTTRUE;
```

```
/*----------------------------------------------------------------------*/
/* Determine whether the control parameters will inhibit the break.     */
/*----------------------------------------------------------------------*/

IF ^WHNDSC.IGNORE & WHNDSC.COUNT>WHNDSC.AFTER &
   WHNDSC.COUNT<WHNDSC.BEFORE &
   MOD(COUNT,EVERY)=0 THEN DO;

GOTO TYPE(WHNDSC.TYPE);

TYPE(@WHEN):;
           /* Flag to SIM$LE implies exec action list. */
           WHNDSC.TESTSTATE=&3R<TRUE;
           /* Msg only if null action list. */
           IF WHNDSC.ACTIONS=NULL THEN CALL PRINT_WHEN_MESSAGE;
           GOTO END_TYPE;

TYPE(@TRACE):;
           CALL PRINT_TRACE_MESSAGE;
           GOTO END_TYPE;

TYPE(@PRECOMPILED_WHEN):;
           WHNDSC.TESTSTATE=&3R<TRUE;
           GOTO END_TYPE;

END_TYPE:;
   END;
END;

/*----------------------------------------------------------------------*/
/* UPDATE LAST INPUT VALUE.                                             */
/*----------------------------------------------------------------------*/

WHENGATE.LAST_B_VAL=WHENGATE.B_VAL;
WHENGATE.LAST_ZX_VAL=WHENGATE.ZX_VAL;

RETURN;

/*======================================================================*/

PRINT_WHEN_MESSAGE: PROC;

MESSAGE='******* WHEN BREAK '||
        CHARACTER(WHNDSC.WHEN#)||' OCCURRED ON ' ||
        WHNDSC.TERMS(WHENGATE.TERMPOS)||' ********';
CALL OUT$MSG(@NOTE,MESSAGE);

/*----------------------------------------------------------------------*/
/* Print old and new values.                                            */
/*----------------------------------------------------------------------*/
EQLLOC=INDEX(WHNDSC.TERMS(WHENGATE.TERMPOS),'=');
IF EQLLOC>0 THEN DO; /* Isolate signal id */
   WHENTERM=SUBSTR(WHNDSC.TERMS(WHENGATE.TERMPOS),1,EQLLOC-1);
   END;
ELSE DO;
   WHENTERM=WHNDSC.TERMS(WHENGATE.TERMPOS);
   END;
MESSAGE='STEP '||TRIM(CHARACTER(TIMSTEP),'11'B)||': '||
        TRIM(WHENTERM,'11'B)||' ';
MODECHAR=CVS(WHENGATE.PMODE); /* Get mode code to char        */
CALL GTS$CBVS(WHENGATE.LAST_B_VAL,WHENGATE.LAST_ZX_VAL,
              COPY('0'B,@MX_TRCBITS),WHENGATE.#INPUTS,
              WHENGATE.PMODE,VALSTR);
MESSAGE=MESSAGE||VALSTR||':'||MODECHAR||' --> ';
CALL GTS$CBVS(WHENGATE.B_VAL,WHENGATE.ZX_VAL,
              COPY('0'B,@MX_TRCBITS),
              WHENGATE.#INPUTS,WHENGATE.PMODE,VALSTR);
MESSAGE=MESSAGE||VALSTR||':'||MODECHAR;
CALL OUT$MSG(@NOTE,MESSAGE);

END PRINT_WHEN_MESSAGE;
```

```
/*================================================================*/

PRINT_TRACE_MESSAGE: PROC;

/*----------------------------------------------------------------*/
/* PRINT OUT A TRACE MESSAGE.                                     */
/*----------------------------------------------------------------*/

DCL WND$TRC        ENTRY(CHAR(*) VAR, /* SIGNAL NAME */
                             CHAR(*) VAR, /* DATA        */
                             FIXED BIN(31), /* TIME */
                             FIXED BIN(15)) /* LINE NUMBER */
                       RETURNS(BIT(1) ALIGNED); /* FALSE ON ERROR */

IF WHENGATE.WINDOW_LINE_NUM > 0 THEN DO; /* Trace to window */
        EQLLOC=INDEX(WHNDSC.TERMS(WHENGATE.TERMPOS),'=');
        IF EQLLOC>0 THEN   /* Isolate signal id */
            WHENTERM=SUBSTR(WHNDSC.TERMS(WHENGATE.TERMPOS),1,EQLLOC-1);
        ELSE
            WHENTERM=WHNDSC.TERMS(WHENGATE.TERMPOS);

CALL GTS$CBVS(WHENGATE.B_VAL,WHENGATE.ZX_VAL,COPY('0'B,&MX_TRCBITS),
                     WHENGATE.#INPUTS,WHENGATE.PMODE,VALSTR);
        MODECHAR=CVS(WHENGATE.PMODE); /* Get mode code to char    */
        VALSTR = '[' || VALSTR || '] :' || MODECHAR;
        IF WNDSTRC(WHENTERM, VALSTR, TIMSTEP, WHENGATE.WINDOW_LINE_NUM) THEN
            RETURN; /* ALL is well */
        ELSE ; /* Trace to terminal */
    END;

MESSAGE='STEP '||TRIM(CHARACTER(TIMSTEP),'11'B)||': (TRACE '||
            WHNDSC.TERMS(WHENGATE.TERMPOS)||') ';
    MODECHAR=CVS(WHENGATE.PMODE); /* Get mode code to char    */
    CALL GTS$CBVS(WHENGATE.LAST_B_VAL,WHENGATE.LAST_ZX_VAL,
                  COPY('0'B,&MX_TRCBITS),WHENGATE.#INPUTS,
                  WHENGATE.PMODE,VALSTR);
    MESSAGE=MESSAGE||VALSTR||':'||MODECHAR||' --> ';
    CALL GTS$CBVS(WHENGATE.B_VAL,WHENGATE.ZX_VAL,COPY('0'B,&MX_TRCBITS),
                  WHENGATE.#INPUTS,WHENGATE.PMODE,VALSTR);
    MESSAGE=MESSAGE||VALSTR||':'||MODECHAR;
    IF OUT$RPT(WHNDSC.FILE_STATUS_PTR,WHNDSC.FILE,&LIST,
               MESSAGE,NULL,RC) THEN;

END PRINT_TRACE_MESSAGE;

/*================================================================*/

PERFORM_PRECOMPILED_WHEN: PROC;

/*----------------------------------------------------------------*/
/* The when descriptor has a list of precompiled actions to be performed. */
/* The action specified by each item in the list is performed.    */
/*----------------------------------------------------------------*/
    DCL PRT$MN      ENTRY(CHAR(@MXF_NM) VAR,BIT(1) ALIGNED,BIT(1) ALIGNED,
                          BIT(1) ALIGNED,BIT(1) ALIGNED,BIT(1) ALIGNED,
                          FIXED BIN(15)));

DCL LPC$SAMP    ENTRY(FIXED BIN(15)));
    DCL LPC$READ    ENTRY(FIXED BIN(15))
                    RETURNS(PTR);

DO P=WHNDSC.P_ACTIONS REPEAT(P->ACTION.NEXT) WHILE(P^=NULL);

GOTO PERFORM(P->ACTION.CODE);

PERFORM(@PRINT_ACTION):;
            CALL PRT$MN('TTY',@FALSE,@FALSE,@FALSE,@FALSE,@TRUE,P->ACTION.REF#);
            GOTO END_PERFORM;

PERFORM(&SAMPLE_ACTION):;
            CALL LPC$SAMP(P->ACTION.REF#);
            GOTO END_PERFORM;
```

```
     PERFORM(@READ_ACTION)::
       /* Returned ptr is an error flag. */
       IF LPC$READ(P->ACTION.REF#) = NULL THEN;
       GOTO END_PERFORM;

PERFORM(@SIM_ACTION)::
       STOP_PTR=NULL;
       STOP_TIM=@STOP_ON_NOACT;
       GOTO END_PERFORM;

END_PERFORM::
   END:

END PERFORM_PRECOMPILED_WHEN;

/*==============================================================================*/

CVS: PROC(MODECODE) RETURNS(CHAR(1));

%INCLUDE 'CADSRC>INSERT>SYMBOL_TYPES.INS.SPL';

DCL MODECODE              FIXED BIN(15);

GOTO MODE(MODECODE);
   MODE(@BINARY): RETURN('B');
   MODE(@HEX): RETURN('H');
   MODE(@OCTAL): RETURN('O');
   MODE(@DECIMAL): RETURN('D');
   MODE(@ASCII): RETURN('A');
 END CVS;

END SIM$WHN;
/* GTS$TSU.SPL, THEMISSRC>SOURCE>GTS$, CAD/CAM, 09/10/82                       */
/* Trace Storage Updates                                                      */
/* COPYRIGHT (C) 1982, Prime Computer, Inc., Natick, Ma 01760                 */

GTS$TSU: PROC(WATCH_LIST,ADRS,LEFT_BIT,RIGHT_BIT,MASK,USE_MASK);

/*------------------------------------------------------------------------------*/
/* Description:                                                               */
/*    This procedure is called if a storage is updated and the                */
/* STORAGES.TRACE_PTR (points to WATCH_BLKs for that storage) is not          */
/* NULL. If the updated bits fall within the monitored range, then            */
/* a last event is scheduled to evaluate the trace test. Not that if          */
/* concatenated registers are being monitored, then the trace test cannot     */
/* be evaluated during an update to one part of the concatenation. All        */
/* parts must be updated before the test evaluation can take place,           */
/* therefore a last event must be scheduled.                                  */
/* This routine implements two ways to determine whether the updated bits     */
/* fall within the monitored range. The first (USE_MASK=@FALSE) uses          */
/* the LEFT_BIT and RIGHT_BIT fields to indicate the updated bits, while      */
/* the second (USE_MASK=@TRUE) uses the MASK field to indicate which bits     */
/* are being updated.                                                         */
/*------------------------------------------------------------------------------*/
/* History:                                                                   */
/*    Date            Programmer      Description of modification             */
/* 12/16/82           RICKS           Modified to handle tracing of clocks.   */
/* 12/08/82           RICKS           Changed calling args for TAD stg tracing*/
/* FRI, 10 SEP 1982   RICKS           Initial coding.                         */
/*------------------------------------------------------------------------------*/

%INCLUDE 'CADSRC>INSERT>MAX_NAMSIZ.INS.SPL';

DCL WATCH_LIST           PTR OPTIONS(SHORT);       /* IN - to WATCH_BLKs    */
 DCL ADRS                 FIXED BIN(15);            /* IN - of updated mem   */
 DCL LEFT_BIT             FIXED BIN(15);            /* IN - MEMADRS,LFT:RT]  */
 DCL RIGHT_BIT            FIXED BIN(15);            /* IN.                   */
 DCL MASK                 BIT(@MXTADBIT) ALIGNED;   /* IN - Updated bits     */
 DCL USE_MASK             BIT(1) ALIGNED;           /* IN - Use mask | LFT:RT*/

%INCLUDE 'THEMISSRC>INSERT>FUNC_SIZE_LIMITS.INS.SPL';
 %INCLUDE 'THEMISSRC>INSERT>WHEEL.PL1G';
 %INCLUDE 'THEMISSRC>INSERT>EVENT.PL1G';
```

```
%INCLUDE  'THEMISSRC>INSERT>EVTCODE.PL1G';
%INCLUDE  'CADSRC>INSERT>STORAGE.INS.SPL';
%INCLUDE  'THEMISSRC>INSERT>STORAGE_TRACE_BLOCK.INS.SPL';
%INCLUDE  'THEMISSRC>INSERT>LAST_EVENT.INS.SPL';
%INCLUDE  'THEMISSRC>INSERT>GLOBAL.PL1G';
%INCLUDE  'CADSRC>INSERT>SYMBOLS.INS.SPL';

%REPLACE  @TRUE BY '1'B;
%REPLACE  @FALSE BY '0'B;
%REPLACE  @FTN_TRUE BY 1;
%REPLACE  @FTN_FALSE BY 0;

DCL NULL                   BUILTIN;

DCL P                      PTR OPTIONS(SHORT);
DCL Q                      PTR OPTIONS(SHORT);
DCL UPDATED                BIT(1) ALIGNED;
DCL RANGE_UPDATE           BIT(1) ALIGNED;
DCL OLD_B                  BIT(@MX_TRCBITS) ALIGNED;
DCL OLD_ZX                 BIT(@MX_TRCBITS) ALIGNED;

DCL GTS$INFR               ENTRY(PTR OPTIONS(SHORT),PTR OPTIONS(SHORT));
DCL GTS$GMV                ENTRY(PTR OPTIONS(SHORT),PTR OPTIONS(SHORT),
                                 FIXED BIN(15),FIXED BIN(15),FIXED BIN(15),
                                 BIT(*) ALIGNED, BIT(*) ALIGNED);
DCL SIM$SCE                ENTRY(FIXED BIN(31),PTR OPTIONS(SHORT));

DO P=WATCH_LIST REPEAT(P->WATCH_STG.NEXT) WHILE(P^=NULL);

UPDATED=@FALSE;
    RANGE_UPDATE=@FALSE;
    SELECT(P->WATCH_STG.STG->STORAGES.CODE);

/*-------------------------------------------------------------------*/
    /* Registers                                                         */
    /*-------------------------------------------------------------------*/

WHEN(@REG_STR,@LREG_STR,@TERM_STR,@LTERM_STR) DO;

/*-------------------------------------------------------------------*/
       /* Do updated bits fall within watched range?                        */
       /*-------------------------------------------------------------------*/

IF USE_MASK THEN UPDATED=TEST_REG_UPDT_USING_MASK(P);
       ELSE UPDATED=TEST_REG_UPDT_USING_LEFT_RIGHT(P);

END;

/*-------------------------------------------------------------------*/
    /* RAM. If the TRACEd address range covers only one address, then    */
    /* any type of TRACE test is valid (-,+,*,=const). However, if the   */
    /* address range extends across numerous addresses, then * is the    */
    /* only valid TRACE test. In this case, get the value of the memory  */
    /* prior to update and test to see if it differs from the new value  */
    /* before scheduling a last event.                                   */
    /*-------------------------------------------------------------------*/

WHEN(@RAM_STR,@LRAM_STR,@ROM_STR,@LROM_STR) DO;

IF USE_MASK THEN UPDATED=TEST_MEM_UPDT_USING_MASK(P);
       ELSE UPDATED=TEST_MEM_UPDT_USING_LEFT_RIGHT(P);

IF UPDATED THEN DO;
          IF P->WATCH_STG.BEG_ADRS ^= P->WATCH_STG.END_ADRS THEN DO;
             RANGE_UPDATE=@TRUE;
             CALL GTS$GMV(P->WATCH_STG.STG,P->WATCH_STG.SYMBASE,ADRS,
                          P->WATCH_STG.LEFT_BIT,
                          P->WATCH_STG.RIGHT_BIT,
                          OLD_B,OLD_ZX);
          END;
       END;
    END;
```

```
    WHEN(@CLOCK_STR) DO;
      UPDATED=@TRUE;
      END;

OTHERWISE DO;
      END;

END /* SELECT */;

/*---------------------------------------------------------------------*/
/* If the storage has been updated in the watched positions, then      */
/* schedule a last event.                                              */
/*---------------------------------------------------------------------*/

IF UPDATED THEN DO;

/*-----------------------------------------------------------------*/
    /* If a storage evaluation last event is currently scheduled for   */
    /* this storage, then there is no need to schedule another. Note   */
    /* that if multiple memory updates occur in a single time step, and*/
    /* a range of addresses is being traced, then the first address    */
    /* is the only one reported.                                       */
    /*-----------------------------------------------------------------*/

Q=P->WATCH_STG.STG_TRACE_BLOCK;
    IF ^Q->STG_TRACE_BLOCK.EVAL_EVNT THEN DO;

/*-------------------------------------------------------------*/
        /* If part of a memory range has been updated, then store the  */
        /* pre-update value in the STG_TRACE_BLOCK. This will make TRACE*/
        /* testing for memory ranges look like testing for registers.  */
        /*-------------------------------------------------------------*/

IF RANGE_UPDATE THEN DO;
           Q->STG_TRACE_BLOCK.B_VAL=OLD_B;
           Q->STG_TRACE_BLOCK.ZX_VAL=OLD_ZX;
           END;
        Q->STG_TRACE_BLOCK.EVAL_EVNT=@TRUE;
        ALLOC LAST_EVENT SET(Q);
        Q->LAST_EVENT.DATA=P->WATCH_STG.STG_TRACE_BLOCK;
        Q->LAST_EVENT.ADRS=ADRS; /* Updated address (if memory update) */
        CALL GTS$INFR(STGEVLE,Q);

/*-------------------------------------------------------------*/
        /* Now indicate to SIM$SIM that a last event has been scheduled.*/
        /* Normally, the LEFLG could be set directly if it could be    */
        /* guaranteed that GTS$TSU were only called during simulation. */
        /* (SIM$SIM resets LEFLG first thing.)                         */
        /* However GTS$TSU can be called by the logic analyzer (e.g. by*/
        /* the LET command) and therefore an event must be scheduled.  */
        /*-------------------------------------------------------------*/

CALL SIM$SCE(0,EVTBASE);
        EVTBASE->EVENT.CODE=&LAST;
        END;
    END;
  END; /* Loop through WATCH_STG blocks. */

RETURN;

/*===========INTERNAL ROUTINES==========================================*/

TEST_REG_UPDT_USING_LEFT_RIGHT: PROC(P) RETURNS(BIT(1) ALIGNED);

/*---------------------------------------------------------------------*/
/* This procedure tests whether the monitored bits of the register have*/
/* updated, using the LEFT_BIT and RIGHT_BIT inputs.                   */
/*---------------------------------------------------------------------*/

DCL P         PTR OPTIONS(SHORT);    /* IN - Points to WATCH_STG_BLK   */
DCL UPDATED   BIT(1) ALIGNED;        /* RTN - Monitored bits updated?  */
```

```
UPDATED=P->WATCH_STG.LEFT_BIT>=LEFT_BIT & P->WATCH_STG.LEFT_BIT<=RIGHT_BIT |
        P->WATCH_STG.LEFT_BIT<=LEFT_BIT & P->WATCH_STG.LEFT_BIT>=RIGHT_BIT |
        P->WATCH_STG.RIGHT_BIT>=LEFT_BIT & P->WATCH_STG.RIGHT_BIT<=RIGHT_BIT |
        P->WATCH_STG.RIGHT_BIT<=LEFT_BIT & P->WATCH_STG.RIGHT_BIT<=RIGHT_BIT;

RETURN(UPDATED);

END TEST_REG_UPDT_USING_LEFT_RIGHT;

/*================================================================*/

TEST_REG_UPDT_USING_MASK: PROC(P) RETURNS(BIT(1) ALIGNED);

DCL P            PTR OPTIONS(SHORT);  /* IN - To WATCH_STG block.       */
DCL UPDATED      BIT(1) ALIGNED;      /* RTN - Watched mem updated ?    */

DCL WATCH_MASK   BIT(@MXTADBIT) ALIGNED;
DCL LOW          FIXED BIN(15);
DCL HIGH         FIXED BIN(15);
DCL NBITS        FIXED BIN(15);

/*----------------------------------------------------------------*/
/* This procedure determines whether the monitored register bit   */
/* positions have been updated, using the MASK input.             */
/*----------------------------------------------------------------*/

/* Setup monitor mask. */
WATCH_MASK='0'B;
IF P->WATCH_STG.LEFT_BIT>P->WATCH_STG.RIGHT_BIT THEN DO;
    LOW=P->WATCH_STG.RIGHT_BIT;
    HIGH=P->WATCH_STG.LEFT_BIT;
    END;
ELSE DO;
    LOW=P->WATCH_STG.LEFT_BIT;
    HIGH=P->WATCH_STG.RIGHT_BIT;
    END;
NBITS=HIGH-LOW+1;

/* Adjust LOW according to range definition for this memory. */
LOW=LOW-MIN(P->WATCH_STG.SYMBBASE->REGISTER.LSB,
            P->WATCH_STG.SYMBBASE->REGISTER.MSB)+1;
SJBSTR(WATCH_MASK,LOW,NBITS)=COPY('1'B,@MXTADBIT); /* Truncate at NBITS..*/

UPDATED=((MASK & WATCH_MASK) ^= COPY('0'B,@MXTADBIT));

RETURN(UPDATED);

END TEST_REG_UPDT_USING_MASK;

/*================================================================*/

TEST_MEM_UPDT_USING_LEFT_RIGHT: PROC(P) RETURNS(BIT(1) ALIGNED);

DCL P            PTR OPTIONS(SHORT);  /* IN - To WATCH_STG block.       */
DCL UPDATED      BIT(1) ALIGNED;      /* RTN - Watched mem updated ?    */

/*----------------------------------------------------------------*/
/* This procedure determines whether the monitored memory adrs and bit */
/* positions have been updated, using the LEFT_BIT and RIGHT_BIT inputs. */
/*----------------------------------------------------------------*/

UPDATED=((ADRS>=P->WATCH_STG.BEG_ADRS & ADRS<=P->WATCH_STG.END_ADRS) |
         (ADRS<=P->WATCH_STG.BEG_ADRS & ADRS>=P->WATCH_STG.END_ADRS)) &
        (P->WATCH_STG.LEFT_BIT>=LEFT_BIT & P->WATCH_STG.LEFT_BIT<=RIGHT_BIT |
         P->WATCH_STG.LEFT_BIT<=LEFT_BIT & P->WATCH_STG.LEFT_BIT>=RIGHT_BIT |
         P->WATCH_STG.RIGHT_BIT>=LEFT_BIT & P->WATCH_STG.RIGHT_BIT<=RIGHT_BIT |
         P->WATCH_STG.RIGHT_BIT<=LEFT_BIT & P->WATCH_STG.RIGHT_BIT<=RIGHT_BIT);

RETURN(UPDATED);

END TEST_MEM_UPDT_USING_LEFT_RIGHT;
```

```
/*==============================================================================*/

TEST_MEM_UPDT_USING_MASK: PROC(P) RETURNS(BIT(1) ALIGNED);

DCL P            PTR OPTIONS(SHORT);  /* IN  - To WATCH_STG block.      */
DCL UPDATED      BIT(1) ALIGNED;      /* RTN - Watched mem updated ?    */

DCL WATCH_MASK   BIT(@MXTADBIT) ALIGNED;
DCL LOW          FIXED BIN(15);
DCL HIGH         FIXED BIN(15);
DCL NBITS        FIXED BIN(15),

/*------------------------------------------------------------------------------*/
/* This procedure determines whether the monitored memory adrs and bit          */
/* positions have been updated, using the MASK input.                           */
/*------------------------------------------------------------------------------*/

/* Setup monitor mask. */
WATCH_MASK='0'B;
IF P->WATCH_STG.LEFT_BIT>P->WATCH_STG.RIGHT_BIT THEN DO;
   LOW=P->WATCH_STG.RIGHT_BIT;
   HIGH=P->WATCH_STG.LEFT_BIT;
   END;
ELSE DO;
   LOW=P->WATCH_STG.LEFT_BIT;
   HIGH=P->WATCH_STG.RIGHT_BIT;
   END;
NBITS=HIGH-LOW+1;
LOW=LOW-MIN(P->WATCH_STG.SYMBBASE->MEMORY.LSB,
            P->WATCH_STG.SYMBBASE->MEMORY.MSB)+1;
SUBSTR(WATCH_MASK,LOW,NBITS)=COPY('1'B,@MXTADBIT);  /* Truncate at NBITS. */

UPDATED=((ADRS>=P->WATCH_STG.BEG_ADRS & ADRS<=P->WATCH_STG.END_ADRS) |
         (ADRS<=P->WATCH_STG.BEG_ADRS & ADRS>=P->WATCH_STG.END_ADRS)) &
        (MASK & WATCH_MASK) ^= COPY('0'B,@MXTADBIT);

RETURN(UPDATED);

END TEST_MEM_UPDT_USING_MASK;

END GTS$TSU;
/* SIM$ESU.SPL, THEMISSRC>SOURCE>SIM$, CAD/CAM, 09/17/82                        */
/* Evaluates TRACE test on storage updates                                      */
/* COPYRIGHT (C) 1982, Prime Computer, Inc., Natick, Ma 01760                   */

SIM$ESU: PROC;

/*------------------------------------------------------------------------------*/
/* Description:                                                                 */
/*    This procedure looks at storages that are being traced and that have      */
/* been flagged as having changed in this time step (by virtue of the           */
/* fact that they are in the STGEVLE list). Any traced storages that            */
/* satisfy the trace test (eg. AREG || BREG = +) are put onto the TRACE Last    */
/* Event List for processing (loading action lists, clearing flags, etc).       */
/* Also, a trace or when break message is printed.                              */
/*                                                                              */
/* History:                                                                     */
/* Date      Programmer   Description of modification                           */
/* 05/12/83  LORNE        Added support for TRACE-TO-WINDOW                     */
/* 04/27/83  RICKS        Modified to handle precompiled action lists.          */
/* 03/08/83  RICKS        Added OUT$CONST include for CONTROL_BLOCKS.INS.SPL    */
/* 11/10/82  RICKS        Added FUNC_SIZE_LIMITS include.                       */
/* 09/17/82  RICKS        Initial coding.                                       */
/*------------------------------------------------------------------------------*/

%INCLUDE 'CADSRC>INSERT>MAX_NAMSIZ.INS.SPL';
%INCLUDE 'THEMISSRC>INSERT>GLOBAL.PL1G';
%INCLUDE 'THEMISSRC>INSERT>WHEN_TESTCODES.PL1G';
%INCLUDE 'THEMISSRC>INSERT>WHEN_SIZE_LIMITS.PL1G';
%INCLUDE 'THEMISSRC>INSERT>FUNC_SIZE_LIMITS.INS.SPL';
%INCLUDE 'CADSRC>INSERT>STORAGE.INS.SPL';
%INCLUDE 'CADSRC>INSERT>SYMBOL_TYPES.INS.SPL';
%INCLUDE 'THEMISSRC>INSERT>STORAGE_TRACE_BLOCK.INS.SPL';
```

```
%INCLUDE 'THEMISSRC>INSERT>LAST_EVENT.INS.SPL';
%INCLUDE 'CADSRC>ENTRIES>OUTSMSG.INS.SPL';
%INCLUDE 'THEMISSRC>INSERT>CONTROL_BLOCKS.INS.SPL';
%INCLUDE 'THEMISSRC>INSERT>WHEEL.PL1G';

%REPLACE &TRUE BY '1'B;
/* SIM$ESU.SPL, THEMISSRC>SOURCE>SIM$, CAD/CAM, 09/17/82              */

%REPLACE &FALSE BY '0'B;

DCL NULL              BUILTIN;

DCL STB               PTR OPTIONS(SHORT);
   DCL STG_TYPE          FIXED BIN(15);
   DCL P                 PTR OPTIONS(SHORT);
   DCL W                 PTR OPTIONS(SHORT);
   DCL DSCBASE           PTR OPTIONS(SHORT);
   DCL I                 FIXED BIN(15);
   DCL LEN               FIXED BIN(15);
   DCL ADRS              FIXED BIN(15);
   DCL TERMPOS           FIXED BIN(15);
   DCL EQLLOC            FIXED BIN(15);
   DCL TESTVAL           BIT(1) ALIGNED;
   DCL TEMPCHAR          CHAR(100) VAR;
   DCL STG_NAME          CHAR(100) VAR;
   DCL MODECHAR          CHAR(1);
   DCL ZEROS             BIT(@MX_TRCBITS) ALIGNED STATIC INIT('0'B);
   DCL CUR_VAL           BIT(@MX_TRCBITS) ALIGNED;
   DCL OLD_VAL           BIT(@MX_TRCBITS) ALIGNED;
   DCL NEW_B             BIT(@MX_TRCBITS) ALIGNED;
   DCL NEW_ZX            BIT(@MX_TRCBITS) ALIGNED;
   DCL OLD_B             BIT(@MX_TRCBITS) ALIGNED;
   DCL OLD_ZX            BIT(@MX_TRCBITS) ALIGNED;

DCL CVS_INIT          BIT(1) ALIGNED STATIC INIT('0'B);
   DCL CVS(5)            CHAR(1) STATIC;

DCL GTS$CBVS          ENTRY(BIT(*) ALIGNED,BIT(*) ALIGNED,BIT(*) ALIGNED,
                               FIXED BIN(15),FIXED BIN(15),CHAR(*) VAR);
   DCL GTS$INFR          ENTRY(PTR OPTIONS(SHORT),PTR OPTIONS(SHORT));
   DCL GTS$GSTV          ENTRY(PTR OPTIONS(SHORT), FIXED BIN(15),
                               BIT(*) ALIGNED,BIT(*) ALIGNED);
   DCL OUT$RPT           ENTRY(POINTER,CHAR(@MXFLNM) VAR,FIXED BIN(15),
                               CHAR(@MXSTRLN) VAR,PTR OPTIONS(SHORT),
                               FIXED BIN(15))
                         RETURNS(BIT(1) ALIGNED);
   DCL WND$TRC           ENTRY(CHAR(*) VAR, CHAR(*) VAR, FIXED BIN(31),
                               FIXED BIN(15)) RETURNS(BIT(1) ALIGNED);

/*---------------------------------------------------------------------*/
/* Initialize printmode conversion array, if not already initted. The INIT */
/* attribute is not used so that the initialization is not dependent on the */
/* actual numerical code assignments.                                  */
/*---------------------------------------------------------------------*/

IF ^CVS_INIT THEN DO;
      CVS_INIT=&TRUE;
      CVS(@BINARY)='B';
      CVS(@OCTAL)='O';
      CVS(@DECIMAL)='D';
      CVS(@HEX)='H';
      CVS(@ASCII)='A';
   END;

DO WHILE(STGEVLE^=NULL);  /* For each item in the STG EVAL LAST EVNT LIST */

/*---------------------------------------------------------------------*/
/* Get the pointer to the STG_TRACE_BLOCK and reset the EVAL_EVNT flag. */
/*---------------------------------------------------------------------*/

STB=STGEVLE->LAST_EVENT.DATA;
      P=STGEVLE;
```

```
STGEVLE=P->LAST_EVENT.NEXT;
ADRS=P->LAST_EVENT.ADRS;
FREE P->LAST_EVENT;
STB->STG_TRACE_BLOCK.EVAL_EVNT=&FALSE;

/*-----------------------------------------------------------------*/
/* Get the new binary and zx value of the traced storage.          */
/*-----------------------------------------------------------------*/

W=STB->STG_TRACE_BLOCK.CONCAT_LIST;  /* To first WATCH_STG          */
CALL GTSSGSTV(W,ADRS,NEW_B,NEW_ZX);   /* Get Storage Trace Value */
/*-----------------------------------------------------------------*/
/* Now perform the TRACE test. For all types of trace test except =const */
/* update the B and ZX values in the storage trace block. Save old vals  */
/* first.                                                                */
/*-----------------------------------------------------------------*/

OLD_B=STB->STG_TRACE_BLOCK.B_VAL;
OLD_ZX=STB->STG_TRACE_BLOCK.ZX_VAL;
GOTO TEST(STB->STG_TRACE_BLOCK.TSTCODE);

TEST(@ONCHANGE): DO;
      TESTVAL= (NEW_B ^= STB->STG_TRACE_BLOCK.B_VAL) |
               (NEW_ZX ^= STB->STG_TRACE_BLOCK.ZX_VAL);
      GOTO ENDTEST;
      END;

TEST(@ONINC): DO;

/*-----------------------------------------------------------*/
      /* ZX values map onto 1.                                     */
      /*-----------------------------------------------------------*/

CUR_VAL=NEW_B | NEW_ZX;
      OLD_VAL=STB->STG_TRACE_BLOCK.B_VAL | STB->STG_TRACE_BLOCK.ZX_VAL;
      TESTVAL=CUR_VAL>OLD_VAL;
      GOTO ENDTEST;
      END;

TEST(@ONDEC): DO;

/*-----------------------------------------------------------*/
      /* ZX Values map onto 0.                                     */
      /*-----------------------------------------------------------*/

CUR_VAL=NEW_B & ^NEW_ZX;
      OLD_VAL=STB->STG_TRACE_BLOCK.B_VAL & ^STB->STG_TRACE_BLOCK.ZX_VAL;
      TESTVAL=CUR_VAL<OLD_VAL;
      GOTO ENDTEST;
      END;

TEST(@EQLCONST): DO;
      TESTVAL= ((NEW_B=STB->STG_TRACE_BLOCK.CONST_B_VAL) &
                (NEW_ZX=STB->STG_TRACE_BLOCK.CONST_ZX_VAL) &
                (NEW_B^=OLD_B | NEW_ZX^=OLD_ZX));
      GOTO ENDTEST;
      END;

ENDTEST:;

STB->STG_TRACE_BLOCK.B_VAL=NEW_B;
STB->STG_TRACE_BLOCK.ZX_VAL=NEW_ZX;

/*-----------------------------------------------------------------*/
/* Cause a break to occur if the test has evaluated true.          */
/*-----------------------------------------------------------------*/

IF TESTVAL=&TRUE THEN DO;
   DSCBASE=STB->STG_TRACE_BLOCK.DSCBASE;

/*--------------------------------------------------------------*/
   /* Schedule a TRACE Last Event. This will cause SIMSLE to examine the */
```

```
/* TRACE descriptor, reset flags, and load action lists if necessary. */
/*-------------------------------------------------------------------*/

ALLOC LAST_EVENT SET(P);
P->LAST_EVENT.DATA=DSCBASE;
CALL GTS$INFR(TRACELE,P);

/*-------------------------------------------------------------------*/
/* Indicate to SIM$LE that the test has evaluated true. SIM$LE will  */
/* clear the TESTSTATE flag. The count gets incremented only once.   */
/*-------------------------------------------------------------------*/

IF WHNDSC.TESTSTATE=@TESTFALSE THEN WHNDSC.COUNT=WHNDSC.COUNT+1;
WHNDSC.TESTSTATE=@TESTTRUE;
/*-------------------------------------------------------------------*/
/* Determine whether the control parameters will inhibit the break.  */
/*-------------------------------------------------------------------*/

IF ^WHNDSC.IGNORE & WHNDSC.COUNT>WHNDSC.AFTER &
   WHNDSC.COUNT<WHNDSC.BEFORE &
   MOD(WHNDSC.COUNT,EVERY)=0 THEN DO;

TERMPOS=STB->STG_TRACE_BLOCK.TERMPOS;

/*----------------------------------------------------------------*/
   /* If the traced object is a memory range, then the trace message */
   /* will look like:                                                */
   /* STEP n: (TRACE MEM[1:34,1:4]) MEM[27,1:4] 0:H --> 3:H           */
   /*                               \---------/                      */
   /*                                STG_NAME                        */
   /*----------------------------------------------------------------*/

STG_NAME=' ';
   STG_TYPE=W->WATCH_STG.STG->STORAGES.CODE;
   IF STG_TYPE=@RAM_STR | STG_TYPE=@LRAM_STR |
      STG_TYPE=@ROM_STR | STG_TYPE=@LROM_STR THEN DO;
      IF W->WATCH_STG.BEG_ADRS ^= W->WATCH_STG.END_ADRS THEN
         CALL MAKE(STG_NAME,/* from */ WHNDSC.TERMS(TERMPOS),ADRS);
      END;

IF WHNDSC.TYPE=@WHEN THEN DO;

/*-------------------------------------------------------------*/
      /* Indicate to SIM$LE that a when break should occur.          */
      /* Action lists should be loaded, etc.                         */
      /*-------------------------------------------------------------*/

WHNDSC.TESTSTATE=@BRKTRUE;

/*-------------------------------------------------------------*/
      /* PRINT A MSG ONLY IF NO ACTION LIST.                         */
      /*-------------------------------------------------------------*/
      IF WHNDSC.ACTIONS=NULL THEN DO;
         MESSAGE='******* WHEN BREAK '||
                 CHARACTER(WHNDSC.WHEN#)||' OCCURRED ON ' ||
                 WHNDSC.TERMS(TERMPOS)||' *******';
         CALL OUT$MSG(@NOTE,MESSAGE);

/*----------------------------------------------------------*/
         /* Print old and new values.                                */
         /*----------------------------------------------------------*/

IF STG_NAME=' ' THEN DO;
            EQLLOC=INDEX(WHNDSC.TERMS(TERMPOS),'=');
            IF EQLLOC>0 THEN DO; /* Isolate signal id */
               STG_NAME=SUBSTR(WHNDSC.TERMS(TERMPOS),1,EQLLOC-1)||' ';
               END;
            ELSE DO;
               STG_NAME=WHNDSC.TERMS(TERMPOS)||' ';
               END;
            END;
         ELSE STG_NAME=STG_NAME||' ';
```

```
              MESSAGE="STEP "||TRIM(CHARACTER(TIMSTEP),"11"B)||": "||
                  STG_NAME;
              MODECHAR=CVS(STB->STG_TRACE_BLOCK.PMODE);
              CALL GTS$CBVS(O_D_B,
                            O_D_ZX,
                            ZEROS,
                            STB->STG_TRACE_BLOCK.#BITS,
                            STB->STG_TRACE_BLOCK.PMODE,
                            TEMPCHAR);
              MESSAGE=MESSAGE||TEMPCHAR||":"||MODECHAR||" --> ";
              CALL GTS$CBVS(NEW_B,NEW_ZX,
                            ZEROS,
                            STB->STG_TRACE_BLOCK.#BITS,
                            STB->STG_TRACE_BLOCK.PMODE,
                            TEMPCHAR);
              MESSAGE=MESSAGE||TEMPCHAR||":"||MODECHAR;
                  CALL OUTSMSG(@NOTE,MESSAGE);
                  END;
              END;

ELSE IF WHNDSC.TYPE=&TRACE THEN
              CALL PRINT_TRACE_MESSAGE;

ELSE IF WHNDSC.TYPE=&PRECOMPILED_WHEN THEN DO;
              WHNDSC.TESTSTATE=&BR<TRUE;
              END;

ELSE DO;
              MESSAGE="Invalid WHENGATE type "||CHAR(WHNDSC.TYPE);
              CALL OUTSMSG(@ERROR_PE,MESSAGE);
              END;
          END;
       END;
    END; /* Processing STorage EValuation Last Event.              */

/*================================================================*/

MAKE: PROC(STG_NAME,TRACE_NAME,ADRS);

DCL STG_NAME           CHAR(*) VAR;
    DCL TRACE_NAME         CHAR(*) VAR;
    DCL ADRS               FIXED BIN(15);

DCL PRE                CHAR(100) VAR;
    DCL POST               CHAR(100) VAR;
    DCL LOC                FIXED BIN(15);

/*----------------------------------------------------------------*/
/* TRACE_NAME is in one of the following formats:                 */
/*      MEM                                                       */
/*      MEM[1:23,1:4]                                             */
/*      MEM[1:23]                                                 */
/*----------------------------------------------------------------*/
    LOC=INDEX(TRACE_NAME,",");
    IF LOC=0 THEN LOC=INDEX(TRACE_NAME,"]");
    IF LOC^=0 THEN DO;
        POST=SUBSTR(TRACE_NAME,LOC);
        LOC=INDEX(TRACE_NAME,"[");
        PRE=SUBSTR(TRACE_NAME,1,LOC);
        STG_NAME=PRE||TRIM(CHAR(ADRS),"11"B)||POST;
        END;
    ELSE DO;
        STG_NAME=TRACE_NAME || "[" || TRIM(CHAR(ADRS),"11"B) || "]";
        END;
    END;

PRINT_TRACE_MESSAGE: PROCEDURE;

/*----------------------------------------------------------------*/
/* PRINT OUT A TRACE MESSAGE.                                     */
/*----------------------------------------------------------------*/
```

```
IF STB -> STG_TRACE_BLOCK.WINDOW_LINE_NUM > 0 THEN DO; /* TRACE-TO-WINDOW */
   CALL GTS$CBVS(NEW_B,NEW_ZX,
                 ZEROS,
                 STB->STG_TRACE_BLOCK.#BITS,
                 STB->STG_TRACE_BLOCK.PMODE,TEMPCHAR);
   MODECHAR=CVS(STB->STG_TRACE_BLOCK.PMODE);
   TEMPCHAR = '[' || TEMPCHAR || '] :' || MODECHAR;
   IF WNDSTRC(WHNDSC.TERMS(TERMPOS),TEMPCHAR,TIMSTEP,
         STB -> STG_TRACE_BLOCK.WINDOW_LINE_NUM) THEN /* Ok */
      RETURN;
   END;

MESSAGE='STEP '||TRIM(CHARACTER(TIMSTEP),'11'B)||': (TRACE '||
        WHNDSC.TERMS(TERMPOS)||') ';
MODECHAR=CVS(STB->STG_TRACE_BLOCK.PMODE);
CALL GTS$CBVS(OLD_B,
              OLD_ZX,
              ZEROS,
              STB->STG_TRACE_BLOCK.#BITS,
              STB->STG_TRACE_BLOCK.PMODE,
              TEMPCHAR);
IF STG_NAME='' THEN DO;
   MESSAGE=MESSAGE || TEMPCHAR||':'||MODECHAR||' --> ';
   END;
ELSE DO;
   MESSAGE=MESSAGE||STG_NAME|| ' '||
           TEMPCHAR||':'||MODECHAR||' --> ';
   END;
CALL GTS$CBVS(NEW_B,NEW_ZX,
              ZEROS,
              STB->STG_TRACE_BLOCK.#BITS,
              STB->STG_TRACE_BLOCK.PMODE,TEMPCHAR);
MESSAGE=MESSAGE||TEMPCHAR||':'||MODECHAR;
IF OUT$RPT(WHNDSC.FILE_STATUS_PTR,WHNDSC.FILE,&LIST,
           MESSAGE,NULL,1) THEN;
RETURN;
END PRINT_TRACE_MESSAGE;
END SIM$ESU;
/* LPC$MON.SPL, THEMISSRC>SOURCE>LPCS, CAD/CAM, 02/04/83             */
/* MAIN PROGRAM FOR "DEFINE MONITOR" COMMAND                         */
/* COPYRIGHT (C) 1983, Prime Computer, Inc., Natick, Ma 01760        */

LPC$MON: PROC(REF#,DEPTH);

/*-------------------------------------------------------------------*/
/* Description:                                                      */
/*                                                                   */
/*                                                                   */
/* History:                                                          */
/* Date     Programmer  Description of modification                  */
/* 08/18/83   RICKS     Fixed bug: reusing previously specified reference #. */
/* 04/15/83   RICKS     Left justified bit values.                   */
/* 03/29/83   RICKS     Save source.                                 */
/* 03/15/83   RICKS     Changed order of bit packing in value stacks */
/* 02/24/83   RICKS     Added ARRAY_OFFSET initialization.           */
/* 02/04/83   RICKS     Initial coding.                              */
/*-------------------------------------------------------------------*/

DCL REF#          FIXED BIN(15); /* IN - Negative if user supplied no ref# */
DCL DEPTH         FIXED BIN(15); /* IN - Size of monitor stack.     */

%INCLUDE 'CADSRC>INSERT>MAX_NAMSIZ.INS.SPL';
%INCLUDE 'THEMISSRC>INSERT>WHEN_SIZE_LIMITS.PL1G';
%INCLUDE 'CADSRC>ENTRIES>OUT$MSG.INS.SPL';
%INCLUDE 'THEMISSRC>INSERT>CONTROL_BLOCKS.INS.SPL';
%INCLUDE 'THEMISSRC>INSERT>WHEN_TESTCODES.PL1G';
%INCLUDE 'CADSRC>INSERT>LINE.INS.SPL';

%REPLACE @TRUE BY '1'B;
%REPLACE @FALSE BY '0'B;

DCL DONE          BIT(1) ALIGNED;
```

```
DCL NO_SIGS_ENTERED   BIT(1) ALIGNED;
DCL DSCBASE           PTR OPTIONS(SHORT);
DCL SRCBASE           PTR OPTIONS(SHORT);
DCL RC                FIXED BIN(15);

/* LPC$MON.SPL, THEMISSRC>SOURCE>LPC1, CAD/CAM, 02/04/83        */

DCL #WORDS         FIXED BIN(15);
   DCL TEMP_FLOAT     FLOAT;
   DCL BITPOS         FIXED BIN(15);
   DCL WORD           FIXED BIN(15);
   DCL I              FIXED BIN(15);

DCL NULL           BUILTIN;

DCL GTS$CBH        ENTRY(CHAR(3),BIT(1) ALIGNED,FIXED BIN(15),
                            PTR OPTIONS(SHORT),FIXED BIN(15));
   DCL GTS$SSRC       ENTRY(PTR OPTIONS(SHORT),CHAR(*),FIXED BIN(15));

DCL CLRNM_         ENTRY();
   DCL NEWRSP         ENTRY(CHAR(6),FIXED BIN(15),FIXED BIN(15));
   DCL LPC$MONG       ENTRY(BIT(1) ALIGNED,PTR OPTIONS(SHORT),PTR OPTIONS(SHORT))
                        RETURNS(PTR OPTIONS(SHORT));
   DCL SYS$AL         ENTRY(FIXED BIN(15)) RETURNS(PTR OPTIONS(SHORT));
/*--------------------------------------------------------------*/
/* Allocate and initialize the MONITOR block.                   */
/*--------------------------------------------------------------*/

IF REF#<1 THEN DO;
   CALL GTS$CBH('AMB',@FALSE,REF#,DSCBASE,RC);
   MESSAGE='Reference number '||CHAR(REF#)||' assigned.';
   CALL OUTSMSG(@NOTE,MESSAGE);
   END;
ELSE DO;
   CALL GTS$CBH('AMB',@TRUE,REF#,DSCBASE,RC);
   IF RC=@CBHINUSE THEN DO;
      MESSAGE='Reference number '||CHAR(REF#)||' is in use.';
      CALL OUTSMSG(@ERROR,MESSAGE);
      END;
   IF RC^=@CBHNOERRS THEN RETURN;
   END;

MONITOR.TYPE=@MONITOR;
MONITOR.STACK_INDEX=1;
MONITOR.ARRAY_OFFSET=1;
MONITOR.STACK_DEPTH=DEPTH;
MONITOR.#VALID_ENTRIES=0;
MONITOR.LIST_HEADER=NULL;
MONITOR.WFM_HEADER=NULL;
MONITOR.B_STACK_PTR=NULL;
MONITOR.ZX_STACK_PTR=NULL;
MONITOR.TIME_PTR=NULL;
MONITOR.#SIGNALS=0;
MONITOR.VARIABLE_NAMES = '';

/*--------------------------------------------------------------*/
/* Read in all the signals to be monitored.                     */
/*--------------------------------------------------------------*/

/* Set pointer to list of source code. */
CALL GTS$CBH('GSL',@TRUE,REF#,SRCBASE,RC);

/* Save first line of source code (DEFINE MONITOR cmd). */
CALL GTS$SSRC(SRCBASE,LINEX.LINE,LINEX.NLINE);

DONE=@FALSE;
DO WHILE(^ DONE);
   CALL CLRNM_;
   CALL NEWRSP('MON: ',5, 0);
```

```
        IF (LPC$MONG(DONE,DSCBASE,SRCBASE)^=NULL) THEN DO;
            /* Save line of source, if no errors. */
            CALL GTS$SSRC(SRCBASE,LINEX.LINE,LINEX.NLINE);
            END;
        END;

/*------------------------------------------------------------------------*/
/* Delete the MONITOR block if no signals were entered.                   */
/*------------------------------------------------------------------------*/

IF MONITOR.#SIGNALS<1 THEN DO;
    CALL GTS$CBH('DB ',@TRUE,REF#,DSCBASE,RC);
    END;
/* LPC$MON.SPL, THEMISSRC>SOURCE>LPC$, CAD/CAM, 02/04/83              */

/*------------------------------------------------------------------------*/
/* Allocate storage for the stack of values (pushed by SAMPLE command).   */
/*------------------------------------------------------------------------*/

ELSE DO;
    TEMP_FLOAT=FLOAT(MONITOR.#SIGNALS,23)/16.0;
    MONITOR.STACK_WIDTH=CEIL(TEMP_FLOAT);
    #WORDS=DEPTH * MONITOR.STACK_WIDTH;
    MONITOR.B_STACK_PTR=SYS$AL(#WORDS);
    MONITOR.ZX_STACK_PTR=SYS$AL(#WORDS);
    #WORDS=2*DEPTH;
    MONITOR.TIME_PTR=SYS$AL(#WORDS);

/* Set the MASK and WORD fields for each pin. The pins are stored in the */
    /* order that they were entered by the user. The first pin is the       */
    /* leftmost bit, the last pin is the rightmost bit.                     */

BITPOS=1;
    WORD=1;
    DO I=1 TO MONITOR.#SIGNALS;
        MONITOR.SIGNAL(I).WORD_MASK='0'B;
        SUBSTR(MONITOR.SIGNAL(I).WORD_MASK,BITPOS,1)='1'B;
        MONITOR.SIGNAL(I).STACK_WORD=WORD;
        BITPOS=BITPOS+1;
        IF BITPOS>16 THEN DO;
            BITPOS=1;
            WORD=WORD+1;
            END;
        END;
    END;

END LPC$MON;
LPC$MONG: /* oeremer rev 19.0 */

LPC$MONG: /* deremer rev 19.0 */
    procedure (DONE,DSCBASE,SRCBASE) returns(ptr);
        dcl 1 dp$_stac external static,
            2 dp$_state_stack(200) bin,
            2 dp$_state_stack_ptr  bin,
            2 dp$_symbol_stack(200) ptr,
            2 dp$_symbol_stack_ptr  bin;
        dcl dp$_reduce_result    ptr;
        dcl dp$_current_state    bin;
        dcl dp$_action           bin;
        dcl (dp$_i, dp$_j, dp$_k, dp$_l, dp$_m) bin;
        %replace dp$_base_ by 1;
        %replace dp$_alias_ by 2;
        %replace dp$_otherwise_ by 3;
        %replace dp$_rhslen_ by 4;
        %replace dp$_next_ by 1;
        %replace dp$_check_ by 2;
        dcl dp$_top_state bin;
```

```
    dcl  dp$_tknt  bin external;
    dcl  dp$_tknp  ptr external;
    dcl  dp$_look  bit(1) external;

dcl dp$_action_list_info(8, 3) bin static init(
/* state     1 */    -17,    1,    -6,
/* state     2 */      0,   -1,    -1,
/* state     3 */      0,   -1,    -2,
/* state     4 */      0,   -1,    -3,
/* state     5 */      0,   -1,    -6,
/* state     6 */      0,   -1,    -4,
/* state     7 */      0,   -1,    -5,
/* state     8 */     -2,    8,     0);

%replace dp$_action_list_length by 16;

dcl dp$_action_list(16, 2) bin static init(
/* row       1 */      2,    1,
/* row       2 */      5,    8,
/* row      15 */   (13)0, (13)0,
LPC$MONG: /* deremer rev 19.0 */

/* row      16 */      3,    8);

dcl dp$_reduce_list_info(6, 4) bin static init(
/* production   1 */   0,   -1,    0,    1,
/* production   2 */   0,   -1,    0,    2,
/* production   3 */   0,   -1,    8,    1,
/* production   4 */   0,   -1,    8,    3,
/* production   5 */   0,   -1,    8,    2,
/* production   6 */   0,    6,    7,    0);

%replace dp$_reduce_list_length by 5;

dcl dp$_reduce_list(5, 2) bin static init(
/* row       1 */      4,    6,
/* row       4 */   (3)0, (3)0,
/* row       5 */      6,    6);

DCL DONE        BIT(1) ALIGNED;       /* OUT - True if blank line entered. */
    DCL DSCBASE     PTR OPTIONS(SHORT);   /* IN - To MONITOR block.            */
    DCL SRCBASE     PTR OPTIONS(SHORT);   /* IN - To stored source code.       */
    %INCLUDE "CADSRC>INSERT>MAX_NAMSIZ.INS.SPL"; /* Incl first */
    %INCLUDE "CADSRC>ENTRIES>OUT$MSG.INS.SPL";
    %INCLUDE "THEMISSRC>INSERT>_INE.COMMON.PL1G";
    %INCLUDE "THEMISSRC>INSERT>WHEN_SIZE_LIMITS.PL1G";
    %INCLUDE "THEMISSRC>INSERT>CONTROL_BLOCKS.INS.SPL";
    %INCLUDE "THEMISSRC>INSERT>INP$GVR_CODES.PL1G";
    %REPLACE @TRUE      BY '1'B;
    %REPLACE @FALSE     BY '0'B;
    DCL LEXER       ENTRY(FIXED BIN(15), POINTER);
    DCL OLDRSP      ENTRY();
    DCL CLRNM_      ENTRY();
    DCL UNRCGZ      ENTRY();
    DCL INP$GVR     ENTRY((@MX$GVR_STK) FIXED BIN(15), FIXED BIN(15),
                         (@MXGVR_STK) PTR,             FIXED BIN(15))
                    RETURNS(PTR);
    DCL SUB$ISPN    ENTRY(FIXED BIN(15)) RETURNS(BIT(1) ALIGNED);
/*---------------------------------------------------------------------------*/
    DCL NAMDEPTH                FIXED BIN(15);
    DCL NAMSTK(@MXGVR_STK)      PTR;
    DCL RPNDEPTH                FIXED BIN(15);
    DCL RPNSTK(@MXGVR_STK)      FIXED BIN(15);
    DCL TOKEN_VALUE             CHAR(100) VARYING BASED;
    DCL NAME                    CHAR(@MXSYMN) VAR;
    DCL FLAG                    FIXED BIN(15);
    DCL ELMTBASE                PTR OPTIONS(SHORT);
    DCL SLOT_PTR                PTR OPTIONS(SHORT);
    DCL INIT_#SIGS              FIXED BIN(15);
    DCL MORE_SIGNALS            BIT(1) ALIGNED;
```

```
DCL I                   FIXED BIN(15);
DCL ERR                 BIT(1) ALIGNED;
DCL NULL                BUILTIN;

;
/*---------------------------------------------------------------------------*/
/* Initialization Code                                                       */
/*---------------------------------------------------------------------------*/
DONE=@FALSE;
INIT_#SIGS=MONITOR.#SIGNALS; /* Remember how many signals to start with */
    dp$_state_stack_ptr  = 0;
    dp$_symbol_stack_ptr = 0;
    dp$_current_state    = 1;
    do while('1'b);
        if ^dp$_look & /* don't already have next symbol. */
            dp$_action_list_info(dp$_current_state, dp$_alias_) ^= -1 /* flag that
            says to read a symbol.
            then /* read a symbol. */
                do;
                    call lexer(dp$_tknt, dp$_tknp);
                    dp$_look = '1'b;
                end;
        dp$_state_stack_ptr = dp$_state_stack_ptr + 1; /* push current state. */
        dp$_state_stack(dp$_state_stack_ptr) = dp$_current_state;
        dp$_action = dp$_access_action_list(dp$_current_state, dp$_tknt);
dp$_loop:
        if dp$_action > 0
            then /* shift. */
                do;
                    dp$_symbol_stack_ptr = dp$_symbol_stack_ptr + 1; /* push current
                    symbol. */
                    dp$_symbol_stack(dp$_symbol_stack_ptr) = dp$_tknp;
                    dp$_look = '0'b;
                    dp$_current_state = dp$_action;
                end;
            else
        if dp$_action < 0
            then /* reduce. */
                do;
                    if dp$_reduce_list_info(- dp$_action, dp$_rhslen_) > 0 /* have a rhs. */
                        then /* $$ = $1. (default) */
                            dp$_reduce_result =
                                dp$_symbol_stack(dp$_symbol_stack_ptr - dp$_reduce_list_info(-
                                dp$_action, dp$_rhslen_) +
                        else /* $$ = null(). */
                            dp$_reduce_result = null();
                    go to dp$_reduce_case(- dp$_action);
dp$_reduce_case(1):
                    do;

/* <CMD> ::= S_EOL */
    DONE=@TRUE;

go to dp$_end_reduce_case;
                    end;
dp$_reduce_case(2):
                    do;

/* <CMD>        ::= <MONITOR-SIGS> S_EOL */
    MONITOR.VARIABLE_NAMES = MONITOR.VARIABLE_NAMES ||
                SUBSTR(LINEX.LIVE,1,LINEX.NLINE) || ' ';

go to dp$_end_reduce_case;
                    end;
dp$_reduce_case(3):
                        go to dp$_end_reduce_case;
dp$_reduce_case(4):
                        go to dp$_end_reduce_case;
dp$_reduce_case(5):
                        go to dp$_end_reduce_case;
dp$_reduce_case(6):
                    do;
```

```
/* Parse the signal, unwind down to the output pin, and add the    */
/* output pin slot pointer to the list of slots (signals) to be    */
/* monitored.                                                       */
RPNDEPTH=0;
NAMDEPTH=0;
dp$_reduce_result = INPSGVR(RPNSTK,RPNDEPTH,NAMSTK,NAMDEPTH);
IF dp$_reduce_result = NULL() THEN DO;
    MESSAGE='Variable specification entered incorrectly. '||
            'Check syntax.';
    CALL OUT$MSG(@ERROR,MESSAGE);
    GOTO ERROR;
    END;
ELSE DO;
    FLAG=&GVR_INIT;
    MORE_SIGNALS=UNWIND_PIN(RPNSTK,RPNDEPTH,NAMSTK,NAMDEPTH,FLAG,NAME,
                            SLOT_PTR,ERR);
    DO WHILE(MORE_SIGNALS & ^ERR);
        MONITOR.#SIGNALS=MONITOR.#SIGNALS+1;
        IF MONITOR.#SIGNALS>@MAXMONSIG THEN DO;
            MESSAGE='Can only monitor '||CHAR(&MAXMONSIG)||
                    ' signals with one MONITOR command.';
            CALL OUT$MSG(@ERROR_PL,MESSAGE);
            ERR=@TRUE;
            END;
        ELSE DO;
            I=MONITOR.#SIGNALS;
            MONITOR.SIGNAL(I).NAME=NAME;
            MONITOR.SIGNAL(I).SLOT_PTR=SLOT_PTR;
            MORE_SIGNALS=UNWIND_PIN(RPNSTK,RPNDEPTH,NAMSTK,NAMDEPTH,
                            FLAG,NAME,SLOT_PTR,ERR);
            END;
        END;
    IF ERR THEN GOTO ERROR;
    END;
LPC$MONG: /* oercmer rev 19.0 */ go to dp$_end_reduce_case;
           end;
dp$_end_reduce_case:
           dp$_symbol_stack_ptr = dp$_symbol_stack_ptr - dp$_reduce_list_info(-
           dp$_action, dp$_rhslen_) + dp$_state_stack_ptr = dp$_state_stack_ptr
           - dp$_reduce_list_info(- dp$_action, dp$_rhslen_);if dp$_reduce_list
           _info(- dp$_action, dp$_otherwise_) = 0
             then /* accept. */
               do;
                   return(dp$_reduce_result);
               end;
           dp$_symbol_stack(dp$_symbol_stack_ptr) = dp$_reduce_result;
           dp$_top_state = dp$_state_stack(dp$_state_stack_ptr);
           dp$_current_state = dp$_access_reduce_list(- dp$_action, dp$_top_
           state);

end;
       else
     if dp$_action = 0 /* only option left! */
       then /* error. */
         do;

/*--------------------------------------------------------*/
           /* Syntactic errors exit to here.                         */
           /*--------------------------------------------------------*/
           CALL UNRCGZ;
           CALL OLDRSP;
           CALL CLRNM_;
           /*--------------------------------------------------------*/
           /* Semantic errors exit to here.                          */
           /*--------------------------------------------------------*/
           /* Reset the number of signals stored in MONITOR block. */
ERROR:     MONITOR.#SIGNALS=INIT_#SIGS;
           DP$_LOOK = @FALSE;
```

```
              return(null());
          end;
    dp$_next:
       end;
    dp$_number_of_actions:
       procedure(state_number) returns(bin);
          dcl state_number bin;
          dcl (i, j, k, l) bin;
          k = 0; /* count of actions. */
          i = dp$_action_list_info(state_number, dp$_alias_);
          do j = 1 to dp$_action_list_length;
             l = j - dp$_action_list_info(state_number, dp$_base_);
             if dp$_action_list(j, dp$_check_) = i
                then
                   if l ^= -1
                      then
                         k = k + 1;
          end;
          return(k);
       end /* of dp$_number_of_actions */;
    dp$_nth_action:
       procedure(state_number, n) returns(bin);
          dcl (state_number, n) bin;
          dcl (i, j, k, l) bin;
          k = 1;
          i = dp$_action_list_info(state_number, dp$_alias_);
          do j = 1 to dp$_action_list_length;
             l = j - dp$_action_list_info(state_number, dp$_base_);
             if dp$_action_list(j, dp$_check_) = i
                then
                   if l ^= -1
                      then
                         if k = n
                            then
                               return(l);
                            else
                               k = k + 1;
          end;
          return(0); /* should never get here. */
       end /* of dp$_nth_action */;
    dp$_access_action_list:
       procedure(row, offset) returns(bin);
          dcl (row, offset, i) bin;
          i = dp$_action_list_info(row, dp$_base_) + offset; /* base(s) + a */
          if i >= 1 & i <= dp$_action_list_length
             then /* inside bounds, consult table. */
                if dp$_action_list(i, dp$_check_) =
                   dp$_action_list_info(row, dp$_alias_)
                   then /* match! check(base(s) + a) = alias(s) */
                      return(dp$_action_list(i, dp$_next_)); /* next(base(s) + a) */
          /* get here if outside bounds of table, or no match. */
          return(dp$_action_list_info(row, dp$_otherwise_)); /* otherwise(s) */
       end /* of dp$_access_action_list */;
    dp$_access_reduce_list:
       procedure(row, offset) returns(bin);
          dcl (row, offset, i) bin;
          i = dp$_reduce_list_info(row, dp$_base_) + offset; /* base(s) + a */
          if i >= 1 & i <= dp$_reduce_list_length
             then /* inside bounds, consult table. */
                if dp$_reduce_list(i, dp$_check_) =
                   dp$_reduce_list_info(row, dp$_alias_)
                   then /* match! check(base(s) + a) = alias(s) */
                      return(dp$_reduce_list(i, dp$_next_)); /* next(base(s) + a) */
          /* get here if outside bounds of table, or no match. */
          return(dp$_reduce_list_info(row, dp$_otherwise_)); /* otherwise(s) */
       end /* of dp$_access_reduce_list */;
    dcl dp$_toke_entry(bin) returns(char(32) varying);
;
UNWIND_PIN: PROC(RPNSTK,RPNDEPTH,NAMSTK,NAMDEPTH,FLAG,NAME,SLOT_PTR,ERR)
            RETURNS(BIT(1) ALIGNED);
    DCL NAMDEPTH             FIXED BIN(15);        /* IN - Name stacks */
    DCL NAMSTK(@MXGVR_STK)   PTR;
```

```
DCL RPNDEPTH              FIXED BIN(15);
DCL RPNSTK(@MXGVR_STK)    FIXED BIN(15);
DCL FLAG                  FIXED BIN(15);        /* IN  - Flag for SUBSRTN   */
DCL NAME                  CHAR(*) VAR;          /* OUT - Name of pin        */
DCL SLOT_PTR              PTR OPTIONS(SHORT);   /* OUT - Ptr to ID slot     */
DCL ERR                   BIT(1) ALIGNED;       /* OUT - Lookup error       */
DCL ANOTHER_NAME          BIT(1) ALIGNED;       /* RETURNED - more names?   */
/*--------------------------------------------------------------------------*/
DCL UWC_NAME(@RMXLV1)     CHAR(@MXSYMN) VAR,
    UWC_N_NAMES           FIXED BIN(15),
    RANGE(5)              FIXED BIN(15),
    ELMTBASE              PTR OPTIONS(SHORT),
    UWC_FLAG              FIXED BIN(15),
    UWP_FLAG              FIXED BIN(15),
    OUT_PTR               PTR OPTIONS(SHORT),
    INA_PIN               PTR OPTIONS(SHORT),
    INZ_PIN               PTR OPTIONS(SHORT),
    I                     FIXED BIN(15),
    UWC_E_LOC             FIXED BIN(15);
/*--------------------------------------------------------------------------*/
%INCLUDE '>THEMISSRC>INSERT>GLOBAL.PL1G';
%INCLUDE '>CADSRC>INSERT>SYMBO_TYPES.INS.SPL';
%INCLUDE '>CADSRC>INSERT>SYMBOLS.INS.SPL';
%INCLUDE '>THEMISSRC>INSERT>SYMTAB_CODE.PL1G';
/*--------------------------------------------------------------------------*/
DCL SUBSRTNR              ENTRY((@MXGVR_STK) FIXED BIN(15), FIXED BIN(15),
                                (@MXGVR_STK) PTR,           FIXED BIN(15),
                                (@RMXLV1) CHAR(@MXSYMN) VAR,FIXED BIN(15),
                                (5) FIXED BIN(15),          FIXED BIN(15))
                          RETURNS(BIT(1) ALIGNED),
    GTS$UWC               ENTRY(PTR OPTIONS(SHORT),
                                (@RMXLV1) CHAR(@MXSYMN) VAR,
                                FIXED BIN(15),
                                PTR OPTIONS(SHORT),
                                FIXED BIN(15),
                                PTR OPTIONS(SHORT),
                                FIXED BIN(15)),
    GTS$UERR              ENTRY(FIXED BIN(15),(@RMXLV1) CHAR(@MXSYMN) VAR,
                                FIXED BIN(15), FIXED BIN(15)),
    GTS$UWP               ENTRY(PTR OPTIONS(SHORT),
                                CHAR(@MXSYMN) VAR,
                                PTR OPTIONS(SHORT),
                                PTR OPTIONS(SHORT),
                                PTR OPTIONS(SHORT),
                                PTR OPTIONS(SHORT),
                                FIXED BIN(15));
/*--------------------------------------------------------------------------*/
ERR=@FALSE;
IF ^SUBSRTNR(RPNSTK,RPNDEPTH,NAMSTK,NAMDEPTH,UWC_NAME,UWC_N_NAMES,RANGE,FLAG)
    THEN ANOTHER_NAME=@FALSE;
ELSE DO;
    ANOTHER_NAME=@TRUE;
    CALL GTS$UWC(ELMTTOP,UWC_NAME,UWC_N_NAMES,ELMTBASE,UWC_E_LOC,
                 SYMBBASE,UWC_FLAG);
    NAME='';
    DO I=1 TO UWC_N_NAMES-1;
        NAME=NAME||UWC_NAME(I)||'.';
        END;
    NAME=NAME||UWC_NAME(UWC_N_NAMES);
    /* Error if name not found. */
    IF UWC_FLAG^=@FOUND THEN DO;
        CALL GTS$UERR(@ERROR,UWC_NAME,UWC_N_NAMES,UWC_E_LOC);
        ERR=@TRUE;
        END;
    /* Must be a pin or signal. */
    ELSE IF SUB$ISPN(SYMBOL.TYPE) | SYMBOL.TYPE=@ELMNET | SYMBOL.TYPE=@NET
        THEN DO;
        /* If this is an alternate pin, then step around it. */
        IF SYMBOL.TYPE=@ALTPIN THEN SYMBBASE=ALT_PIN.PIN;
        CALL GTS$UWP(ELMTBASE,UWC_NAME(UWC_N_NAMES),OUT_PTR,INA_PIN,
                     INZ_PIN,SYMBBASE,UWP_FLAG);
        IF UWP_FLAG^=@FOUND THEN DO;
```

```
            CALL OUTSMSG(@ERROR,JWC_NAME(UWC_N_NAMES)||' not found.');
            ERR=@TRUE;
            END;
         ELSE IF OUT_PTR^=NULL THEN SLOT_PTR=OUT_PTR;
         ELSE IF INA_PIN^=NULL THEN SLOT_PTR=INA_PIN;
         ELSE DO;
            MESSAGE=NAME||' is not connected to any outputs or inputs, and'||
                    ' therefore cannot be monitored.';
            CALL OUTSMSG(@ERROR,MESSAGE);
            ERR=@TRUE;
            END;
         END;
/* Not a pin or signal. */
      ELSE DO;
         MESSAGE='The DEFINE MONITOR command can only monitor pins and '||
                 'nets. '||NAME||' is not a pin or net.';
         CALL OUTSMSG(@ERROR,MESSAGE);
         ERR=@TRUE;
         END;
      END;
RETURN(ANOTHER_NAME);
END UNWIND_PIN;
end /* of LPC$MONG */;

/* SIM$LE.SPL, THEMISSRC>SOURCE>SIM$, CAD/CAM, 09/13/82                    */

/* SIM$LE.SPL, THEMISSRC>SOURCE>SIM$, CAD/CAM, 09/13/82                    */
/* Processes 'LAST EVENT'                                                  */
/* Copyright (C) 1982, Prime Computer, Inc., Natick, Ma 01760              */

SIM$LE: PROC;

/*------------------------------------------------------------------------*/
/*                                                                         */
/*   PERFORMS ACTIVITIES THAT OCCUR AT THE END OF A TIME STEP. THE ACTIVITIES */
/*   INCLUDE: PROCESSING 'WHEN' BLOCKS.                                    */
/*                                                                         */
/*------------------------------------------------------------------------*/
/*                                                                         */
/* History:                                                                */
/* Date              Programmer        Description                         */
/* 05/10/83   RICKS                    Modified to process detection reporting */
/* 03/08/83   RICKS                    Added OUTSMSG include for CONTROL_BLOCKS */
/* 02/08/83   MAHESH                   Added Initialization of MIN_STEP    */
/* 01/12/83              RICKS         Added STOPEVNT flag                 */
/* MON, 13 SEP 1982     RICKS          Pull LAST EVENTS off event list     */
/* SUN, 16 JUL 1982     RBS            Change RESPND include name          */
/* SUN, 22 JUN 1982     RBS            Don't load action list if PAL=@TRUE */
/*                                                                         */
/*------------------------------------------------------------------------*/
/*   HISTORY:                                                              */
/*          31 JUL 1981 -DMS- CREATED DUMMY PROC                           */
/*          08 DEC 1981 -RBS- ADDED WHEN BLOCK PROCESSING CODE.            */
/*          16 DEC 1981 -RBS- MOVED MOST OF WHEN CODE INTO SIM$WHN.        */
/*          21 DEC 1981 -RBS- MOVED INVARIANTS OUT OF LOOP, AND UPDATED CMTS */
/*   WED, 20 JAN 1982 -RBS- UPDATED TO HANDLE ACTION LISTS                 */
/*   MON, 01 FEB 1982 -RBS- ADDED RESPND_CODES INCLUDE                     */
/*   SAT, 06 FEB 1982 -RBS- SET 'BRK' IF 'STOPFLG' ALREADY TRUE            */
/*   WED, 17 FEB 1982 -RBS- APPEND RATHER THAN PUSH ACTION LISTS ONTO INBUF */
/*   WED, 24 MAR 1982 -RBS- CHANGE "TERMSTATES" TO "TESTSTATE"             */
/*                                                                         */
/*------------------------------------------------------------------------*/

%INCLUDE 'CADSRC>INSERT>MAX_NAMSIZ.INS.SPL'; /* Must be included first */
      %INCLUDE 'THEMISSRC>INSERT>LAST_EVENT.INS.SPL';
      %INCLUDE 'THEMISSRC>INSERT>WHEN_TESTCODES.PL1G';
      %INCLUDE 'CADSRC>ENTRIES>OUTSMSG.INS.SPL';
      %INCLUDE 'THEMISSRC>INSERT>WHEN_SIZE_LIMITS.PL1G';
      %INCLUDE 'THEMISSRC>INSERT>CONTROL_BLOCKS.INS.SPL';
      %INCLUDE 'THEMISSRC>INSERT>ACTION_FLAGS.SPL';
      %INCLUDE 'CADSRC>INSERT>RESPND_CODES.INS.SPL'; /* before INPUT_BUFFER */
```

```
%INCLUDE 'CADSRC>INSERT>INPUT_BUFFER.SPL';
%INCLUDE 'THEMISSRC>INSERT>WHEEL.PL1G';
%INCLUDE 'THEMISSRC>INSERT>GLOBAL.PL1G';

%REPLACE @TRUE BY '1'B;
%REPLACE @FALSE BY '0'B;
%REPLACE @FTN_TRUE BY 1;
%REPLACE @FTN_FALSE BY 0;

DCL DSCBASE            POINTER OPTIONS(SHORT),
    LNPTR              POINTER,
    P                  PTR OPTIONS(SHORT),
    Q                  PTR OPTIONS(SHORT),
    WHEN_BRK_OCCURRED  BIT(1) ALIGNED,
    ANY_NULL_ACTIONS   BIT(1) ALIGNED,
    NO_ACTIONS         BIT(1) ALIGNED;

/*---------------------------------------------------------------*/
/* Append action list to input buffer, with option of deleting   */
/* input buffer when it is read.                                 */
/*---------------------------------------------------------------*/

DCL INP$APND           ENTRY(POINTER,BIT(1) ALIGNED);
DCL SIM$ESU            ENTRY;
DCL FLT$DRPT           ENTRY;

DCL NULL               BUILTIN;

/*---------------------------------------------------------------*/
/* Process STORaGe EValuation Last Events.                       */
/* If any traced storages have changed, then evaluate the trace test. */
/* If it evaluates true, then schedule a trace last event.       */
/*---------------------------------------------------------------*/

IF STGEVLE^=NULL THEN CALL SIM$ESU;

/*---------------------------------------------------------------*/
/* If any inputs to the DETECT block have changed, call the detection */
/* reporting routine.                                            */
/*---------------------------------------------------------------*/

IF DETLE^=NULL THEN CALL FLT$DRPT;

/*---------------------------------------------------------------*/
/* Process TRACE Last Events.                                    */
/* The entire purpose of this code    is to clear the term state flags */
/* in the when and trace descriptors, and to load the action lists into */
/* the input buffers.                                            */
/*---------------------------------------------------------------*/

WHEN_BRK_OCCURRED=@FALSE;
NO_ACTIONS=@TRUE;
ANY_NULL_ACTIONS=@FALSE;
DO WHILE(TRACELE^=NULL);
   DSCBASE=TRACELE->LAST_EVENT.DATA;

IF WHNDSC.TYPE=@PRECOMPILED_WHEN & WHNDSC.TESTSTATE=@BRKTRUE THEN DO;
      /* Precompiled action list. */
      IF WHNDSC.P_ACTIONS^=NULL THEN DO;
         CALL PERFORM_PRECOMPILED_WHEN;
         END;
      END;

ELSE IF WHNDSC.TYPE=@WHEN & WHNDSC.TESTSTATE=@BRKTRUE THEN DO;

WHEN_BRK_OCCURRED=@TRUE;

IF WHNDSC.ACTIONS^=NULL THEN DO;
         /*------------------------------------------------------*/
         /* Load action list into input buffer, no delete on read. This */
         /* should only be done if the Processing Action List flag is   */
```

```
             /* false. Normally this will be the case. Exception: during    */
             /* initialization a WHEN brk can evaluate true during zero delay */
             /* processing, resulting in an action list being loaded into the */
             /* input buffer and the PAL flag being set true. The action list */
             /* will not be executed, however. Instead the simulator will    */
             /* remove initialization force gates and simulate again,        */
             /* resulting in the WHEN brk evaluating true again, and its     */
             /* action list being load into the input buffer again.          */
             /*-------------------------------------------------------------*/

IF PAL=@FTN_FALSE THEN CALL INP$APND(WHNDSC.ACTIONS,@FALSE);
             NO_ACTIONS=@FALSE;
             END;
         ELSE DO;
             ANY_NULL_ACTIONS=&TRUE;
             END;
         END;
      WHNDSC.TESTSTATE=@TESTFALSE; /* INITIALIZE FOR NEXT TEST EVALUATION */

P=TRACELE->LAST_EVENT.NEXT;
      FREE TRACELE->LAST_EVENT;
      TRACELE=P;
      END;

/*----------------------------------------------------------------------*/
/* Initialize action list processing flags.                             */
/*----------------------------------------------------------------------*/

IF WHEN_BRK_OCCURRED THEN DO;
    IF NO_ACTIONS THEN DO;

/*------------------------------------------------------------*/
        /* If there are no action lists to be processed, then a break */
        /* should occur.                                              */
        /*------------------------------------------------------------*/

PAL=&FTN_FALSE;
        BRK=&FTN_TRUE; /* Modifies action of CONTINUE cmd. */
        END;
    ELSE DO;

/*------------------------------------------------------------------*/
        /* Append the TALP control command to end of action lists, only if  */
        /* PAL not true. See comment above.                                 */
        /*------------------------------------------------------------------*/

MIN_STEP=@MAXSTEP;
        IF PAL^=@FTN_TRUE THEN DO;
            ALLOC. BUFLINE SET(LNPTR);
            LNPTR->BUFLINE.DATA='  ;;TALP';
            LNPTR->BUFLINE.NEXT=NULL;
            CALL INP$APND(LNPTR,@TRUE); /* Delete this line after reading */
            END;

/*------------------------------------------------------------*/
        /* A break should only occur if there is an action list       */
        /* without a SIM, STEP, or CONTINUE command at the end.       */
        /* Also, if the STOPFLG was set (by a SIM or STEP cmd)        */
        /* then break should occur, independent of the content of     */
        /* the action lists.                                          */
        /*------------------------------------------------------------*/

ACE=@FTN_FALSE; /* Controls setting of BRK flag. */
        BRK=&FTN_FALSE; /* true=>rtn to cmd file input after act processing */
        IF ANY_NULL_ACTIONS THEN BRK=@FTN_TRUE;
        PAL=@FTN_TRUE; /* Defers execuition of STEP, SIM or CONTINUE */
        /* Removed becuase action list sim cmds should take precedence */
        /* over previously typed user sim cmds.                        */
        /* IF INITDONE = 0 & STOPFLG>1 THEN BRK=&FTN_TRUE; */
        /* IF INITDONE = 1 & STOPFLG>0 THEN BRK=&FTN_TRUE; */
        END;
STOPEVNT=STOPFLG;
```

```
        STOPFLG=STOPFLG+1;
        END;

/*==============================================================================*/

PERFORM_PRECOMPILED_WHEN: PROC;

/*------------------------------------------------------------------------------*/
/* The when descriptor has a list of precompiled actions to be performed.       */
/* The action specified by each item in the list is performed.                  */
/*------------------------------------------------------------------------------*/

DCL PRT$MN      ENTRY(CHAR(@MXFLN4) VAR,BIT(1) ALIGNED,BIT(1) ALIGNED,
                    BIT(1) ALIGNED,BIT(1) ALIGNED,BIT(1) ALIGNED,
                    FIXED BIN(15));

DCL LPC$SAMP    ENTRY(FIXED BIN(15));
DCL LPC$READ    ENTRY(FIXED BIN(15))
                RETURNS(PTR);

DCL P           PTR OPTIONS(SHORT);

DO P=WHNDSC.P_ACTIONS REPEAT(P->ACTION.NEXT) WHILE(P^=NULL);

GOTO PERFORM(P->ACTION.CODE);

PERFORM(@PRINT_ACTION):;
        CALL PRT$MN('TTY',@FALSE,@FALSE,@FALSE,@FALSE,@TRUE,P->ACTION.REF#);
        GOTO END_PERFORM;

PERFORM(@SAMPLE_ACTION):;
        CALL LPC$SAMP(P->ACTION.REF#);
        GOTO END_PERFORM;

PERFORM(@READ_ACTION):;
        /* Returned ptr is an error flag. */
        IF LPC$READ(P->ACTION.REF#) = NULL THEN;
        GOTO END_PERFORM;

PERFORM(@SIM_ACTION):;
        STOP_PTR=NULL;
        STOP_TIM=@STOP_ON_NOACT;
        GOTO END_PERFORM;

END_PERFORM:;
   END;

END PERFORM_PRECOMPILED_WHEN;

END SIM$LE;
/* LPC$SAMP.SPL, THEMISSRC>SOURCE>LPC$, CAD/CAM, 02/08/83                        */

/* LPC$SAMP.SPL, THEMISSRC>SOURCE>LPC$, CAD/CAM, 02/08/83                        */
/* 'SAMPLE' COMMAND PROCESSING                                                  */
/* COPYRIGHT (C) 1983, Prime Computer, Inc., Natick, Ma 01760                   */

LPC$SAMP: PROC(REF#);

/*------------------------------------------------------------------------------*/
/* Description:                                                                 */
/*                                                                              */
/*   This procedure walks through all the pins in the referenced MONITOR        */
/* control block, sampling their values and storing in the MONITOR stack.       */
/*                                                                              */
/* History:                                                                     */
/* Date      Programmer   Description of modification                           */
/* 03/21/83  RICKS        Fixed bug in error reporting.                         */
/* 03/07/83  RICKS        Fixed bug in storing X and Z values.                  */
/* 03/05/83  LORNE        Re-arranged include file order.                       */
/* 02/08/83  RICKS        Initial coding.                                       */
/*------------------------------------------------------------------------------*/
```

```
DCL REF#              FIXED BIN(15);         /* IN - Of MONITOR block.        */

%INCLUDE '>CADSRC>INSERT>MAX_NAMSIZ.INS.SPL';
%INCLUDE '>CADSRC>ENTRIES>OUTSMSG.INS.SPL';
%INCLUDE '>THEMISSRC>INSERT>WHEN_SIZE_LIMITS.PL1G';
%INCLUDE '>THEMISSRC>INSERT>WHEN_TESTCODES.PL1G';
%INCLUDE '>THEMISSRC>INSERT>CONTROL_BLOCKS.INS.SPL';
%INCLUDE '>THEMISSRC>INSERT>CHGCODE.PL1G';
%INCLUDE '>THEMISSRC>INSERT>WHEEL.PL1G';

%REPLACE @TRUE BY '1'B;
%REPLACE @FALSE BY '0'B;

DCL DSCBASE           PTR OPTIONS(SHORT);
DCL RC                FIXED BIN(15);
DCL WORD              FIXED BIN(15);
DCL I                 FIXED BIN(15);
DCL VALUE             FIXED BIN(15);
/* LPC$SAMP.SPL, THEMISSRC>SOURCE>LPCS, CAD/CAM, 02/08/85                     */

DCL MASK              BIT(16) ALIGNED;

DCL NULL              BUILTIN;

DCL GTS$CBH           ENTRY(CHAR(3),BIT(1) ALIGNED,FIXED BIN(15),
                          PTR OPTIONS(SHORT),FIXED BIN(15));
DCL GTS$GPV           ENTRY(PTR OPTIONS(SHORT),PTR OPTIONS(SHORT),
                          BIT(1) ALIGNED)
                          RETURNS(FIXED BIN(15));

/*---------------------------------------------------------------------------*/
/* Set the pointer to the MONITOR block, and do error checking.              */
/*---------------------------------------------------------------------------*/

CALL GTS$CBH('GP',@TRUE,REF#,DSCBASE,RC);

IF RC^=@CBHNOERRS THEN; /* DO NOTHING */
ELSE IF DSCBASE=NULL THEN DO;
    MESSAGE='Reference number '||REF#||' has not been assigned to anything'||
        ' yet!';
    CALL OUT$MSG(@ERROR,MESSAGE);
    END;
ELSE IF DSCBASE->MONITOR.TYPE^=@MONITOR THEN DO;
    MESSAGE='Reference number '||REF#||' does not reference a '||
        'MONITOR command.';
    CALL OUT$MSG(@ERROR,MESSAGE);
    END;

/*---------------------------------------------------------------------------*/
/* Read all the pin values and put them on the stack.                        */
/*---------------------------------------------------------------------------*/

ELSE DO;

/* Zero out top stack entry. */
    DO I=1 TO MONITOR.STACK_WIDTH;
        MONITOR.B_STACK_PTR->VAL_STACK(MONITOR.ARRAY_OFFSET+I-1)='0'B;
        MONITOR.ZX_STACK_PTR->VAL_STACK(MONITOR.ARRAY_OFFSET+I-1)='0'B;
        END;

/* Read signal values onto top of stack. */
    DO I=1 TO MONITOR.#SIGNALS;
    VALUE=GTS$GPV(MONITOR.SIGNAL(I).SLOT_PTR,NULL,@FALSE);
    GOTO SIG(VALUE);
        SIG(@W0):;
        SIG(@D0):;
        SIG(@0): GOTO END_SIG;
        SIG(@W1):;
        SIG(@D1):;
        SIG(@1): WORD=MONITOR.SIGNAL(I).STACK_WORD-1;
```

```
                MASK=MONITOR.SIGNAL(I).WORD_MASK;
                MONITOR.B_STACK_PTR->VAL_STACK(MONITOR.ARRAY_OFFSET+WORD)=
                    MONITOR.B_STACK_PTR->VAL_STACK(MONITOR.ARRAY_OFFSET+WORD) |
                    MASK;
                GOTO END_SIG;
     SIG(@Z):   WORD=MONITOR.SIGNAL(I).STACK_WORD-1;
                MASK=MONITOR.SIGNAL(I).WORD_MASK;
                MONITOR.B_STACK_PTR->VAL_STACK(MONITOR.ARRAY_OFFSET+WORD)=
                    MONITOR.B_STACK_PTR->VAL_STACK(MONITOR.ARRAY_OFFSET+WORD) |
                    MASK;
                MONITOR.ZX_STACK_PTR->VAL_STACK(MONITOR.ARRAY_OFFSET+WORD)=
                    MONITOR.ZX_STACK_PTR->VAL_STACK(MONITOR.ARRAY_OFFSET+WORD) |
                    MASK;
                GOTO END_SIG;
     SIG(@WX):;
     SIG(@DX):;
     SIG(@X):   WORD=MONITOR.SIGNAL(I).STACK_WORD-1;
                MASK=MONITOR.SIGNAL(I).WORD_MASK;
                MONITOR.ZX_STACK_PTR->VAL_STACK(MONITOR.ARRAY_OFFSET+WORD)=
                    MONITOR.ZX_STACK_PTR->VAL_STACK(MONITOR.ARRAY_OFFSET+WORD) |
                    MASK;
                GOTO END_SIG;
     END_SIG:;
     END;

/* Push time onto stack. */
    MONITOR.TIME_PTR->TIME_STACK(MONITOR.STACK_INDEX)=TIMSTEP;

/* Determine next stack position to be loaded. */
    IF MONITOR.#VALID_ENTRIES<MONITOR.STACK_DEPTH THEN DO;
        MONITOR.#VALID_ENTRIES=MONITOR.#VALID_ENTRIES+1;
        END;
    IF MONITOR.STACK_INDEX>=MONITOR.STACK_DEPTH THEN DO;
        MONITOR.STACK_INDEX=1;
        MONITOR.ARRAY_OFFSET=1;
        END;
    ELSE DO;
        MONITOR.STACK_INDEX=MONITOR.STACK_INDEX+1;
        MONITOR.ARRAY_OFFSET=MONITOR.ARRAY_OFFSET+MONITOR.STACK_WIDTH;
        END;
    END;

END LPC$SAMP;
/* PRTSMON.SPL, THEMISSRC>SOURCE>PRTS, CAD/CAM, 05/26/82                        */

/* PRTSMON.SPL, THEMISSRC>SOURCE>PRTS, CAD/CAM, 05/26/82                        */
/* PRINT MONITOR command                                                        */
/* Copyright (C) 1983, Prime Computer, Inc., Natick, Ma 01760                   */

PRTSMON: PROC(TGT_FILE,WAVE,PMODE,REF#);

/* Description:                                                                 */
/* Build header                                                                 */
/* Get width of a column                                                        */
/* Get # columns per device line                                                */
/* Get # of lines per device page                                               */
/* #pages = #entries / (#columns * #lines)                                      */
/* Create header                                                                */
/* For all #pages,                                                              */
/*   If output to TTY, do own header formatting                                 */
/*   For all #lines                                                             */
/*      For all columns                                                         */
/* Loop through stacks,                                                         */
/*    If #VALID_ENTRIES = MONITOR.STACK_DEPTH then                              */
/*          from STACK_INDEX to STACK_INDEX-1   BY #lines per page              */
/*                          For #columns per line                               */
/*    Write one line                                                            */
/* End,End,End                                                                  */
/*------------------------------------------------------------------------------*/
/*                                                                              */
```

```
/* History:                                                                     */
/* Date         Programmer    Description                                       */
/* 03/25/83     LORNE         Force SPL conversion from BIN to CHAR in messages */
/* 03/18/83     RICKS         Return if OUTSINIT returns @FALSE                 */
/* 03/16/83     LORNE         Made MAX_TIME fixed bin(31)                       */
/* 02/28/83     LORNE         Created to emulate PRTSMN while printing a monitor*/
/*-----------------------------------------------------------------------------*/

%INCLUDE 'CADSRC>ENTRIES>OUTSMSG.INS.SPL';
%INCLUDE 'CADSRC>INSERT>MAX_NAMSIZ.INS.SPL';
%INCLUDE 'THEMISSRC>INSERT>WHEN_SIZE_LIMITS.PL1G';
%INCLUDE 'THEMISSRC>INSERT>CONTROL_BLOCKS.INS.SPL';
%INCLUDE 'CADSRC>INSERT>SYMBOL_TYPES.INS.SPL';

/* PRTSMN.SPL, THEMISSRC>SOURCE>PRTS, CAD/CAM, 05/26/82                        */

%INCLUDE 'CADSRC>INSERT>FILE_STATUS.INS.SPL';
%INCLUDE 'CADSRC>INSERT>QUERY_CODES.INS.SPL';
%INCLUDE 'CADSRC>INSERT>RPT_HEADER.INS.SPL';

DCL TGT_FILE         CHAR(@MXFLNM) VAR;  /* WHERE DOES THIS REPORT GO? */
DCL WAVE             BIT(1) ALIGNED;     /* WAVEFORM PARM SPECIFIED    */
DCL PMODE            FIXED BIN(15);      /* LIST PRINT MODE RADIX      */
DCL REF#             FIXED BIN(15);      /* REFERENCE #; <0 => NONE SPECD */

DCL GTS$CBH          ENTRY(CHAR(3),BIT(1) ALIGNED,FIXED BIN(15),
                     PTR OPTIONS(SHORT),FIXED BIN(15));
DCL OUT$RPT          ENTRY(PTR,CHAR(@MXFLNM) VAR,FIXED BIN(15),
                         CHAR(@MXSTRLN) VAR,PTR OPTIONS(SHORT),
                         FIXED BIN(15))RETURNS(BIT(1) ALIGNED);
DCL OUT$INIT         ENTRY(PTR,CHAR(@MXFLNM) VAR, FIXED BIN(15), FIXED BIN(15))
                     RETURNS(BIT(1) ALIGNED);
DCL GTS$CBVS         ENTRY(BIT(*) ALIGNED,BIT(*) ALIGNED,BIT(*) ALIGNED,
                         FIXED BIN(15),FIXED BIN(15),CHAR(*) VAR);
DCL PRT$WFM          ENTRY(POINTER OPTIONS(SHORT), POINTER);

DCL ERROR            CONDITION;
DCL ARITH$           CONDITION;

DCL (NULL, LENGTH, INDEX, MOD, MIN, MAX, TRIM, CHAR)    BUILTIN;

DCL DSCBASE          POINTER OPTIONS(SHORT); /* Points to the MONITOR */
DCL FILE_STATUS_PTR  PTR;                    /* Points to FILE_STATUS_BLOCK */
DCL RC               FIXED BIN(15);          /* Returned Code: Ignored */
DCL RADIX_FACTOR     FIXED BIN(15);          /* # bits per character */
DCL RADIX_NAME       CHAR(7) VAR;            /* Ascii, binary, etc. */

/* Max lines per page, time step sampled, Max data per page etc */
DCL MAX_TIME         FIXED BIN(31);
DCL (MAX_LINES, MAX_COLUMNS, MAX_PER_PAGE)              FIXED BIN(15);
        /* Column_width = @Time_widthBData-widthBdata */
DCL (TIME_WIDTH, COLUMN_WIDTH, DATA_WIDTH)              FIXED BIN(15);
        /* Expands to fit min # pages */
DCL (NUM_COLUMNS, NUM_LINES, NUM_PAGES, NUM_FULL_COLUMNS) FIXED BIN(15);
DCL DATA_LINE        CHAR(@MXSTRLV) VAR;
        /* Do-loop indices, Index into the time,data queues */
DCL (PAGE, LINE, COLUMN, DATA_INDEX, TIME_INDEX)        FIXED BIN(15);

DCL VALUE_DEPTH      FIXED BIN(15);
DCL I                FIXED BIN(15);
DCL SP               FIXED BIN(15);
DCL TIME_STRING      CHAR(10) VAR;
DCL OUTPUT_TYPE      FIXED BIN(15);  /* Print_vert to a file, LIST to TTY */
DCL RPT              BIT(1) ALIGNED;
%PAGE;
ON CONDITION(ERROR) BEGIN;
    CALL OUT$MSG(@ERROR, 'Improperly formatted IO unit. Quitting PRINT MONITOR.');
    GOTO EXIT_STATEMENT;
    END;
ON CONDITION(ARITH$) BEGIN;
```

```
    CALL OUTSMSG(@ERROR, "Improperly formatted IO unit.  Quitting PRINT MONITOR.");
    GOTO EXIT_STATEMENT;
    END;

/* Establishing the MONITOR block (pointed to by DSCBASE) */
CALL GTS$CBH("GP","1"B,REF#,DSCBASE,RC);

/* Get file status pointer, return if user doesn't want to modify file */
IF ^OUT$INIT(FILE_STATUS_PTR, TGT_FILE, @OVWTAPND, RC) THEN RETURN;

IF INVALID_ARGS() THEN
    RETURN;

IF WAVE THEN DO;
    CALL PRT$WFM(DSCBASE,FILE_STATUS_PTR);
    RETURN;
    END;

/* Get max number of words in monitor's val_stack */
VALUE_DEPTH = MONITOR.STACK_DEPTH * MONITOR.STACK_WIDTH;
/* Get Num_Lines, Num_columns, Num_pages */
CALL GET_CONSTANTS;

CALL GET_HEADER;

IF MONITOR.#VALID_ENTRIES < MONITOR.STACK_DEPTH | MONITOR.STACK_INDEX =
    MONITOR.STACK_DEPTH THEN
    SP = 1;
ELSE
    SP = MONITOR.STACK_INDEX;

FILE_STATUS_PTR = NULL();
RPT = "1"B;
DO PAGE = 1 TO NUM_PAGES BY 1 WHILE(RPT);
     /* Last page has #LINES = Total-lines - Lines-already-Printed */
     /* Divided by the number of columns ... rounded up */
    IF PAGE = NUM_PAGES THEN /* May be fewer lines on the last page */
        NUM_LINES = DIVIDE( MONITOR.#VALID_ENTRIES -
                            (NUM_PAGES-1)*MAX_PER_PAGE +
                            (NUM_COLUMNS - 1), /* Rounding up */
                            NUM_COLUMNS, 15, 0);
    ELSE
        NUM_LINES = MAX_LINES;
    DO LINE = 1 TO NUM_LINES BY 1 WHILE(RPT);
        DATA_LINE = "";
        DATA_INDEX = 1 + ((SP - 1) * MONITOR.STACK_WIDTH);
        TIME_INDEX = SP;
        DO COLUMN = 1 TO NUM_COLUMNS;
            /* End-of-Page case, where line may not have all columns */
            IF PAGE = NUM_PAGES & LINE = NUM_LINES & COLUMN > 1 THEN DO;
                /* The remainder of */
                /* (maximum number of loop iterations)/(num to be printed)*/
                /* is the number of spaces NOT TO PRINT. */
                IF MOD((NUM_PAGES-1) * MAX_LINES * NUM_COLUMNS
                        + NUM_LINES * NUM_COLUMNS, /* # can print */
                        MONITOR.#VALID_ENTRIES)         /* # to print */
                    > (NUM_COLUMNS - COLUMN) THEN
                    GOTO PRINT_LINE; /* All done ! Print last line */
                END;
            TIME_STRING = TRIM(MONITOR.TIME_PTR -> TIME_STACK(TIME_INDEX), "11"B);
            DATA_LINE = DATA_LINE || " " || COPY(" ",TIME_WIDTH-LENGTH(TIME_STRING))
                        || TIME_STRING || " ";
            CALL GET_DATA_VALUE; /* Appends to DATA_LINE, uses DATA_INDEX */
            IF COLUMN < NUM_COLUMNS THEN  /* Else leaving loop ... keep indices */
                CALL UPDATE_TIME_DATA_INDICES;
            END;

PRINT_LINE:
        IF RPT THEN
            RPT = OUT$RPT(FILE_STATUS_PTR, TGT_FILE, @PRINT_VERT, DATA_LINE,
                    MONITOR.LIST_HEADER, RC);
```

```
         IF SP = MONITOR.STACK_DEPTH THEN SP = 1;   /* Wrapping ... queue */
         ELSE SP = SP + 1;
         END;
   /* On end of a page, start the indexing from after the last record */
   IF TIME_INDEX = MONITOR.STACK_DEPTH THEN SP = 1;
   ELSE SP = TIME_INDEX + 1;
   END;

EXIT_STATEMENT:; /* Clearing out the header */

RETURN;
/*=====================================================================*/
INVALID_ARGS: PROCEDURE RETURNS(BIT(1) ALIGNED);

DCL REF_NO           CHAR(12) VAR;

REF_NO = TRIM(REF#,'11'B);

IF RC ^= 0 THEN DO;
   CALL OUTSMSG(@ERROR, 'Reference number ' || REF_NO || ' cannot be found.');
   RETURN('1'B);
   END;
ELSE IF DSCBASE = NULL THEN DO;
   CALL OUTSMSG(@ERROR, 'Reference number ' || REF_NO ||
      ' has not yet been used.  Please DEFINE MONITOR ' || REF_NO);
   RETURN('1'B);
   END;
ELSE IF MONITOR.TYPE ^= @MONITOR THEN DO;
   IF MONITOR.TYPE = @WHEN THEN
      CALL OUTSMSG(@ERROR, 'Reference number ' || REF_NO ||
         ' is a WHEN block, not a MONITOR. Try WHEN ' ||
            REF_NO || ' LIST.');
   ELSE IF MONITOR.TYPE = @PRINT THEN
      CALL OUTSMSG(@ERROR, 'Reference number ' || REF_NO ||
         ' is a DEFINE PRINT block, not a MONITOR. Try PRINT ' ||
            REF_NO || '.');
   ELSE IF MONITOR.TYPE = @TRACE THEN
      CALL OUTSMSG(@ERROR, 'Reference number ' || REF_NO ||
         ' is a TRACE block, not a MONITOR. Try TRACE ' ||
            REF_NO || ' LIST.');
   ELSE IF MONITOR.TYPE = @READ THEN
      CALL OUTSMSG(@ERROR, 'Reference number ' || REF_NO ||
         ' is a READ block, not a MONITOR. Try READ ' ||
            REF_NO || ' LIST.');
   ELSE
      CALL OUTSMSG(@ERROR, 'Reference number ' || REF_NO ||
         ' is not a MONITOR.');

RETURN('1'B);
   END;
ELSE IF MONITOR.#VALID_ENTRIES < 1 THEN DO;
   CALL OUTSMSG(@NOTE, 'No entries in MONITOR ' || REF_NO ||
      '.  No entries are recorded without issuance of a "SAMPLE ' ||
      REF_NO || '" command.');
   RETURN('1'B);
   END;
ELSE
   RETURN('0'B);   /* arguments are not invalid */
END INVALID_ARGS;
%PAGE;
GET_HEADER: PROCEDURE;

/* On return, a Header has been written, the FILE_STATUS_PTR is valid, RPT */
/* is valid, and the MONITOR will have a LIST_HEADER pointer */

ALLOCATE HDR SET(MONITOR.LIST_HEADER);
MONITOR.LIST_HEADER -> HDR.#LINES = 2;
MONITOR.LIST_HEADER -> HDR.LINE(1) = 'Monitor list for Data ' ||
      MONITOR.VARIABLE_NAMES || '(' || RADIX_NAME || ')';

MONITOR.LIST_HEADER -> HDR.LINE(2) = '';
DO I = 1 TO NUM_COLUMNS;
```

```
      IF DATA_WIDTH > 6 THEN /* Center the word "DATA" a bit */
          MONITOR.LIST_HEADER -> HDR.LINE(2) = MONITOR.LIST_HEADER -> HDR.LINE(2) ||
                          ' ' || COPY(' ', TIME_WIDTH - 4) || 'TIME ' ||
                     '   DATA' || COPY(' ',DATA_WIDTH - 7);
      ELSE IF DATA_WIDTH >= 4 THEN
          MONITOR.LIST_HEADER -> HDR.LINE(2) = MONITOR.LIST_HEADER -> HDR.LINE(2)
                  || ' ' || COPY(' ', TIME_WIDTH - 4) || 'TIME ' ||
                     COPY(' ',DATA_WIDTH - 4) || 'DATA';
   END;
RETURN;
END GET_HEADER;
%PAGE;
GET_CONSTANTS: PROCEDURE;

IF PMODE = @OCTAL THEN DO;
   RADIX_FACTOR = 3;   /* Radix_factor = #bits per char */
   RADIX_NAME = 'OCTAL';
   END;
ELSE IF PMODE = @BINARY  THEN DO;
   RADIX_FACTOR = 1;
   RADIX_NAME = 'BINARY';
   END;
ELSE IF PMODE = @HEX      THEN DO;
   RADIX_FACTOR = 4;
   RADIX_NAME = 'HEX';
   END;
ELSE IF PMODE = @DECIMAL THEN DO;
   RADIX_FACTOR = 3;
   RADIX_NAME = 'DECIMAL';
   END;
ELSE DO;
   RADIX_FACTOR = 8;
   RADIX_NAME = 'ASCII';
   END;

IF MONITOR.#VALID_ENTRIES = MONITOR.STACK_DEPTH THEN DO;
   IF STACK_INDEX = 1 THEN
      MAX_TIME = MONITOR.TIME_PTR -> TIME_STACK(MONITOR.STACK_DEPTH);
   ELSE
      MAX_TIME = MONITOR.TIME_PTR -> TIME_STACK(MONITOR.STACK_INDEX - 1);
   END;
ELSE
   MAX_TIME = MONITOR.TIME_PTR -> TIME_STACK(MONITOR.STACK_INDEX - 1);

IF MAX_TIME < 10000 THEN
   TIME_WIDTH = 4;
ELSE IF MAX_TIME < 100000 THEN
   TIME_WIDTH = 5;
ELSE IF MAX_TIME < 1000000 THEN
   TIME_WIDTH = 6;
ELSE IF MAX_TIME < 10000000 THEN
   TIME_WIDTH = 7;
ELSE
   TIME_WIDTH = 10;

DATA_WIDTH = MAX(DIVIDE(MONITOR.#SIGNALS+RADIX_FACTOR-1, RADIX_FACTOR, 15, 0)
              ,4);
COLUMN_WIDTH = 3 + TIME_WIDTH + DATA_WIDTH;

NUM_COLUMNS = 1;                                 /* Columns per line */
IF TGT_FILE = 'TTY' THEN  /* Lines per page */
   MAX_LINES = FILE_STATUS_BLOCK.FORMAT.LENGTH - 3;
ELSE
   MAX_LINES = FILE_STATUS_BLOCK.FORMAT.LENGTH - 5;

MAX_COLUMNS = DIVIDE(FILE_STATUS_BLOCK.FORMAT.WIDTH, COLUMN_WIDTH, 15, 0);
IF MAX_LINES <= 2 | MAX_COLUMNS < 1 THEN DO;
   CALL OUT$MSG(@WARN, 'Improperly formatted file ' || TGT_FILE ||
       ' Using default spacing.');
   MAX_LINES = MAX(MAX_LINES, 2);
   MAX_COLUMNS = MAX(MAX_COLUMNS, 1);
   END;
```

```
NUM_LINES = MIN(MAX_LINES, MONITOR.#VALID_ENTRIES); /* Re-figured in loop */
NUM_PAGES = 1 + DIVIDE(MONITOR.#VALID_ENTRIES - 1,NUM_LINES,15,0);

DO WHILE(NUM_PAGES > 1 & NUM_COLUMNS < MAX_COLUMNS);
    NUM_COLUMNS = NUM_COLUMNS + 1;
    NUM_PAGES = 1 + DIVIDE(MONITOR.#VALID_ENTRIES -1, NUM_LINES * NUM_COLUMNS,
                15, 0);
END;

MAX_PER_PAGE = NUM_COLUMNS * MAX_LINES;
NUM_FULL_COLUMNS = MOD(MONITOR.#VALID_ENTRIES, NUM_COLUMNS);
IF NUM_FULL_COLUMNS = 0 THEN
    NUM_FULL_COLUMNS = NUM_COLUMNS;
RETURN;
END GET_CONSTANTS;
%PAGE;
GET_DATA_VALUE: PROCEDURE;

DCL B_PTR       POINTER OPTIONS(SHORT);
DCL ZX_PTR      POINTER OPTIONS(SHORT);
DCL B_VAL       BIT(@MAXMONSIG) ALIGNED BASED(B_PTR);
DCL ZX_VAL      BIT(@MAXMONSIG) ALIGNED BASED(ZX_PTR);
DCL 1 BYTE      BASED,
    2 C(@MAXMONSIG) BIT(8);
DCL 1 ASCII     BASED,
    2 C(@MAXMONSIG) CHAR(1);
DCL CHAR_INDEX  FIXED BIN(15);
DCL I           FIXED BIN(15);
DCL OFFSET      FIXED BIN(15);
DCL TEMP_LINE   CHAR(@MXSTRLN) VAR;
B_PTR = ADDR(MONITOR.B_STACK_PTR -> VAL_STACK(DATA_INDEX));
ZX_PTR = ADDR(MONITOR.ZX_STACK_PTR -> VAL_STACK(DATA_INDEX));

IF PMODE = @BINARY THEN DO;
    DO I = 1 TO MONITOR.#SIGNALS;
        IF SUBSTR(ZX_VAL, I, 1) THEN
            IF SUBSTR(B_VAL, I, 1) THEN
                DATA_LINE = DATA_LINE || 'Z';
            ELSE
                DATA_LINE = DATA_LINE || 'X';
        ELSE
            IF SUBSTR(B_VAL, I, 1) THEN
                DATA_LINE = DATA_LINE || '1';
            ELSE
                DATA_LINE = DATA_LINE || '0';
    END;
END;
ELSE IF PMODE = @ASCII THEN DO;
    CHAR_INDEX = 1;
    DO I = 1 TO MONITOR.#SIGNALS BY 8;
        IF ZX_PTR -> BYTE.C(CHAR_INDEX) = '00'B4 &  /* Not X and Prime Ascii */
           SUBSTR(B_PTR -> BYTE.C(CHAR_INDEX),1,1) THEN
            DATA_LINE = DATA_LINE || B_PTR -> ASCII.C(CHAR_INDEX);
        ELSE
            DATA_LINE = DATA_LINE || '?'; /* Question mark means X */
        CHAR_INDEX = CHAR_INDEX + 1;
    END;
END;
ELSE DO;
    CALL GTS$CBVS(SUBSTR(B_VAL, 1, MONITOR.#SIGNALS),
                  SUBSTR(ZX_VAL,1, MONITOR.#SIGNALS),
                  COPY('0'B,MONITOR.#SIGNALS),MONITOR.#SIGNALS,PMODE,TEMP_LINE);
    IF LENGTH(TEMP_LINE) < DATA_WIDTH THEN
        TEMP_LINE = TEMP_LINE || COPY(' ',DATA_WIDTH-LENGTH(TEMP_LINE));
    ELSE IF LENGTH(TEMP_LINE) > DATA_WIDTH THEN
        TEMP_LINE = SUBSTR(TEMP_LIVE, 1, DATA_WIDTH);
    DATA_LINE = DATA_LINE || TEMP_LINE;
END;
RETURN;
END GET_DATA_VALUE;
%PAGE;
UPDATE_TIME_DATA_INDICES: PROCEDURE;
```

```
TIME_INDEX = TIME_INDEX + NUM_LIVES;
IF COLUMN > NUM_FULL_COLUMNS THEN      /* Right columns may be 1 shorter */
    TIME_INDEX = TIME_INDEX - 1;
IF TIME_INDEX > MONITOR.STACK_DEPTH THEN
    TIME_INDEX = TIME_INDEX - MONITOR.STACK_DEPTH;

DATA_INDEX = 1 + ((TIME_INDEX-1) * MONITOR.STACK_WIDTH);

RETURN;
END UPDATE_TIME_DATA_INDICES;
END PRT$MON;
Finished: 83-11-15.14:51:00.Tue Lines read:   6317,  records:    100

User: RICKS                                    -at C2

Label: PRTG01 -form

<TH4S>BE&BL>PATENT.LISTINGS
```

What is claimed is:

1. Apparatus for hierarchical simulation of the behavior of a digital circuit, the digital circuit having a plurality of connected circuit elements, each said circuit element being any of gate level, function level, behavioral level, or switch level elements, the apparatus comprising input definition means for defining inputs to said circuit elements, said input definition means including means for defining inputs to any one of gate level, function level, behavioral level, or switch level elements, output definition means for defining output signal levels for outputs of said circuit elements based upon a defined relationship with said inputs, said output definition means including means for defining output signal levels for any one of gate level, function level, behavioral level, or switch level elements, simulation means connected with said input definition means and with said output definition means for simulating the behavior of the digital circuit, sampling means connected with said simulation means for interactively specifying during said simulation of said circuit behavior, at least one of said inputs and outputs to be repeatedly sampled, and recording means connected with said simulation means and with said sampling means for recording said sampled values.

2. The simulation apparatus of claim 1 further comprising means connected with said simulation means and with said sampling means for interactively initiating and terminating said repeated sampling during simulation of said circuit.

3. The simulation apparatus of claim 2 further wherein said recording means comprises means for automatically and continuously storing and printing the values of specified circuit element inputs and outputs during said simulation of said circuit behavior, and display means for interactive viewing of said stored values during said simulation.

4. The simulation apparatus of claim 2 further comprising breakpoint definition means for interactively specifying said breakpoints during said simulation of said circuit behavior, and means connected with said breakpoint definition means and with said sampling means for terminating said sampling during said simulation in response to at least one specified breakpoint.

5. The simulation apparatus of claim 1 further comprising means connected with said sampling means for sampling said at least one of said inputs and outputs at each "Nth" occurrence of a specified condition.

6. The simulation apparatus of claim 1 further comprising means connected with said sampling means for specifying conditions for sampling at least one of said inputs and outputs, said conditions being defined by a combination of functional operations.

7. A method for the hierarchical simulation of the behavior of a digital circuit, the digital circuit having a plurality of connected circuit elements, each said circuit element being any one of gate level, function level, behavioral level, or switch level elements, the method comprising the steps of defining inputs to said circuit elements, said input defining step including the step of defining an input to any one of gate level, function level, behavioral level, or switch level elements, defining output signal levels for outputs of said circuit elements based upon said inputs, said output defining step including the step of defining an output to any one of gate level, function level, behavioral level, or switch level elements, interactively specifying, during said simulation of said circuit behavior, at least one of said inputs and output to be repeatedly sampled, and recording said sampled values.

8. The simulation method of claim 7 further comprising the step of interactively initiating and interactively terminating said sampling of said specified values during simulation of said circuit behavior.

9. The simulation method of claim 8 further comprising the steps of interactively specifying breakpoint conditions during said simulation, and controlling initiation and termination of said repeated sampling of at least one of said inputs and outputs upon the occurrence of at least one said breakpoint condition.

10. The simulation method of claim 8 further comprising the steps of automatically and continuously storing and printing the values of specified circuit element inputs and outputs during said simulation of said circuit behavior, and interactively viewing each said stored value during said simulation.

11. The simulation method of claim 7 further comprising the step of sampling at least one of said inputs and outputs at each Nth occurrence of specified condition.

12. Apparatus for hierarchical simulation of the behavior of a digital circuit, the digital circuit having a plurality of connected circuit elements, each said circuit element being any one of gate level, function level, behavioral level, or switch level elements, the apparatus comprising input definition means for defining inputs to said circuit elements, said input definition means including means for defining an input to any one of gate level, function level, behavioral level, or switch level elements, output definition means for defining output signal levels for outputs of said circuit elements based upon a defined relationship with said inputs, said output definition means including means for defining an input to any one of gate level, function level, behavioral level, or switch level elements, simulation means connected with said input definition means and with said output definition means for simulating the behavior of the digital circuit defined thereby, sampling means connected with simulation means for interactively specifying during said simulation of said circuit behavior at least one of said inputs and outputs to be repeatedly sampled, means connected with said simulation means and with said sampling means for interactively initiating and terminating said repeated sampling during simulation of said circuit, trace means connected with said simulation means for automatically and continuously storing and printing the values of specified circuit element inputs and outputs during said simulation of said circuit behavior, display means connected with said trace means for interactive viewing of said stored values during said simulation, breakpoint definition means for interactively specifying said breakpoints during said simulation of said circuit behavior, means connected with said breakpoint definition means and with said sampling means for terminating said sampling during said simulation in response to at least one specified breakpoint means connected with said sampling means for specifying conditions for sampling said at least one of said inputs and outputs, said conditions being defined by a combination of functional operations, and means connected with said sampling means for sampling said at least one of said inputs and outputs at each Nth occurrence of a specified condition.

13. A method for simulating the behavior of a digital circuit, the digital circuit having a plurality of connected circuit elements, the method comprising the steps of defining inputs to said circuit elements, defining output signal levels for outputs of said circuit elements based upon said inputs, interactively specifying, during said simulation of said circuit behavior, at least one of said inputs and outputs to be repeatedly sampled, interactively initiating and interactively terminating said sampling of said specified values during simulation of said circuit behavior, interactively specifying breakpoint conditions during said simulation, controlling at least termination of said repeated sampling of at least one of said inputs and outputs upon the occurrence of at least one said breakpoint condition, automatically and continuously storing and printing the values of specified circuit element inputs and outputs during said simulation of said circuit behavior, interactively viewing each said stored value during said simulation, and sampling at least one of said inputs and outputs at each Nth occurrence of a specified condition.

* * * * *